(12) United States Patent
Cho et al.

(10) Patent No.: US 12,183,750 B2
(45) Date of Patent: Dec. 31, 2024

(54) PIXEL ARRAY AND IMAGE SENSOR INCLUDING THE SAME

(71) Applicant: SAMSUNG ELECTRONICS CO., LTD., Suwon-si (KR)

(72) Inventors: Jeongjin Cho, Yongin-si (KR); Kwanhee Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 168 days.

(21) Appl. No.: 17/831,478

(22) Filed: Jun. 3, 2022

(65) Prior Publication Data

US 2022/0399384 A1    Dec. 15, 2022

(30) Foreign Application Priority Data

Jun. 10, 2021    (KR) .................... 10-2021-0075608

(51) Int. Cl.
*H01L 27/146* (2006.01)
*H04N 25/75* (2023.01)
*H04N 25/772* (2023.01)

(52) U.S. Cl.
CPC .. *H01L 27/14603* (2013.01); *H01L 27/14621* (2013.01); *H01L 27/14627* (2013.01); *H01L 27/14636* (2013.01); *H04N 25/75* (2023.01); *H04N 25/772* (2023.01)

(58) Field of Classification Search
CPC ......... H01L 27/14603; H01L 27/14621; H01L 27/14627; H01L 27/14636; H04N 25/772; H04N 25/75

USPC ........................................................ 348/308
See application file for complete search history.

(56) References Cited

U.S. PATENT DOCUMENTS

| | | | |
|---|---|---|---|
| 7,541,628 B2 | 6/2009 | Lee et al. | |
| 9,343,492 B2 | 5/2016 | Jin et al. | |
| 10,437,955 B2 | 10/2019 | Eldesouki et al. | |
| 10,547,800 B2 | 1/2020 | Hwang et al. | |
| 10,674,098 B1 | 6/2020 | Fossum | |
| 2012/0033118 A1* | 2/2012 | Lee ................. | H04N 25/771 |
| | | | 348/308 |

(Continued)

FOREIGN PATENT DOCUMENTS

| TW | 201830678 A | 8/2018 |
|---|---|---|
| TW | 202007140 A | 2/2020 |

*Primary Examiner* — Joel W Fosselman
(74) *Attorney, Agent, or Firm* — Muir Patent Law, PLLC

(57) ABSTRACT

A pixel array and an image sensor including the pixel array are provided. The pixel array included in the image sensor includes a plurality of pixels arranged in a matrix, and a plurality of column lines each commonly connected to pixels arranged on a same column from among the plurality of pixels. Each of the plurality of pixels includes four subpixels. Each of the four subpixels includes four photoelectric conversion devices; a floating diffusion region storing electric charges generated by the four photoelectric conversion devices; and four transmission gates configured to transmit the electric charges generated by the four photoelectric conversion devices to the floating diffusion region. Four floating diffusion regions included in the four subpixels are electrically connected to one another via internal wiring. Each of the plurality of pixels further includes a reset gate, a first driving gate and a first selection gate.

20 Claims, 47 Drawing Sheets

(56) References Cited

U.S. PATENT DOCUMENTS

| | | |
|---|---|---|
| 2020/0322559 A1 | 10/2020 | Shim et al. |
| 2020/0336680 A1 | 10/2020 | Lee et al. |

* cited by examiner

PIXEL ARRAY AND IMAGE SENSOR INCLUDING THE SAME

CROSS-REFERENCE TO RELATED APPLICATION

This application is based on and claims priority under 35 U.S.C. § 119 to Korean Patent Application No. 10-2021-0075608, filed on Jun. 10, 2021, in the Korean Intellectual Property Office, the disclosure of which is incorporated by reference herein in its entirety.

BACKGROUND

1. Field

Embodiments relate to a pixel array and an image sensor including the same.

2. Description of the Related Art

Image sensors are devices for capturing a two-dimensional (2D) or three-dimensional (3D) image of an object. Image sensors generate an image of an object by using a photoelectric conversion device that reacts according to the intensity of light reflected by the object. With recent developments in complementary metal-oxide semiconductor (CMOS) technology, CMOS image sensors using CMOS have become widely used. As the resolution of image sensors increases, a pixel structure having a reduced area due to a reduction of a pitch between a plurality of pixels included in a pixel array of image sensors is desired.

SUMMARY

According to an embodiment, there is provided a pixel array included in an image sensor, the pixel array including a plurality of pixels arranged in a matrix, and a plurality of column lines each commonly connected to pixels arranged on a same column from among the plurality of pixels. Each of the plurality of pixels includes four subpixels. Each of the four subpixels includes four photoelectric conversion devices; a floating diffusion region storing electric charges generated by the four photoelectric conversion devices; and four transmission gates configured to transmit the electric charges generated by the four photoelectric conversion devices to the floating diffusion region. Four floating diffusion regions included in the four subpixels are electrically connected to one another via internal wiring. Each of the plurality of pixels further includes a reset gate configured to reset the four floating diffusion regions by providing a power voltage to the internal wiring; a first driving gate configured to receive a first voltage via the internal wiring; and a first selection gate arranged adjacent to the first driving gate in the first direction.

According to an embodiment, there is provided a pixel array included in an image sensor, the pixel array including a plurality of pixels each including a first subpixel, a second subpixel, a third subpixel, and a fourth subpixel; and a plurality of column lines each commonly connected to pixels arranged on a same column from among the plurality of pixels. Each of the first subpixel, the second subpixel, the third subpixel, and the fourth subpixel includes four photoelectric conversion devices arranged in a matrix; and a floating diffusion region storing electric charges generated by the four photoelectric conversion devices. A first floating diffusion region of the first subpixel, a second floating diffusion region of the second subpixel, a third floating diffusion region of the third subpixel, and a fourth floating diffusion region of the fourth subpixel are electrically connected to one another via wiring, and the wiring is formed within a pixel region where pixels are formed. Each of the plurality of pixels further includes an output circuit connected to a corresponding column line from among the plurality of column lines and the wiring and configured to share the first subpixel, the second subpixel, the third subpixel, and the fourth subpixel. The first circuit includes a reset transistor configured to provide a reset voltage to the wiring; at least one driving transistor including a gate connected to the wiring; and at least one selection transistor connected to the first driving transistor and the column line.

According to an embodiment, there is provided an image sensor including a pixel array including a plurality of pixels, wherein each of the plurality of pixels includes a plurality of floating diffusion regions arranged between a plurality of transfer transistors, and the plurality of floating diffusion regions are connected to one another via wiring; a row driver configured to drive rows connected to the plurality of pixels in units of rows; and an analog-to-digital conversion circuit configured to receive a plurality of sensing signals from a plurality of column lines connected to the pixel array and perform analog-to-digital conversion on the plurality of sensing signals.

According to an embodiment, there is provided a pixel array including a semiconductor substrate having a first surface and a second surface and including a plurality of floating diffusion regions adjacent to the first surface; and a wiring structure arranged on the first surface. The wiring structure includes a plurality of transmission gates arranged symmetrically with one another about each of the plurality of floating diffusion regions; and wiring configured to electrically connect four adjacent floating diffusion regions from among the plurality of floating diffusion regions.

BRIEF DESCRIPTION OF THE DRAWINGS

Features will become apparent to those of skill in the art by describing in detail example embodiments with reference to the attached drawings in which.

DETAILED DESCRIPTION

Figure 1:
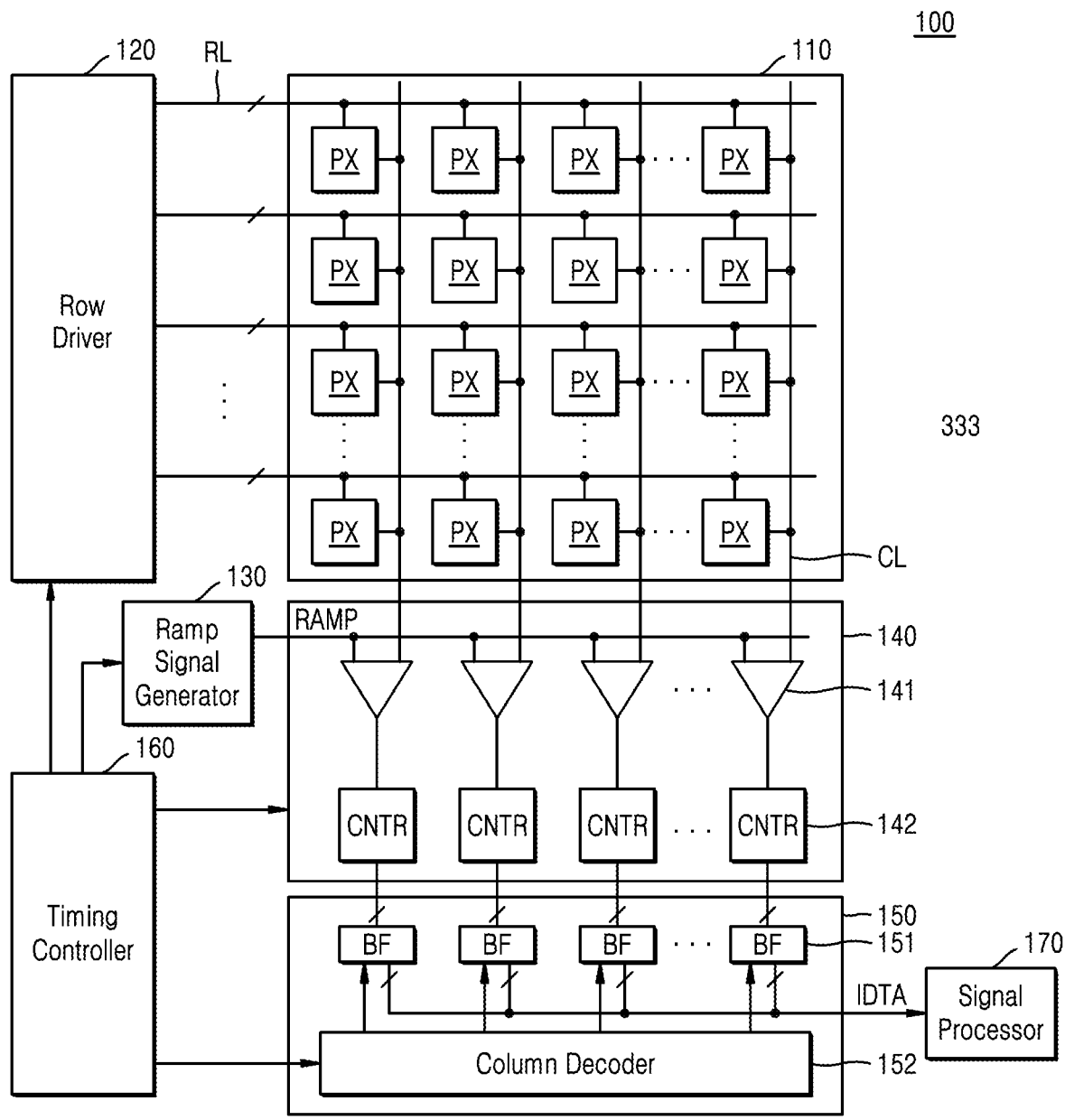
FIG. 1 is a block diagram of an image sensor according to an example embodiment.

FIG. 1 is a block diagram of an image sensor 100 according to an example embodiment.

The image sensor 100 may be mounted on an electronic device having an image or light sensing function. For example, the image sensor 100 may be mounted on an electronic device such as a camera, a smartphone, a wearable apparatus, Internet of Things (IoT), a tablet personal computer (PC), a personal digital assistant (PDA), a portable multimedia player (PMP), or a navigation device. The image sensor 100 may also be mounted on an electronic device that is included as a component in vehicles, furniture, manufacturing equipment, doors, various types of measuring apparatuses, and the like.

The image sensor 100 may include a pixel array 110, a row driver 120, a ramp signal generator 130, an analog-to-digital conversion (ADC) circuit 140, a data output circuit 150, and a timing controller 160. The image sensor 100 may further include a signal processor 170.

The pixel array 110 may include a plurality of row lines RL, a plurality of column lines CL, and a plurality of pixels PX, which are connected to the plurality of row lines RL and the plurality of column lines CL and arranged in a matrix. Pixels PX arranged at a same location in a column direction may be connected to a same column line CL.

Each of the pixels PX may sense light by using a photoelectric conversion device, and may output an image signal corresponding to an electrical signal based on the sensed light. The photoelectric conversion device may be a photo-sensing device formed of an organic or inorganic material, such as an inorganic photodiode, an organic photodiode, a perovskite photodiode, a phototransistor, a photogate, or a pinned photodiode.

In the pixel array 110, each pixel PX may include a plurality of subpixels, and each of the plurality of subpixels may include a plurality of photoelectric conversion devices. Each subpixel may include a floating diffusion region storing electric charges generated by the plurality of photoelectric conversion devices. A plurality of floating diffusion regions respectively included in the plurality of subpixels may be electrically connected to one another through internal wiring, and thus the plurality of subpixels included in the pixel PX may share the plurality of floating diffusion regions.

Each pixel PX may include four subpixels. Each of the four subpixels may include four photoelectric conversion devices arranged in a matrix, and four transmission transistors respectively connected to the four photoelectric conversion devices. The floating diffusion region may be arranged at the center of each subpixel. The four floating diffusion regions included in the four subpixels may be electrically connected to one another through internal wiring to form a floating diffusion node.

Each pixel PX may include an output circuit for outputting an image signal, based on the electric charges stored in the plurality of floating diffusion regions, to a column line. The output circuit may include a plurality of transistors, e.g., a reset transistor, a driving transistor, and a selection transistor.

The pixel array 110 and the pixels PX included in the pixel array 110 are described in further detail below with reference to FIGS. 2 through 17F.

The row driver 120 may drive the pixel array 110 in units of rows. The row driver 120 may decode a row control signal (e.g., an address signal) received from the timing controller 160, and may select at least one row line from among row lines that constitute the pixel array 110, in response to the decoded row control signal. For example, the row driver 120 may generate a selection signal for selecting one of a plurality of rows. The pixel array 110 may output a pixel signal, e.g., a pixel voltage, from a row that is selected according to the selection signal received from the row driver 120. The pixel signal may include a reset signal and an image signal.

The row driver 120 may transmit, to the pixel array 110, control signals for outputting the pixel signal. The pixels PX may output the pixel signal in response to the control signals.

The ramp signal generator 130 may generate a ramp signal RAMP (e.g., a ramp voltage) of which a level ascends or descends at a predetermined inclination, under the control of the timing controller 160. The ramp signal RAMP may be provided to a plurality of correlated double sampling (CDS) circuits 141 included in the ADC circuit 140.

The ADC circuit 140 may include the plurality of CDS circuits 141 and a plurality of counters 142. The ADC circuit 140 may convert the pixel signal (e.g., the pixel voltage) received from the pixel array 110 into a pixel value that is a digital signal. A pixel signal received via each of the plurality of column lines CL may be converted into a pixel value that is a digital signal, by each CDS circuit 141 and each counter 142.

The CDS circuit 141 may compare the pixel signal (e.g., the pixel voltage) received via the column line CL with the ramp signal RAMP, and may output a result of the comparison as a comparison result signal. When the ramp signal RAMP and the pixel signal have the same levels, the CDS circuit 141 may output a comparison signal that transitions from a first level (e.g., logic high) to a second level (e.g., logic low). A time point when the level of the comparison signal transitions may be determined according to the level of the pixel signal.

The CDS circuit 141 may sample the pixel signal received from the pixels PX, according to a CDS method. The CDS circuit 141 may sample the reset signal received as the pixel signal, and compare the reset signal with the ramp signal RAMP to generate a comparison signal based on the reset signal. The CDS circuit 141 may store the reset signal. Then, the CDS circuit 141 may sample the image signal correlated to the reset signal, and compare the image signal with the ramp signal RAMP to generate a comparison signal based on the image signal.

The counter 142 may count a level transition time point of the comparison result signal output by the CDS circuit 141, and may output a count value as the pixel value.

The counter 142 may be implemented using an up-counter (in which a count value sequentially increases based on a counting clock signal provided by the timing controller 160 and an operation circuit), an up/down counter, or a bit-wise inversion counter. The image sensor 100 may further include a code generator for generating, as counting code, a plurality of code values having resolution based on the preset number of bits, and the counter 142 may include a latch circuit that latches the value of the counting code, based on the comparison result signal, and an arithmetic circuit.

The data output circuit 150 may temporarily store and output the pixel value output by the ADC circuit 140. The data output circuit 150 may include a plurality of column memories 151 and a column decoder 152. Each column memory 151 may store the pixel value received from the counter 142. Each of the plurality of column memories 151 may be included in the counter 142. The plurality of pixel values stored in the plurality of column memories 151 may be output as image data IDTA under the control of the column decoder 152.

The timing controller 160 may output a control signal to each of the row driver 120, the ramp signal generator 130, the ADC circuit 140, and the data output circuit 150 to control operations or timings of the row driver 120, the ramp signal generator 130, the ADC circuit 140, and the data output circuit 150.

The signal processor 170 may perform noise reduction, gain adjustment, waveform shaping, interpolation, white balance adjustment, gamma correction, edge emphasis, binning, and the like with respect to the image data IDTA. The signal processor 170 may be included in a processor outside the image sensor 100.

Figure 2:
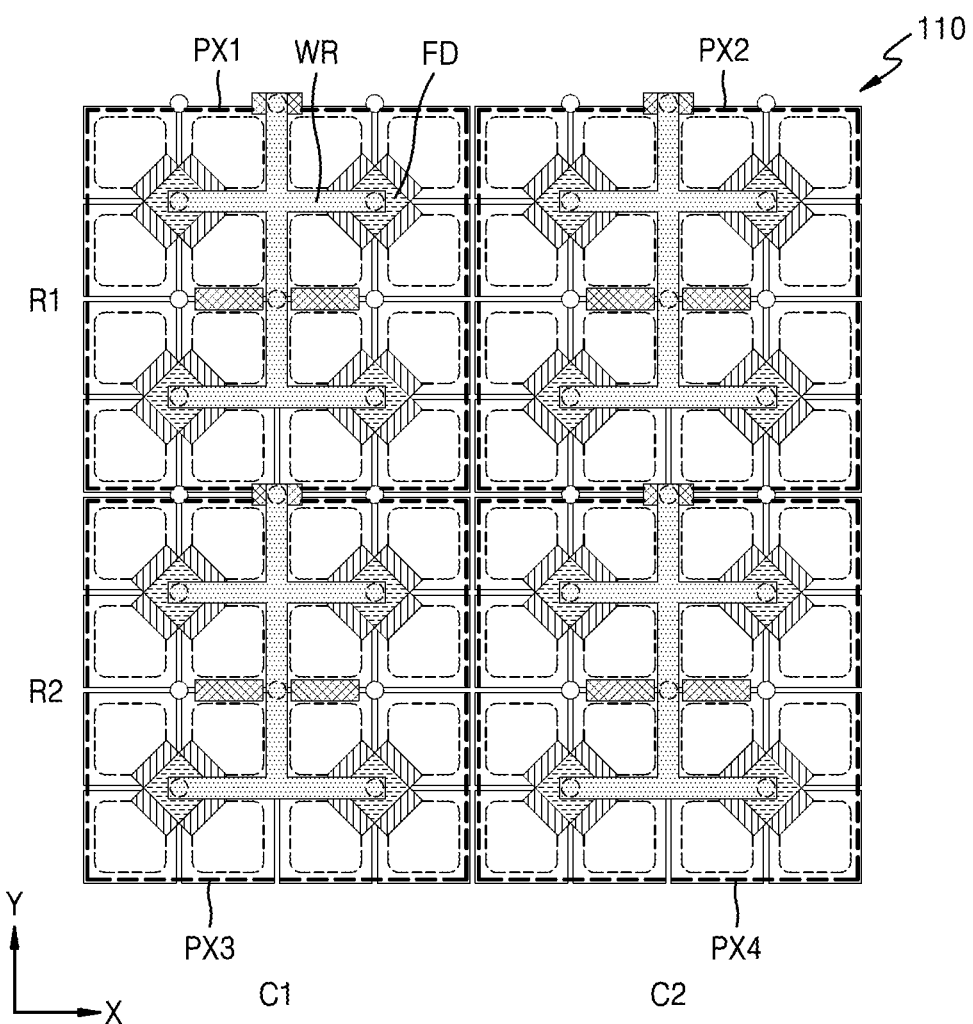
FIG. 2 illustrates a pixel array according to an example embodiment.

FIG. 2 illustrates the pixel array 110 according to an example embodiment.

Referring to FIG. 2, the pixel array 110 may include a plurality of pixels, e.g., first through fourth pixels PX1 through PX4, in a matrix. The plurality of pixels may be arranged on a plurality of rows and a plurality of columns. Although FIG. 2 illustrates the first through fourth pixels PX1 through PX4 arranged on first and second rows R1 and R2 and first and second columns C1 and C2, this is merely for convenience of explanation, and the pixel array 110 may include a larger number of pixels. The number of pixels may be determined according to the resolution of the pixel array 110.

The plurality of row lines RL of FIG. 1 may each extend in a first direction, e.g., an X-axis direction, and pixels arranged on the same row may be connected to the same row line. For example, the first and second pixels PX1 and PX2 arranged on the first row R1 may be connected to a same row line, and the third and fourth pixels PX3 and PX4 arranged on the second row R2 may be connected to another identical row line.

The plurality of column lines CL of FIG. 1 may each extend in a second direction, e.g., a Y-axis direction, and pixels arranged on the same column may be connected to the same column line. For example, the first and third pixels PX1 and PX3 arranged on the first column C1 may be connected to a same column line, and the second and fourth pixels PX2 and PX4 arranged on the second column C2 may be connected to another identical column line. A pixel signal may be read from a plurality of pixels via a column line in units of rows.

Each of the first through fourth pixels PX1 through PX4 may include a plurality of floating diffusion regions FD storing electric charges. The plurality of floating diffusion regions FD may be electrically connected to one another via internal wiring WR extending in the first direction and the second direction within each of the first through fourth pixels PX1 through PX4. The first through fourth pixels PX1 through PX4 may have the same pixel structures, which will be described in detail with reference to FIG. 4.

Figure 3:
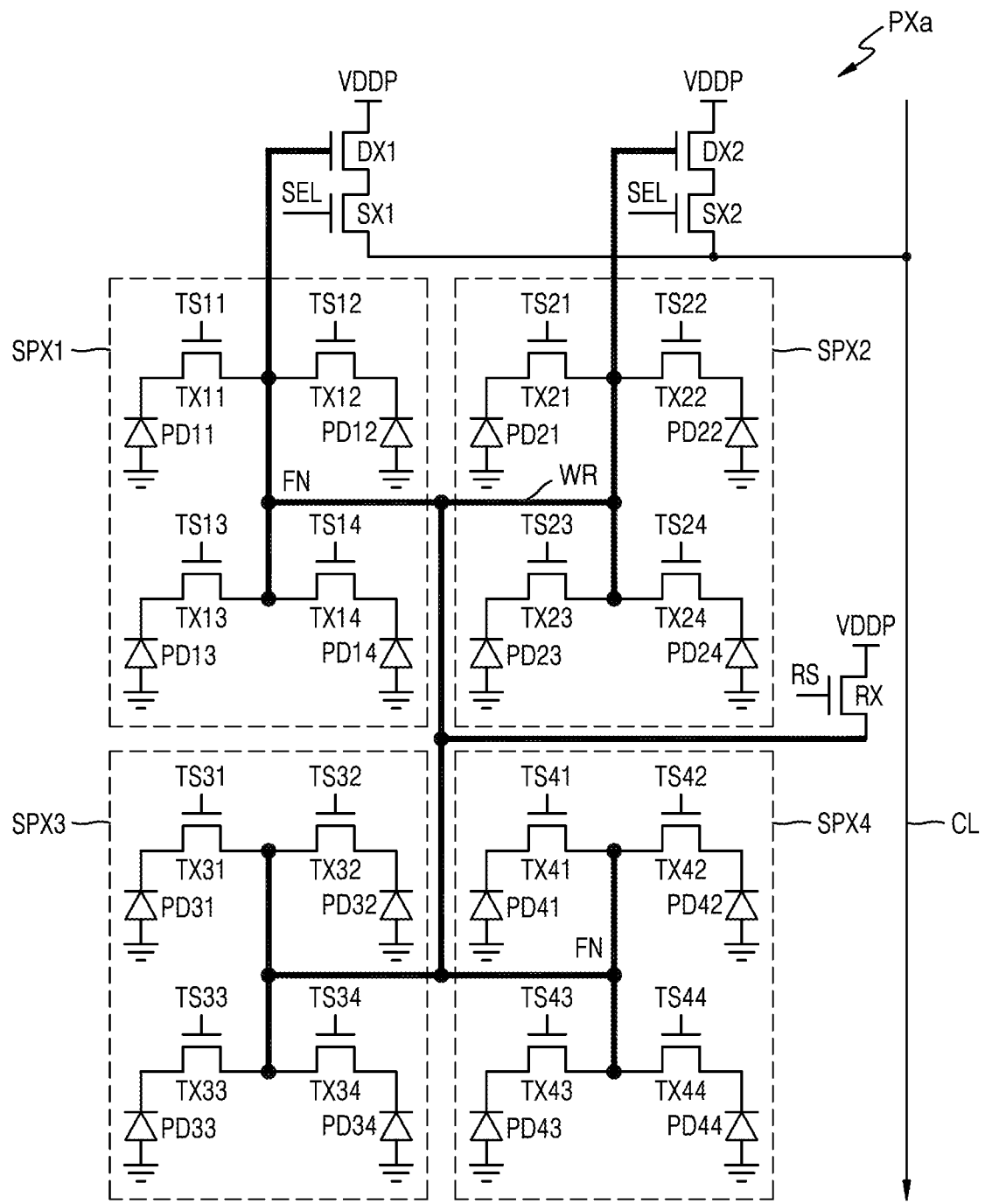
FIG. 3 is a circuit diagram of a pixel included in a pixel array according to an example embodiment.

FIG. 3 is a circuit diagram of a pixel PXa included in a pixel array according to an example embodiment. The pixel PXa of FIG. 3 is applicable as the first through fourth pixels PX1 through PX4 of the pixel array 110 of FIG. 2.

Referring to FIG. 3, the pixel PXa may include first through fourth subpixels SPX1 through SPX4, a reset transistor RX, first and second driving transistors DX1 and DX2, and first and second selection transistors SX1 and SX2. The reset transistor RX, the first and second driving transistors DX1 and DX2, and the first and second selection transistor SX1 and SX2 may constitute an output circuit of the pixel PXa.

The first subpixel SPX1 may include first through fourth photoelectric conversion devices PD11 through PD14 and first through fourth transfer transistors TX11 through TX14. Each of the first through fourth photoelectric conversion devices PD11 through PD14 may generate photocharges (hereinafter, referred to as electric charges) corresponding to a received optical signal. The first through fourth photoelectric conversion devices PD11 through PD14 may be connected to the first through fourth transfer transistors TX11 through TX14, respectively. The first through fourth transfer transistors TX11 through TX14 may be turned on in response to active levels (e.g., logic high) of transmission signals TS11 through TS14, respectively.

The second subpixel SPX2 may include first through fourth photoelectric conversion devices PD21 through PD24, and first through fourth transfer transistors TX21 through TX24 respectively connected to the first through fourth photoelectric conversion devices PD21 through PD24. The first through fourth transfer transistors TX21 through TX24 may be turned on in response to active levels (e.g., logic high) of transmission signals TS21 through TS24, respectively.

The third subpixel SPX3 may include first through fourth photoelectric conversion devices PD31 through PD34, and first through fourth transfer transistors TX31 through TX34 respectively connected to the first through fourth photoelectric conversion devices PD31 through PD34. The first through fourth transfer transistors TX31 through TX34 may be turned on in response to active levels (e.g., logic high) of transmission signals TS31 through TS34, respectively.

The fourth subpixel SPX4 may include first through fourth photoelectric conversion devices PD41 through PD44, and first through fourth transfer transistors TX41 through TX44 respectively connected to the first through fourth photoelectric conversion devices PD41 through PD44. The first through fourth transfer transistors TX41 through TX44 may be turned on in response to active levels (e.g., logic high) of transmission signals TS41 through TS44, respectively.

The plurality of transmission signals TS11 through TS14, TS21 through TS24, TS3 through TS3, and TS41 through TS44 may have active levels at the same or different time points according to a read mode.

For example, in a first read mode, the plurality of transmission signals TS11 through TS14, TS21 through TS24, TS3 through TS3, and TS41 through TS44 may be different signals and thus may have active levels at different time points.

In a second read mode (e.g., a charge addition mode), the plurality of transmission signals TS11 through TS14, TS21 through TS24, TS31 through TS3, and TS41 through TS44 may be the same signals and thus may have active levels at the same time points.

In a third read mode, the transmission signals TS11 through TS14 of the first subpixel SPX1 may be the same signals, the transmission signals TS21 through TS24 of the second subpixel SPX2 may be the same signals, the transmission signals TS31 through TS34 of the third subpixel SPX3 may be the same signals, and the transmission signals TS41 through TS44 of the fourth subpixel SPX4 may be the same signals.

The first through fourth transfer transistors TX11 through TX14, TX21 through TX24, TX31 through TX34, TX41 through TX44 may be turned on to transmit electric charges generated by corresponding photoelectric conversion devices to a floating diffusion node FN.

Figure 4:
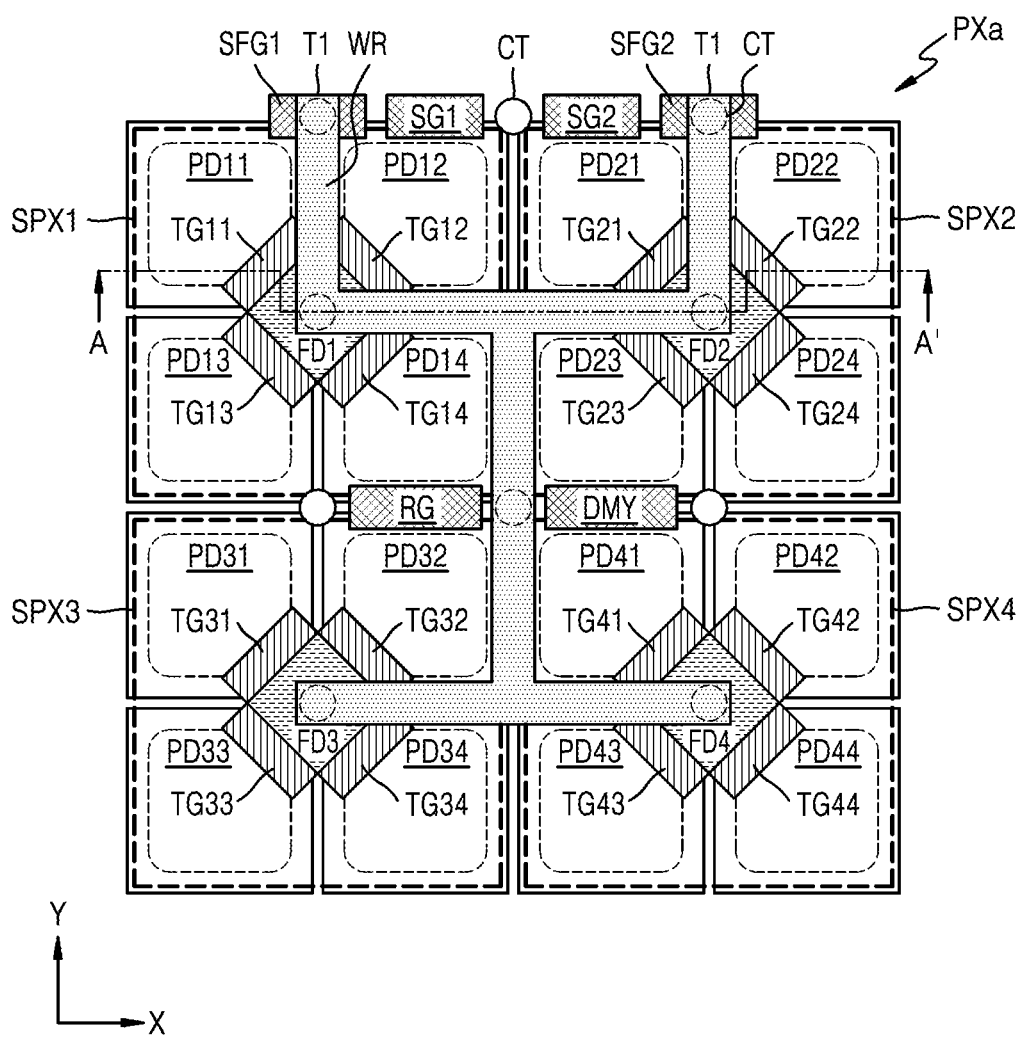
FIG. 4 is a plan view of a pixel according to an example embodiment.

The first through fourth floating diffusion regions FD1 through FD4 of FIG. 4 respectively included in the first through fourth subpixel SPX through SPX4 may be electrically connected to one another via the internal wiring WR to form the floating diffusion node FN. Accordingly, capacitance of a capacitor formed in the floating diffusion node FN may be four times the capacitance of each of the first through fourth floating diffusion regions FD1 through FD4 of FIG. 4.

A pixel power supply voltage VDDP may be applied to a drain of the reset transistor RX, and a source of the reset transistor RX may be connected to the floating diffusion node FN. The reset transistor RX may be turned on in response to an active level of a reset signal RS, and may provide the pixel power supply voltage VDDP as a reset voltage to the floating diffusion node FN to thereby reset the floating diffusion node FN.

The pixel power supply voltage VDDP may be applied to respective drains of the first and second driving transistors DX1 and DX2. Respective sources of the first and second driving transistors DX1 and DX2 may be connected to respective drains of the first and second selection transistors SX1 and SX2. Gates of the first and second driving transistors DX1 and DX2 may be connected to the floating diffusion node FN. The first and second driving transistors DX1 and DX2 may operate as source followers. The first and second driving transistors DX1 and DX2 may receive a voltage based on a potential of the floating diffusion node FN, applied to the respective gates of the first and second driving transistors DX1 and DX2, and may output a pixel signal based on the received voltage.

Respective sources of the first and second selection transistors SX1 and SX2 may be connected to a column line CL. The first and second selection transistors SX1 and SX2 may be turned on in response to an active level of a selection signal SEL applied to respective gates of the first and second selection transistors SX1 and SX2 to thereby output the pixel signal output by the first and second driving transistors DX1 and DX2 to the column line CL. When the first and second selection transistors SX1 and SX2 are turned on, the pixel signal output by the sources of the first and second driving transistors DX1 and DX2 may be output to the column line CL.

Although the pixel PXa includes the two first and second driving transistors DX1 and DX2 and the two first and second selection transistors SX1 and SX2 in FIG. 3, this may be varied, e.g., a pixel included in the pixel array 110 of FIG. 2 may include one driving transistor and one selection transistor, or the pixel may include three or more driving transistors and three or more selection transistors.

FIG. 4 is a plan view of a pixel PXa according to an example embodiment. The pixel PXa of FIG. 4 is applicable to the first through fourth pixels PX1 through PX4 of the pixel array 110 of FIG. 2.

Referring to FIG. 4, the pixel PXa may include the first through fourth subpixels SPX1 through SPX4. The first through fourth subpixels SPX1 through SPX4 may have the same pixel structures.

The first subpixel SPX1 may include the first through fourth photoelectric conversion devices PD11 through PD14, first through fourth transmission gates TG11 through TG14, and a first floating diffusion region FD1.

The first through fourth transmission gates TG11 through TG14 are respective gates of the first through fourth transfer transistors TX11 through TX14 of FIG. 3. The first through fourth transfer transistors TX11 through TX14 transmit the electric charges respectively generated by the first through fourth photoelectric conversion devices PD11 through PD14 to the first floating diffusion region FD1. The electric charges received by the first floating diffusion region FD1 may be stored.

The first through fourth photoelectric conversion devices PD11 through PD14 may be arranged in a matrix. The first floating diffusion region FD1 may be arranged at the center of the first subpixel PSX1. The first through fourth transmission gates TG11 through TG14 may be arranged to be symmetrical with one another about the first floating diffusion region FD1. The first through fourth transmission gates TG11 through TG14 may be arranged to surround the first floating diffusion region FD1.

The second subpixel SPX2 may include the first through fourth photoelectric conversion devices PD21 through PD24, first through fourth transmission gates TG21 through TG24, and a second floating diffusion region FD2. The third subpixel SPX3 may include the first through fourth photoelectric conversion devices PD31 through PD34, first through fourth transmission gates TG31 through TG34, and a third floating diffusion region FD3. The fourth subpixel SPX4 may include the first through fourth photoelectric conversion devices PD41 through PD44, first through fourth transmission gates TG41 through TG44, and a fourth floating diffusion region FD4. Respective pixel structures of the second, third, and fourth subpixels SPX2, SPX3, and SPX4 are the same as that of the first subpixel SPX1, and thus, repeated descriptions thereof are omitted.

The internal wiring WR may be connected to the first through fourth floating diffusion regions FD1 through FD4 via contacts CT. The first through fourth floating diffusion regions FD1 through FD4 may be electrically connected to one another via the internal wiring WR to form the floating diffusion node FN of FIG. 3. The internal wiring WR may be formed within a pixel region in which the pixel PXa is formed on a two-dimensional (2D) plane according to the first direction, e.g., the X-axis direction, and the second direction, e.g., the Y-axis direction. For example, in FIG. 2, the internal wiring WR included in the first pixel PX1 is formed within a pixel region of the first pixel PX1, and does not extend to the other pixels, e.g., the second through fourth pixels PX2 through PX4.

The internal wiring WR may extend in the first direction, e.g., the X-axis direction, to connect the first floating diffusion region FD1 to the second floating diffusion region FD2 and connect the third floating diffusion region FD3 to a fourth floating diffusion region FD4. The internal wiring WR may also extend in the second direction, e.g., the Y-axis direction, to connect the first and second floating diffusion regions FD1 and FD2 to the third and fourth floating diffusion regions FD3 and FD4. Accordingly, the first through fourth subpixels SPX1 through SPX4 may share the first through fourth floating diffusion regions FD1 through FD4. Thus, the useful area of the pixel PXa may increase.

The pixel PXa may include a reset gate RG, first and second driving gates SFG1 and SFG2, first and second selection gates SG1 and SG2, and a dummy gate DMY.

The reset gate RG may be the gate of the reset transistor RX of FIG. 3. The pixel power supply voltage VDDP of FIG. 3 may be applied to the drain of the reset transistor RX. The source of the reset transistor RX may be connected to the internal wiring WR via a contact CT. When the reset transistor RX is turned on, a pixel power supply voltage may be applied to the first through fourth floating diffusion regions FD1 through FD4 via the internal wiring WR so that the first through fourth floating diffusion regions FD1 through FD4 are reset. Thus, electric charges remaining in the first through fourth floating diffusion regions FD1 through FD4 may be removed.

The first and second driving gates SFG1 and SFG2 may be the respective gates of the first and second driving transistors DX1 and DX2 of FIG. 3. The first and second selection gates SG1 and SG2 may be the respective gates of the first and second selection transistors SX1 and SX2 of FIG. 3. The first and second driving gates SFG1 and SFG2 may be connected to the internal wiring WR via contacts CT.

Respective drains of the first and second selection gates SG1 and SG2 may be connected to the respective sources of the first and second driving transistors DX1 and DX2, respectively. Respective sources of the first and second selection gates SG1 and SG2 may be connected to a column line via contacts CT. When the first and second selection transistors SX1 and SX2 are turned on, the pixel signal output by the respective sources of the first and second driving transistors DX1 and DX2 may be output to the column line.

The first and second driving gates SFG1 and SFG2 and the first and second selection gates SG1 and SG2 may be arranged side by side in the first direction, e.g., the X-axis direction, in one side portion, e.g., an upper or lower portion of the pixel PXa. The first and second driving gates SFG1 and SFG2 and the first and second selection gates SG1 and SG2 may be arranged parallel to a row line RL of FIG. 1.

The first and second driving gates SFG1 and SFG2 may be connected to the internal wiring WR via the contacts CT. The first driving gate SFG1 may be connected to a first terminal T1 of the internal wiring WR. The second driving gate SFG2 may be connected to a second terminal T2 of the internal wiring WR.

The first and second selection gates SG1 and SG2 may be arranged between the first and second driving gates SFG1 and SFG2. The first and second selection gates SG1 and SG2 may be arranged outside the first and second driving gates SFG1 and SFG2.

The reset gate RG may be arranged at the center of the pixel PXa. The dummy gate DMY may be arranged side by side with the reset gate RG in the first direction. The reset gate RG and the dummy gate DMY may be arranged between the first and second subpixels SPX1 and SPX2 and the third and fourth subpixels SPX3 and SPX4. The reset gate RG and the dummy gate DMY may be arranged symmetrical to each other about the center of the pixel PXa in the first direction. In another implementation (not shown in FIG. 4), the pixel PXa may not include the dummy gate DMY.

As described above, in the pixel PXa, the first through fourth subpixels SPX1 through SPX4 may share the first through fourth floating diffusion regions FD1 through FD4. The first through fourth subpixels SPX1 through SPX4 may share the output circuit. Accordingly, the useful area of the pixel PXa may be increased, and the size of the pixel PXa may be reduced. Because the first through fourth floating diffusion regions FD1 through FD4 are shared within the pixel PXa, the sensing sensitivity of the pixel PXa may be increased. Thus, the resolution and sensing sensitivity of the pixel array 110 of FIG. 2 may be increased.

Figure 5:
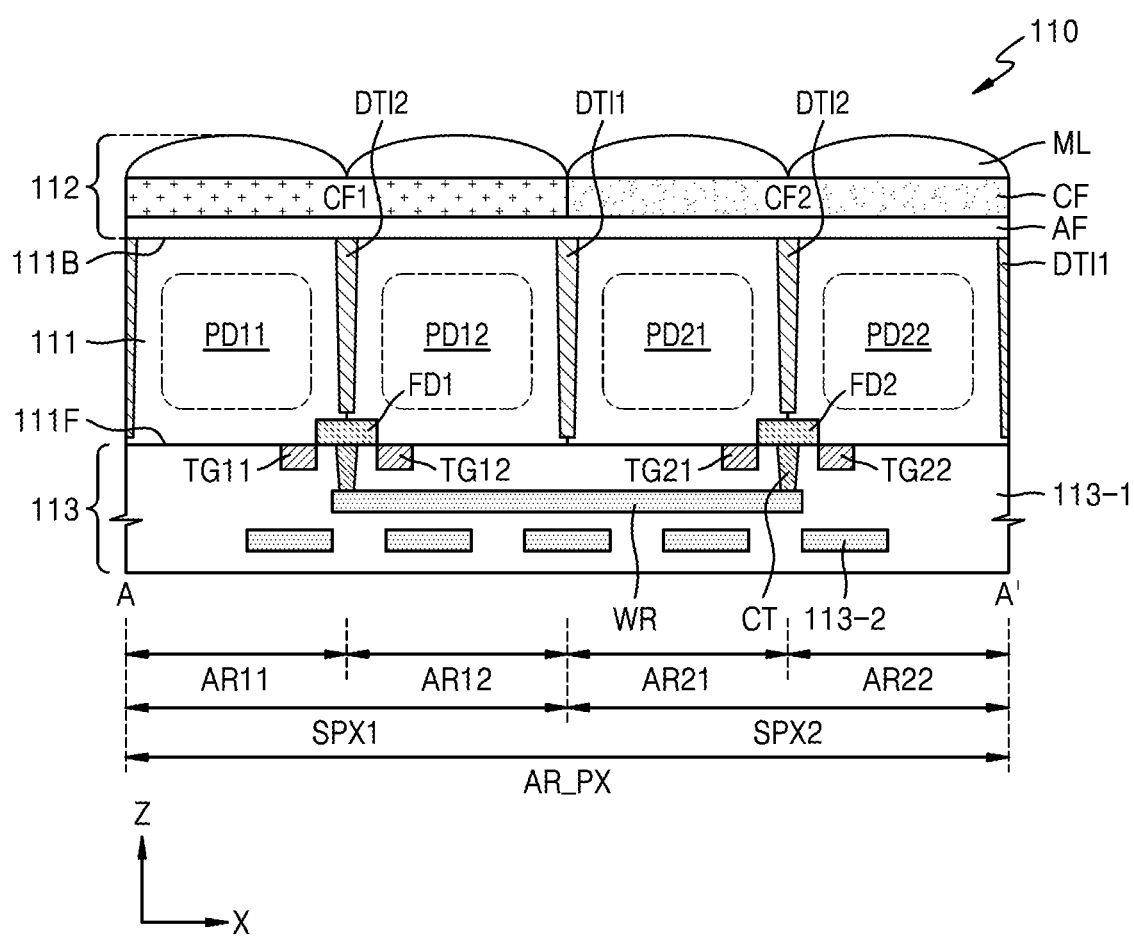
FIG. 5 is a vertical cross-sectional view of a pixel array according to an example embodiment.

FIG. 5 is a vertical cross-sectional view of the pixel array 110 according to an example embodiment. FIG. 5 is a vertical cross-sectional view of the pixel array 110 taken along line A-A' of FIG. 4.

Referring to FIG. 5, the pixel array 110 may include a semiconductor substrate 111 (hereinafter, a substrate 111) having a first surface 111B and a second surface 111F opposite to each other, an incidence layer 112 arranged on the first surface 111B of the substrate 111, and a wiring layer 113 (or a wiring structure) arranged on the second surface 111F of the substrate 111.

The substrate 111 may include one or more of Si, Ge, SiGe, SiC, GaAs, InAs, or InP. The substrate 111 may be doped with impurities of a first conductivity type. For example, the first conductivity type may be a P type, and the impurities of the first conductivity type may be boron.

A first deep trench isolation (DTI) portion DTI1 and a second DTI portion DTI2 may be arranged in the substrate 111. The first DTI portion DTI1 may penetrate through the substrate 111 and extend from the first surface 111B to the second surface 111F. The second DTI portion DTI2 may extend from the first surface 111B toward the second surface 111F but may be spaced apart from the second surface 111F. The first DTI portion DTI1 and the second DTI portion DTI2 may include one or more of a silicon oxide layer, a hafnium oxide layer, an aluminum oxide layer, or a polysilicon layer doped with impurities. Each of the first DTI portion DTI1 and the second DTI portion DTI2 may have a single-layer or multi-layer structure.

The first DTI portion DTI1 may separate subpixels, e.g., the first subpixel SPX1 and the second subpixel SPX2, from each other, and the second DTI portion DTI2 may separate areas within a subpixel from each other. For example, the second DTI portion DTI2 may separate a first area AR11 from a second area AR12 within the first subpixel SPX1 in the first direction, e.g., the X-axis direction, and may separate a first area AR21 from a second area AR22 within the second subpixel SPX2. The first DTI portion DTI1 and the second DTI portion DTI2 may prevent cross-talk between pixels PXa, between subpixels, and between the areas of each subpixel.

The first photoelectric conversion device PD11 and the second photoelectric conversion device PD12 may be arranged in the first area AR11 and the second area AR12 of the first subpixel SPX1, respectively. The first photoelectric conversion device PD21 and the second photoelectric conversion device PD22 may be arranged in the first area AR21 and the second area AR22 of the second subpixel SPX2, respectively. Each of the photoelectric conversion devices PD11, PD12, PD21, and PD22 may include an area doped with impurities of the second conductivity type opposite to the first conductivity type. For example, the second conductivity type may be an N type, and the impurities of the second conductivity type may include impurities such as phosphorus, arsenic, bismuth, and/or antimony. An area of the substrate 111 that is doped with the impurities of the second conductivity type may form a PN junction with an area of the substrate 111 that is doped with the impurities of the first conductivity type and adjacent to the former area, to constitute the photoelectric conversion devices PD11, PD12, PD21, and PD22.

The first surface 111B of the substrate 111 may be a light incidence surface, and light may be incident via the incidence layer 112 and the first surface 111B. The incidence layer 112 may include a microlens ML and a color filter CF. An anti-reflection layer AF may be arranged between the first surface 111B of the substrate 111 and the color filter CF. The anti-reflection layer AF, the color filter CF, and the microlens ML may be arranged to be sequentially stacked on the first surface 110B of the substrate 111.

In FIG. 5, the single microlens ML is arranged over each of a plurality of photoelectric conversion devices, e.g., the first and second photoelectric conversion devices PD11 and PD12 of the first subpixel SPX1 and the first and second photoelectric conversion devices PD21 and PD22 of the second subpixel SPX2, but this may be varied, e.g., a single microlens ML may be arranged over two or four photoelectric conversion devices. For example, one microlens ML may be arranged over the first and second photoelectric conversion devices PD11 and PD12 of the first subpixel SPX1, and another one microlens ML may be arranged over the first and second photoelectric conversion devices PD21 and PD22 of the second subpixel SPX2. As another example, a single microlens ML may be arranged in each subpixel, i.e., over a fourth photoelectric conversion device included in one subpixel (e.g., the first through fourth photoelectric conversion devices PD11 through PD14 of the first subpixel SPX1).

The color filter CF may transmit light in a specific spectrum band, i.e., light of a specific color. A plurality of color filters CF may constitute a color filter array. The color filter array may have a Bayer pattern. A plurality of color filters may include a red filter, a blue filter, and two green filters, the red filter, the blue filter, and the two green filters may be arranged 2×2, and the two green filters may be arranged diagonally. The plurality of color filters CF may include a red filter, a blue filter, a green filter, and a white filter arranged 2×2. The plurality of color filters CF may include a red filter, two yellow filters, and a blue filter arranged 2×2, and the two green filters may be arranged diagonally. However, this may be varied, e.g., the plurality of color filters may include filters combined with different colors. For example, the plurality of color filters may include a yellow filter, a cyan filter, and a green filter.

A first color filter CF1 may be arranged on the first subpixel SPX1, and a second color filter CF2 may be arranged on a second subpixel SPX2. The first color filter CF1 and the second color filter CF2 may transmit light of the same color or different colors. According to the color of light transmitted by the color filter CF, a color sensed by a corresponding subpixel (the first subpixel SPX1 or the second subpixel SPX2) or a corresponding pixel PXa may be determined.

Floating diffusion regions, e.g., the first floating diffusion region FD1 and the second floating diffusion region FD2, may be formed adjacent to the second surface 111F of the substrate 111, and may be located at centers of the first subpixel SPX1 and the second subpixel SPX2, respectively. The first floating diffusion region FD1 and the second floating diffusion region FD2 may be regions doped with the impurities of the second conductivity type.

Gates of transistors, e.g., the first transmission gates TG11 and TG21 and the second transmission gates TG12 and TG22, may be formed adjacent to the second surface 111F of the substrate 111 within the wiring layer 113. The first transmission gates TG11 and TG21 and the second transmission gates TG12 and TG22 may be formed adjacent to the first floating diffusion region FD1 and the second floating diffusion region FD2. Although FIG. 5 illustrates only transmission gates, e.g., the first transmission gates TG11 and TG21 and the second transmission gates TG12 and TG22, the reset gate RG of FIG. 4, the driving gates SFG1 and SFG2 of FIG. 4, the selection gates SG1 and SG2 of FIG. 4, and the dummy gate DMY of FIG. 4 may be formed adjacent to the second surface 111F of the substrate 111.

A well area (not shown in FIG. 5) may be formed around gates, e.g., the first transmission gates TG11 and TG21 and the second transmission gates TG12 and TG22. The well area may be formed adjacent to the second surface 111F within the substrate 111. The well area may operate as a drain and a source of a transistor.

The wiring layer 113 may include conductive lines 113-2 each including multiple layers and arranged within an interlayer insulation layer 113-1. The conductive lines 113-2 may transmit a control signal provided to each transistor or a signal between a pixel and the outside. The conductive lines 113-2 may be formed of a conductive material including a metal material such as copper or aluminum by using a patterning method, and may each extend in the first direction (e.g., the X-axis direction) and the second direction (e.g., the Y-axis direction).

In the pixel PXa of FIG. 4, the internal wiring WR, which is included in the conductive lines 113-2, may be connected to the first floating diffusion region FD1 and the second floating diffusion region FD2 via the contacts CT penetrating through the interlayer insulation layer 113-1, and may electrically connect the first floating diffusion region FD1 to the second floating diffusion region FD2. The internal wiring WR may be formed within a pixel region AR_PX. The internal wiring WR may electrically connect a plurality of floating diffusion regions (e.g., the first through fourth floating diffusion regions FD1 through FD4 of FIG. 4) between a plurality of subpixels (e.g., the first through fourth subpixels SPX1 through SPX4 of FIG. 3) within the pixel PXa.

Figure 6A:
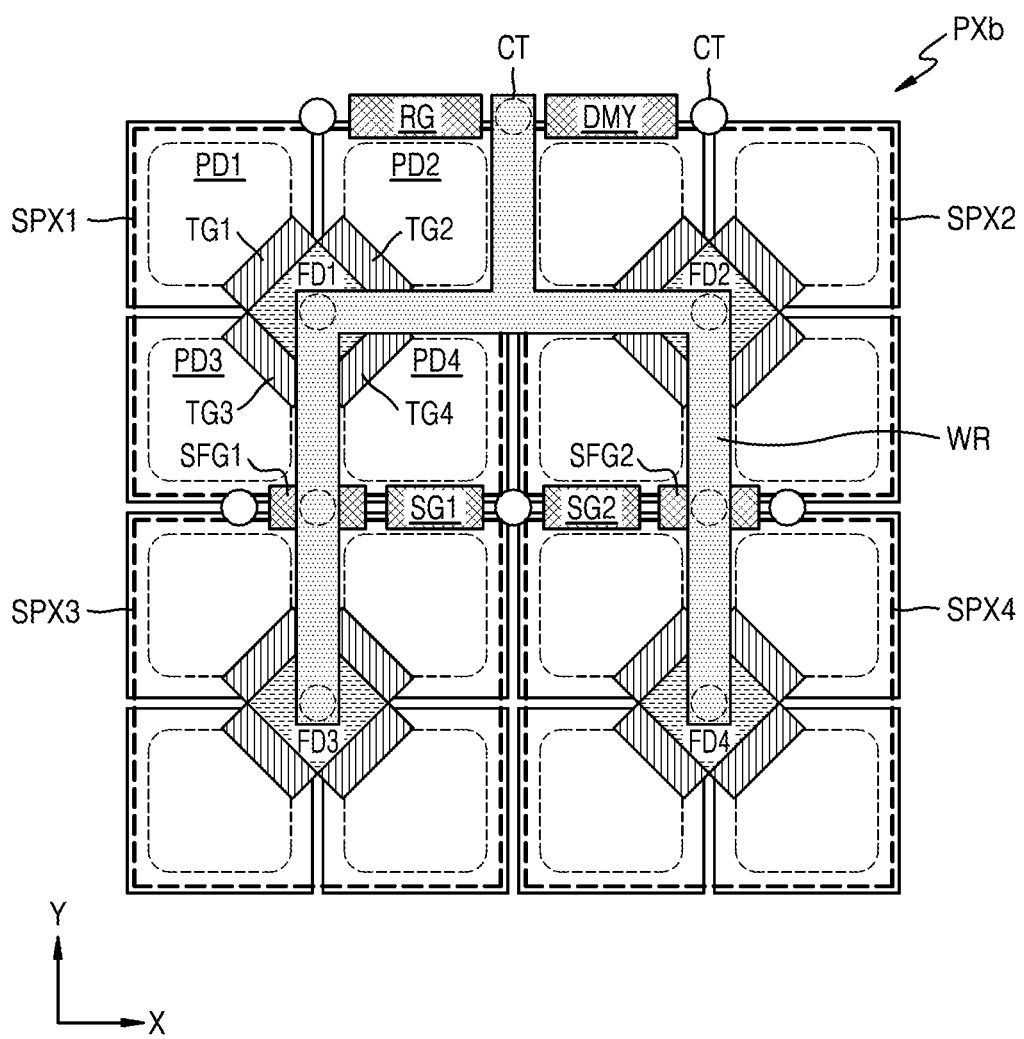
FIGS. 6A and 6B are plan views of pixels according to an example embodiment.
Figure 6B:
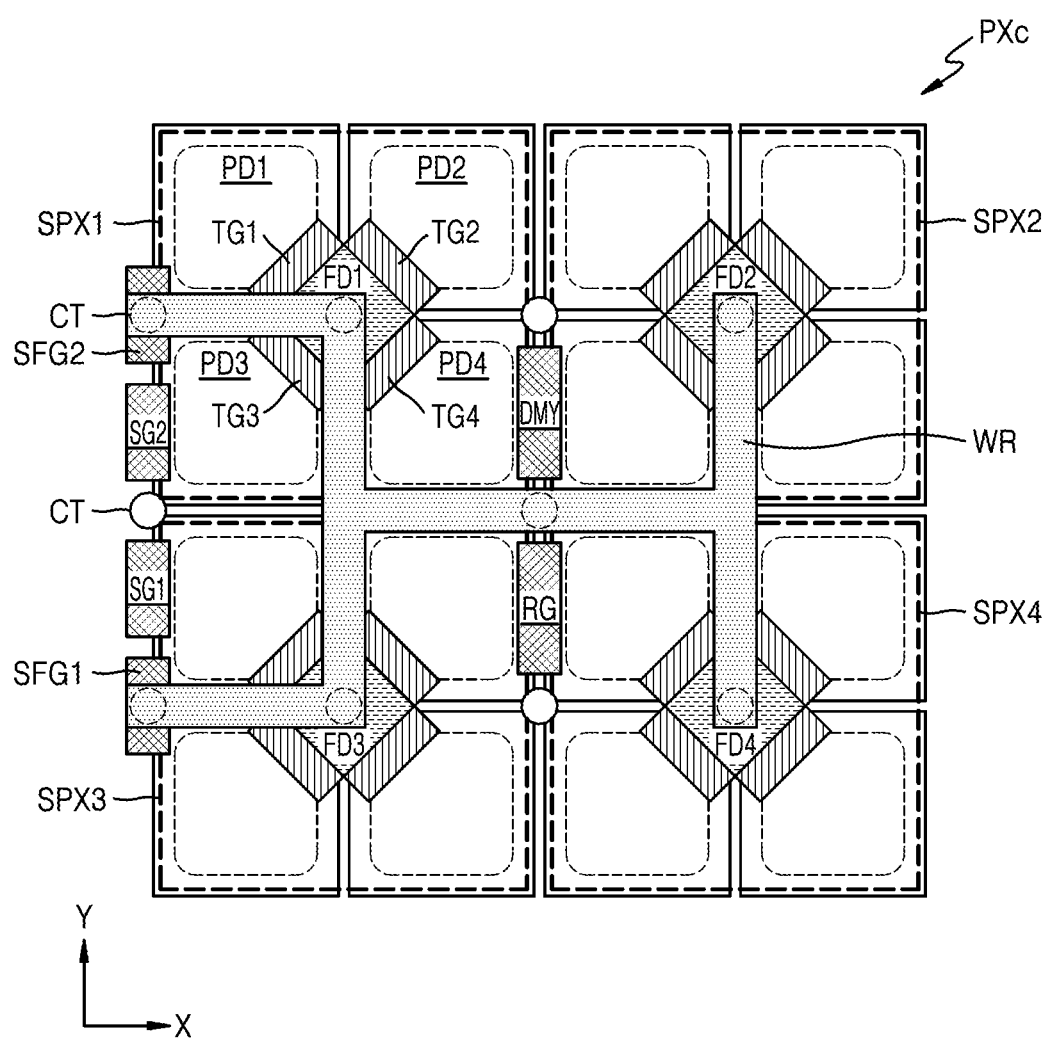

FIGS. 6A and 6B are plan views of pixels PXb and PXc according to an example embodiment. The pixels PXb and PXc of FIGS. 6A and 6B are modifications of the pixel PXa of FIG. 4. Accordingly, a difference between FIGS. 6A and 6B and FIG. 4 will now be focused on and described.

Referring to FIGS. 6A and 6B, each of the pixels PXb and PXc may include first through fourth subpixels SPX1 through SPX4, and the first through fourth subpixels SPX1 through SPX4 have the same structures. Each of the first through fourth subpixels SPX1 through SPX4 may include first through fourth photoelectric conversion devices PD1 through PD4, first through fourth transmission gates TG1 through TG4, and a floating diffusion region. The first through fourth floating diffusion regions FD1 through FD4 may be arranged at respective centers of the first through fourth subpixels SPX1 through SPX4, respectively. The internal wiring WR may be connected to the first through fourth floating diffusion regions FD1 through FD4 via contacts CT.

Each of the pixels PXb and PXc may include the reset gate RG, the first and second driving gates SFG1 and SFG2, the first and second selection gates SG1 and SG2, and the dummy gate DMY. The first and second driving gates SFG1 and SFG2 may be connected to the internal wiring WR via contacts CT.

Referring to FIG. 6A, the internal wiring WR may extend in the second direction to connect the first floating diffusion region FD1 to the third floating diffusion region FD3 and connect the second floating diffusion region FD2 to the fourth floating diffusion region FD4. The internal wiring WR may also extend in the first direction to connect the first floating diffusion region FD1 to the second floating diffusion region FD2.

The first and second driving gates SFG1 and SFG2 and the first and second selection gates SG1 and SG2 may be arranged side by side in the first direction, e.g., the X-axis direction, at the center of the pixel PXb. The first and second driving gates SFG1 and SFG2 and the first and second selection gates SG1 and SG2 may be arranged between the first and second subpixels SPX1 and SPX2 and the third and fourth subpixels SPX2 and SPX4.

The reset gate RG may be arranged in an upper (or, not shown, lower) portion of the pixel PXb, and the dummy gate DMY may be arranged symmetrically with the reset gate RG about the center of the pixel PXb in the first direction. The reset gate RG and the dummy gate DMY may be arranged symmetrically with each other about the internal wiring WR in the first direction.

Referring to FIG. 6B, the internal wiring WR may extend in the second direction to connect the first floating diffusion region FD1 to the third floating diffusion region FD3 and connect the second floating diffusion region FD2 to the fourth floating diffusion region FD4. The internal wiring WR may also extend in the first direction to connect the first and third floating diffusion regions FD1 and FD3 to the second and fourth floating diffusion regions FD2 and FD4.

The first and second driving gates SFG1 and SFG2 and the first and second selection gates SG1 and SG2 may be arranged side by side in the second direction, e.g., the Y-axis direction, on one side, e.g., a left side (or, not shown, right side) of the pixel PXc. The first and second driving gates SFG1 and SFG2 and the first and second selection gates SG1 and SG2 may be arranged parallel to the column line CL of FIG. 1.

The reset gate RG and the dummy gate DMY may be arranged at the center of the pixel PXc, and may be arranged symmetrically with each other about the center of the pixel PXa in the second direction.

As described above with reference to FIG. 6A, the first and second driving gates SFG1 and SFG2 and the first and second selection gates SG1 and SG2 may be arranged at the center of the pixel PXc, and the dummy gate DMY may be arranged outside of the pixel PXc, e.g., on a side of the pixel PXb.

As described above with reference to FIG. 6B, the first and second driving gates SFG1 and SFG2 and the first and second selection gates SG1 and SG2 may be arranged side by side in the second direction at a side of the pixel PXc, and the reset gate RG and the dummy gate DMY may be arranged side by side in the second direction in the center of the pixel PXc.

Figure 7:
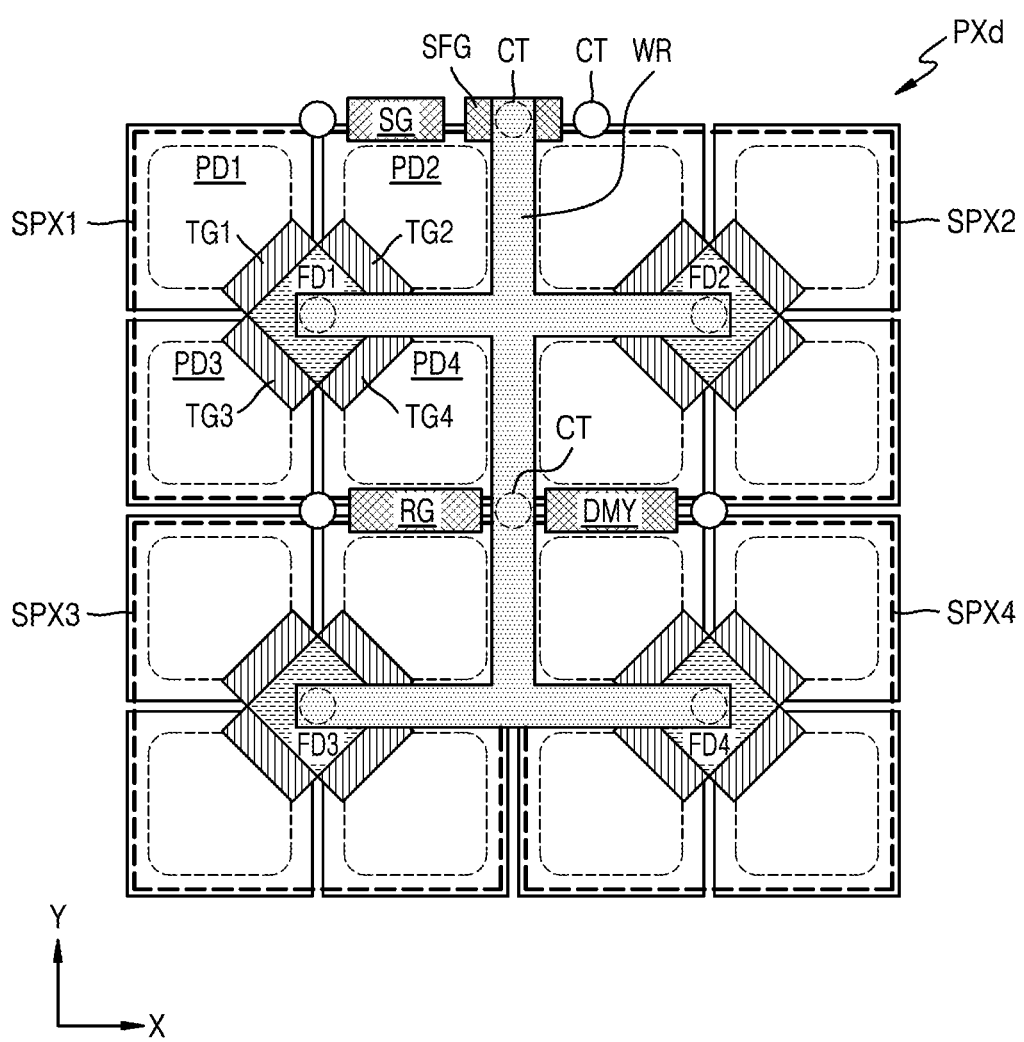
FIG. 7 is a plan view of a pixel according to an example embodiment.

FIG. 7 is a plan view of a pixel PXd according to an example embodiment. The pixel PXd of FIG. 7 is a modification of the pixel PXa of FIG. 4. Accordingly, a difference between FIG. 7 and FIG. 4 will now be focused on and described.

Referring to FIG. 7, the pixel PXd may include first through fourth subpixels SPX1 through SPX4, and the first through fourth subpixels SPX1 through SPX4 have the same structures. The first through fourth floating diffusion regions FD1 through FD4 may be arranged at respective centers of the first through fourth subpixels SPX1 through SPX4, respectively. The internal wiring WR may be connected to the first through fourth floating diffusion regions FD1 through FD4 via contacts CT.

The pixel PXd may include a reset gate RG, a driving gate SFG, a selection transistor SG, and a dummy gate DMY.

Compared with the pixel PXa of FIG. 4, the pixel PXd may include a single driving gate SFG and a single selection transistor SG.

The driving gate SFG and the selection transistor SG may be arranged at the center of an upper portion of the pixel PXd. The driving gate SFG may be connected to the internal wiring WR via a contact CT.

The dummy gate DMY may be arranged symmetrically with the selection transistor SG about the driving gate SFG in the first direction.

The internal wiring WR may extend in the first direction to connect the first floating diffusion region FD1 to the second floating diffusion region FD2, and connect the third floating diffusion region FD3 to the fourth floating diffusion region FD4. The internal wiring WR may also extend in the second direction to connect the first and second floating diffusion regions FD1 and FD2 to the third and fourth floating diffusion regions FD3 and FD4. A first terminal T1 of the internal wiring WR may be connected to the driving gate SFG via a contact CT.

Figure 8:
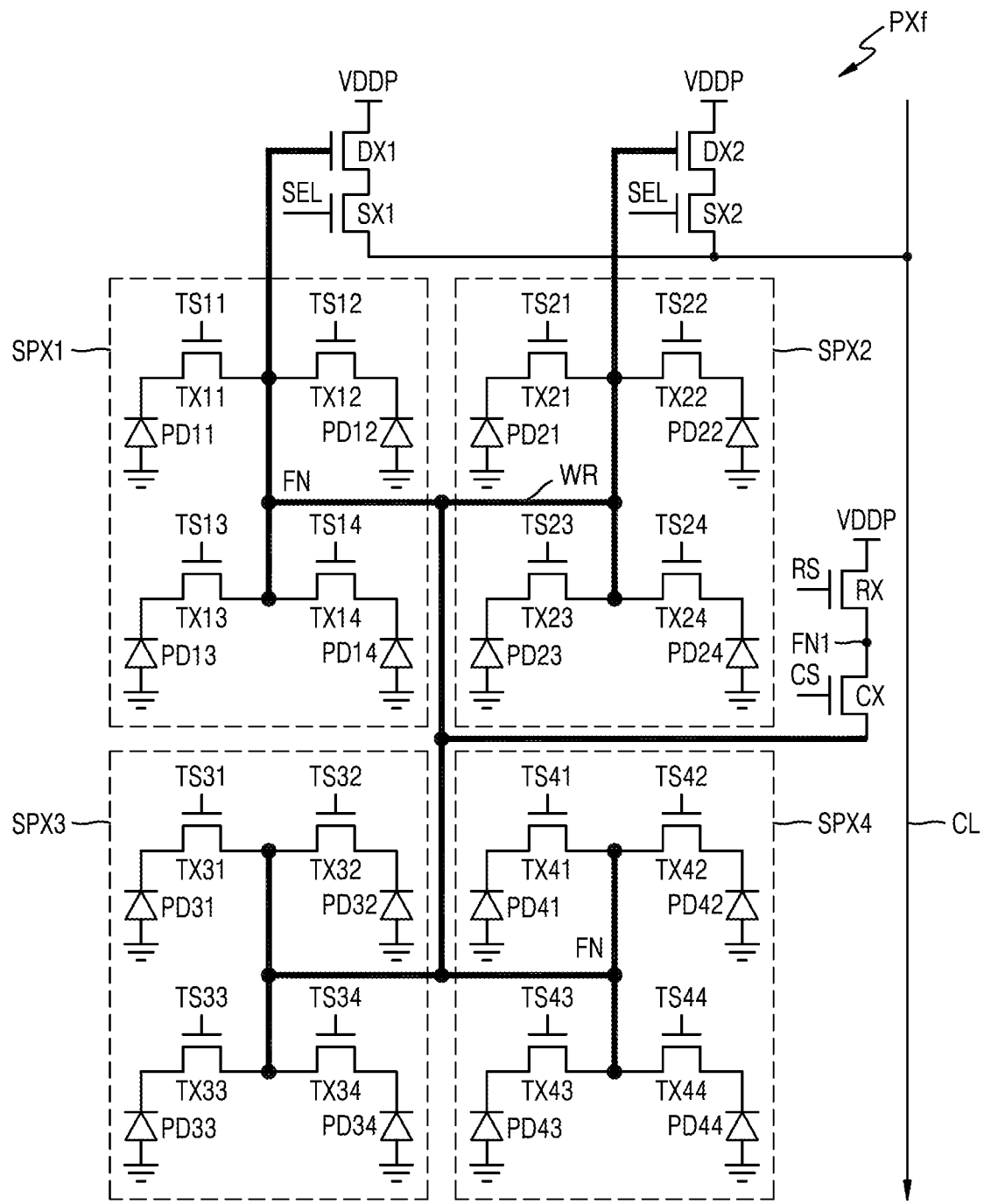
FIG. 8 is a circuit diagram of a pixel according to an example embodiment.

FIG. 8 is a circuit diagram of a pixel PXf according to an example embodiment. The pixel PXf of FIG. 8 is applicable to the first through fourth pixels PX1 through PX4 of the pixel array 110 of FIG. 2.

Referring to FIG. 8, the pixel PXf may include first through fourth subpixels SPX1 through SPX4, a reset transistor RX, a gain control transistor CX, first and second driving transistors DX1 and DX2, and first and second selection transistors SX1 and SX2. The reset transistor RX, the gain control transistor CX, the first and second driving transistors DX1 and DX2, and the first and second selection transistors SX1 and SX2 may constitute an output circuit of the pixel PXf.

Compared with the pixel PXa of FIG. 3, the pixel PXf may further include the gain control transistor CX.

The gain control transistor CX may be turned on in response to a gain control signal CS. A capacitor may be formed on a drain of the gain control transistor CX and may store electric charges. The drain of the gain control transistor CX may be referred to as a floating diffusion node FN1. When the reset transistor RX is turned off and the gain control transistor CX is turned on, the floating diffusion node FN1 may be electrically connected to the floating diffusion node FN, and thus capacitance of the floating diffusion node FN may be increased.

A conversion gain of the pixel PXf may be inversely proportional to the capacitance of the floating diffusion node FN, and thus a conversion gain when the gain control transistor CX is turned off may be higher than a conversion gain when the gain control transistor CX is turned on. When the gain control transistor CX is turned off, this may be referred to as a high conversion gain (HCG) mode, and, when the gain control transistor CX is turned on, this may be referred to as a low conversion gain (LCG) mode. When a small amount of light is incident upon the pixel array 110 of the image sensor 100 of FIG. 1 under a night or dark environment, the pixel array 110 may operate in the HCG mode. A lowest amount of light that can be sensed may be reduced due to an increase in a signal to noise ratio (SNR) of the image sensor 100 of FIG. 1, and the low-light amount sensing performance of the image sensor 100 may be improved. When a large amount of light is incident upon the pixel array 110 of the image sensor 100 of FIG. 1 (e.g., under a day or bright environment), the pixel array 110 may operate in the LCG mode. A full well capacity (FWC) of the pixel PXf may be increased, and thus, the high-light amount sensing performance of the image sensor 100 may be improved.

As described above, the pixel PXf may provide a dual conversion gain, and thus, the image sensor 100 may generate a high-quality image under a bright environment and a dark environment. The image sensor 100 may consecutively generate a first image generated in the HCG mode and a second image generated in the LCG mode, and may combine the first image with the second image to generate an image having a high dynamic range.

Although the pixel PXf includes the single gain control transistor CX in FIG. 8, this may be varied, e.g., the pixel PXf may include two or more gain control transistors CX serially connected to each other. The conversion gain of the pixel PXf may be determined according to the number of gain control transistors CX that are turned on. For example, in the case of a pixel based on the pixel PXf but including two gain control transistors CX, when the two gain control transistors CX are both turned off, this may be referred to as the HCG mode, when one of the two gain control transistors CX is turned on, this may be referred to as a middle conversion gain (MCG), and when the two gain control transistors CS are turned on, this may be referred to as the LCG mode.

Figure 9A:
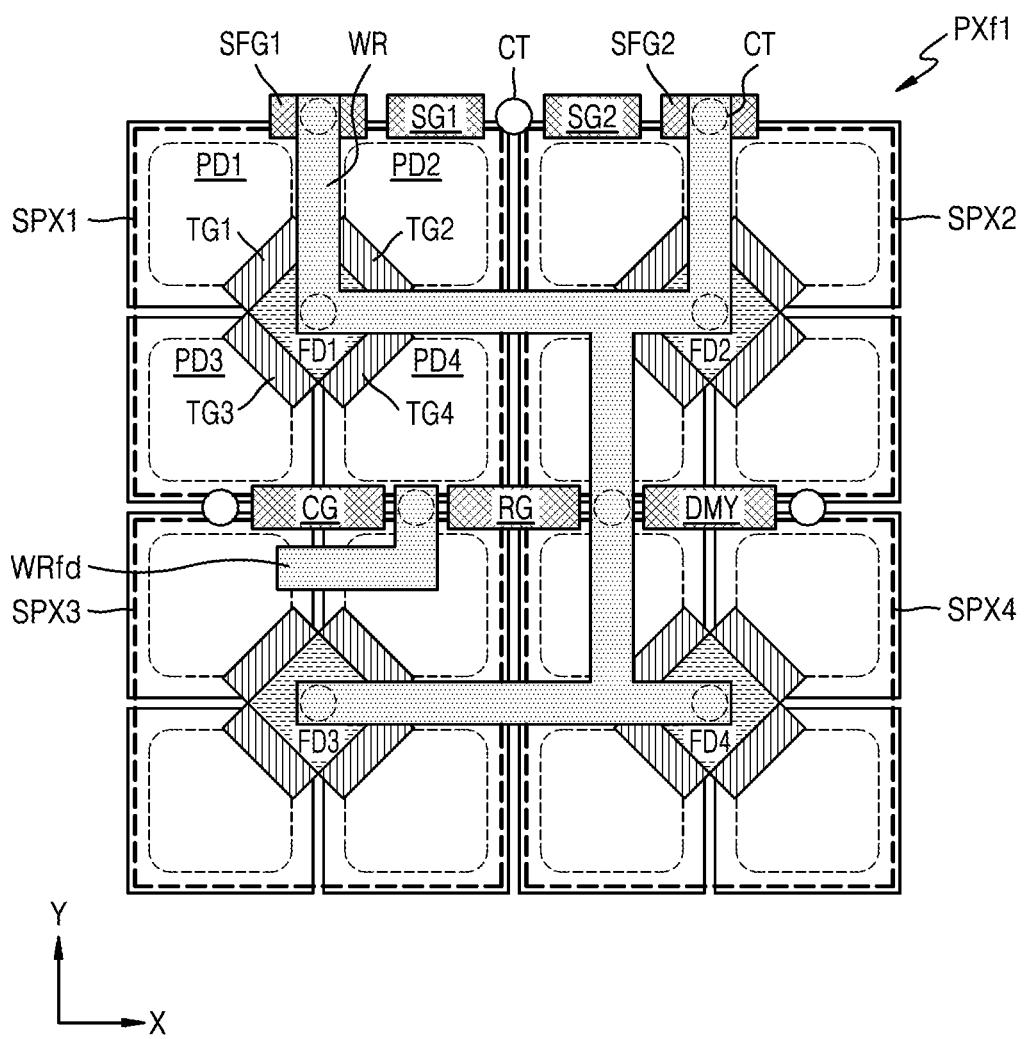
FIGS. 9A, 9B, and 9C are plan views of pixels according to an example embodiment.
Figure 9B:
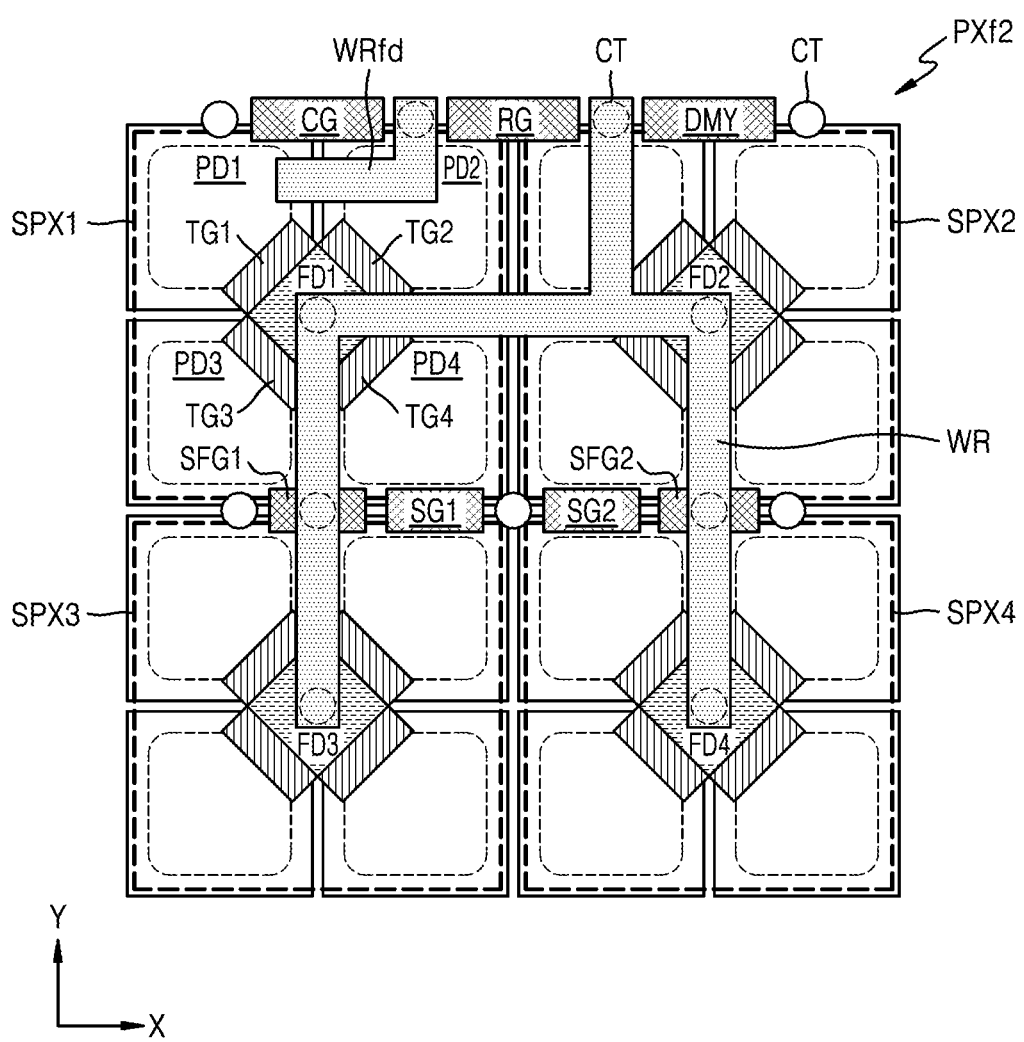
Figure 9C:
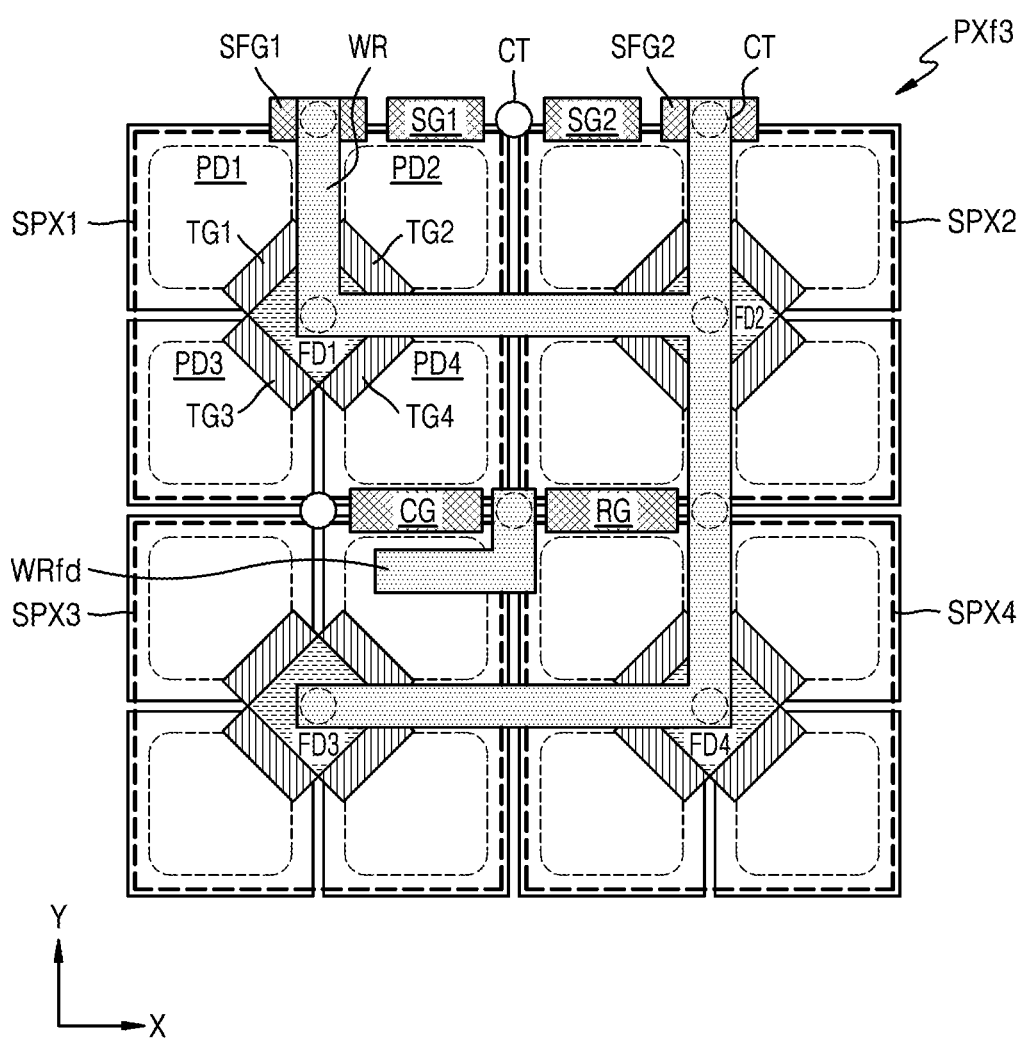

FIGS. 9A, 9B, and 9C are plan views of pixels PXf1, PXf2, and PXf3 according to an example embodiment. The pixels PXf1, PXf2, and PXf3 of FIGS. 9A, 9B, and 9C are modifications of the pixel PXa of FIG. 4. Accordingly, a difference between FIGS. 9A, 9B, and 9C and FIG. 4 will now be focused on and described.

Referring to FIG. 9A, the pixel PXf1 may include first through fourth subpixels SPX1 through SPX4, and the first through fourth subpixels SPX1 through SPX4 have the same structures. The first through fourth floating diffusion regions FD1 through FD4 may be arranged at respective centers of the first through fourth subpixels SPX1 through SPX4, respectively. The internal wiring WR may be connected to the first through fourth floating diffusion regions FD1 through FD4 via contacts CT.

The pixel PXf1 may include the first and second driving gates SFG1 and SFG2, the first and second selection gates SG1 and SG2, the reset gate RG, a gain control gate CG, and the dummy gate DMY. The first and second driving gates SFG1 and SFG2 may be connected to the internal wiring WR via contacts CT.

The first and second driving gates SFG1 and SFG2 and the first and second selection gates SG1 and SG2 may be arranged side by side in the first direction in an upper (or, not shown, lower) portion of the pixel PXf1. The reset gate RG, the gain control gate CG, and the dummy gate DMY may be arranged side by side in the first direction between the first and second subpixels SPX1 and SPX2 and the third and fourth subpixels SPX3 and SPX4. The reset gate RG may be arranged at the center of the pixel PXf1. The gain control gate CG and the dummy gate DMY may be arranged symmetrically with each other about the reset gate RG.

Wiring WRfd may be connected to a well area between the conversion gate CG and the reset gate RG, namely, to the floating diffusion node FN1 of FIG. 8, via a contact CT. The wiring WRfd may extend in the first direction and/or the second direction, and thus a capacitor may be formed on the floating diffusion node FN1. As the length of the wiring WRfd increases, the capacitance of the floating diffusion node FN1 may be increased. The wiring WRfd may be connected to a floating diffusion node FN1 of an adjacent pixel PXf1 such that adjacent pixels PXf1 may share the floating diffusion node FN1.

In an implementation (not shown in FIG. 9A), the first and second driving gates SFG1 and SFG2 and the first and second selection gates SG1 and SG2 may be arranged side by side in the second direction on a left side or right side of the pixel PXf1, and the reset gate RG, the gain control gate CG, and the dummy gate DMY may be arranged side by side in the second direction between the first and third subpixels SPX1 and SPX3 and the second and fourth subpixels SPX2 and SPX4.

Referring to FIG. 9B, the pixel PXf2 may include the first through fourth subpixels SPX1 through SPX4, the first and second driving gates SFG1 and SFG2, the first and second selection gates SG1 and SG2, the reset gate RG, the gain control gate CG, and the dummy gate DMY.

The first and second selection gates SG1 and SG2 may be arranged side by side in the first direction between the first and second subpixels SPX1 and SPX2 and the third and fourth subpixels SPX3 and SPX4. The reset gate RG, the gain control gate CG, and the dummy gate DMY may be arranged side by side in the first direction in an upper (or, not shown, lower) portion of the pixel PXf2.

In an implementation (not shown in FIG. 9B), the first and second driving gates SFG1 and SFG2 and the first and second selection gates SG1 and SG2 may be arranged side by side in the second direction between the first and third subpixels SPX1 and SPX3 and the second and fourth subpixels SPX2 and SPX4, and the reset gate RG, the gain control gate CG, and the dummy gate DMY may be arranged side by side in the first direction on a left side or right side of the pixel PXf2.

Referring to FIG. 9C, the pixel PXf3 may include the first through fourth subpixels SPX1 through SPX4, the first and second driving gates SFG1 and SFG2, the first and second selection gates SG1 and SG2, the reset gate RG, and the gain control gate CG.

The structure of the pixel PXf3 of FIG. 9C is similar to that of the pixel PXf1 of FIG. 9A. However, the pixel PXf3 includes no dummy gates DMY, and the reset gate RG and the gain control gate CG may be arranged symmetrically about the pixel PXf3 in the first direction.

Figure 10A:
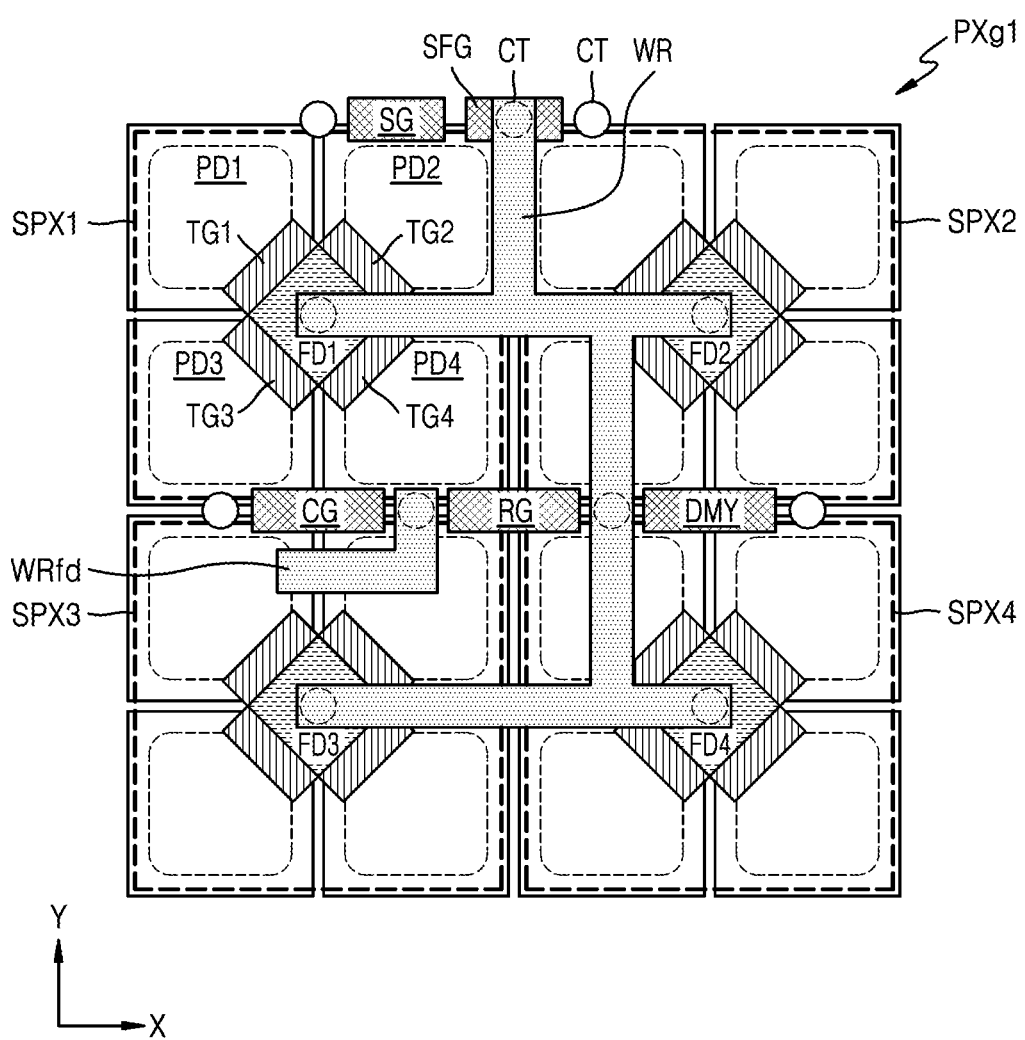
FIGS. 10A and 10B are plan views of pixels according to an example embodiment.
Figure 10B:
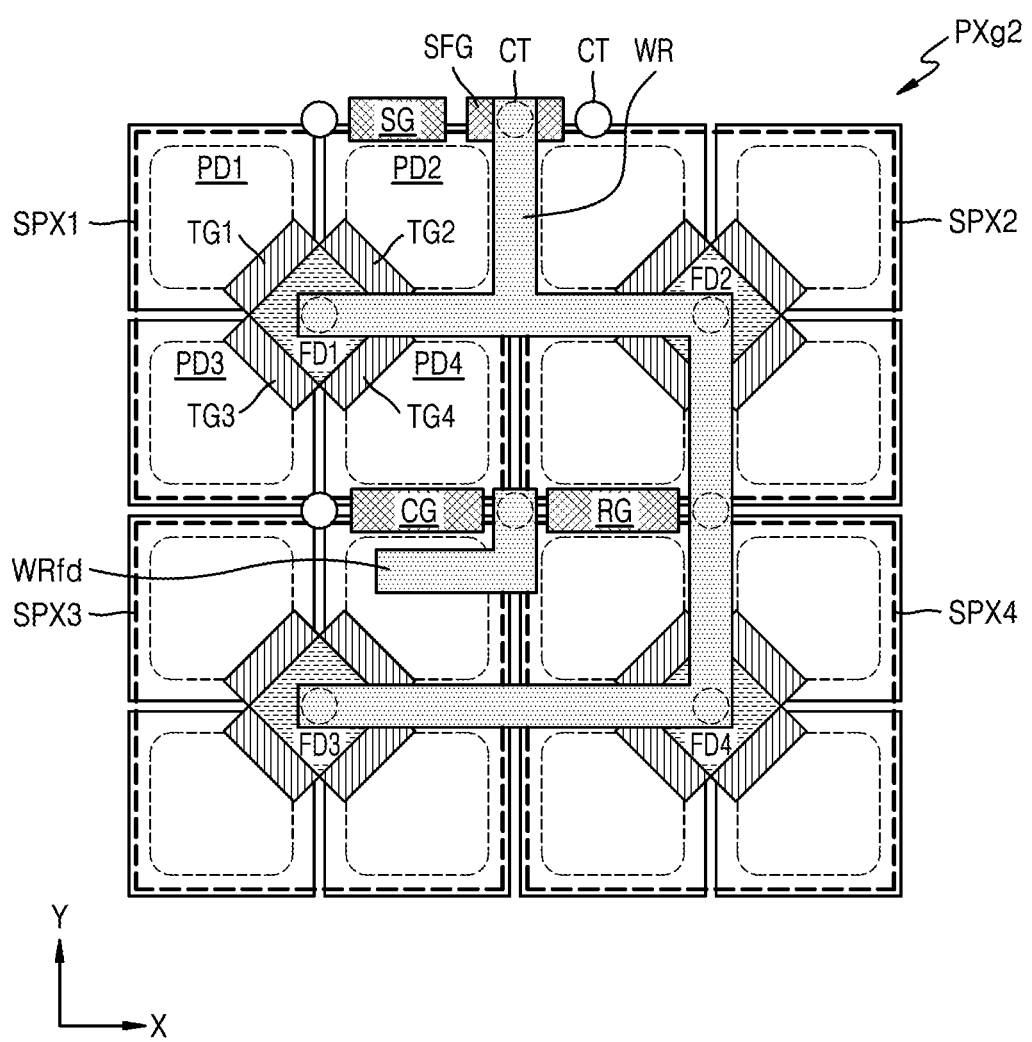

FIGS. 10A and 10B are plan views of pixels PXg1 and PXg2 according to an example embodiment. The pixel PXg1 of FIG. 10A is a modification of the pixel PXf1 of FIG. 9A. Accordingly, a difference between FIG. 9A and FIG. 10A will now be focused on and described.

Referring to FIG. 10A, the pixel PXg1 may include first through fourth subpixels SPX1 through SPX4, and the first through fourth subpixels SPX1 through SPX4 have the same structures. The first through fourth floating diffusion regions FD1 through FD4 may be arranged at respective centers of the first through fourth subpixels SPX1 through SPX4, respectively. The internal wiring WR may be connected to the first through fourth floating diffusion regions FD1 through FD4 via contacts CT.

The pixel PXg1 may include a driving gate SFG, a selection gate SG, a reset gate RG, a gain control gate CG, and a dummy gate DMY. The driving gate SFG may be connected to the internal wiring WR via a contact CT.

The reset gate RG, the gain control gate CG, and the dummy gate DMY may be arranged side by side in the first direction between the first and second subpixels SPX1 and SPX2 and the third and fourth subpixels SPX3 and SPX4.

The gain control gate CG and the dummy gate DMY may be arranged symmetrically with each other about the reset gate RG in the first direction.

Compared with the pixel PXf1 of FIG. 9A, the pixel PXg1 includes a single driving gate SFG and a single selection transistor SG.

The driving gate SFG and the selection transistor SG may be arranged at the center of an upper (or, not shown, lower) portion of the pixel PXg1.

In an implementation (not shown in FIG. 10A), a dummy gate may be arranged symmetrically with the selection transistor SG about the driving gate SFG in the first direction.

In an implementation (not shown in FIG. 10A), the driving gate SFG and the selection transistor SG may be arranged side by side in the first direction between the first and second subpixels SPX1 and SPX2 and the third and fourth subpixels SPX3 and SPX4, and the reset gate RG, the gain control gate CG, and the dummy gate DMY may be arranged side by side in the first direction in an upper or lower portion of the pixel PXg1.

In an implementation (not shown in FIG. 10A), the reset gate RG, the gain control gate CG, and the dummy gate DMY may be arranged side by side in the second direction between the first and third subpixels SPX1 and SPX3 and the second and fourth subpixels SPX2 and SPX4, and the driving gate SFG and the selection transistor SG may be arranged side by side in the second direction at the center of the left side or right side of the pixel PXg1. Alternatively, the driving gate SFG and the selection transistor SG may be arranged side by side in the second direction between the first and third subpixels SPX1 and SPX3 and the second and fourth subpixels SPX2 and SPX4, and the reset gate RG, the gain control gate CG, and the dummy gate DMY may be arranged side by side in the second direction at the center of the left side or right side of the pixel PXg1.

Referring to FIG. 10B, the pixel PXg2 may include no dummy gates DMY, and the reset gate RG and the gain control gate CG may be arranged symmetrically with each other about the center of the pixel PXg2 in the first direction.

Figure 11A:
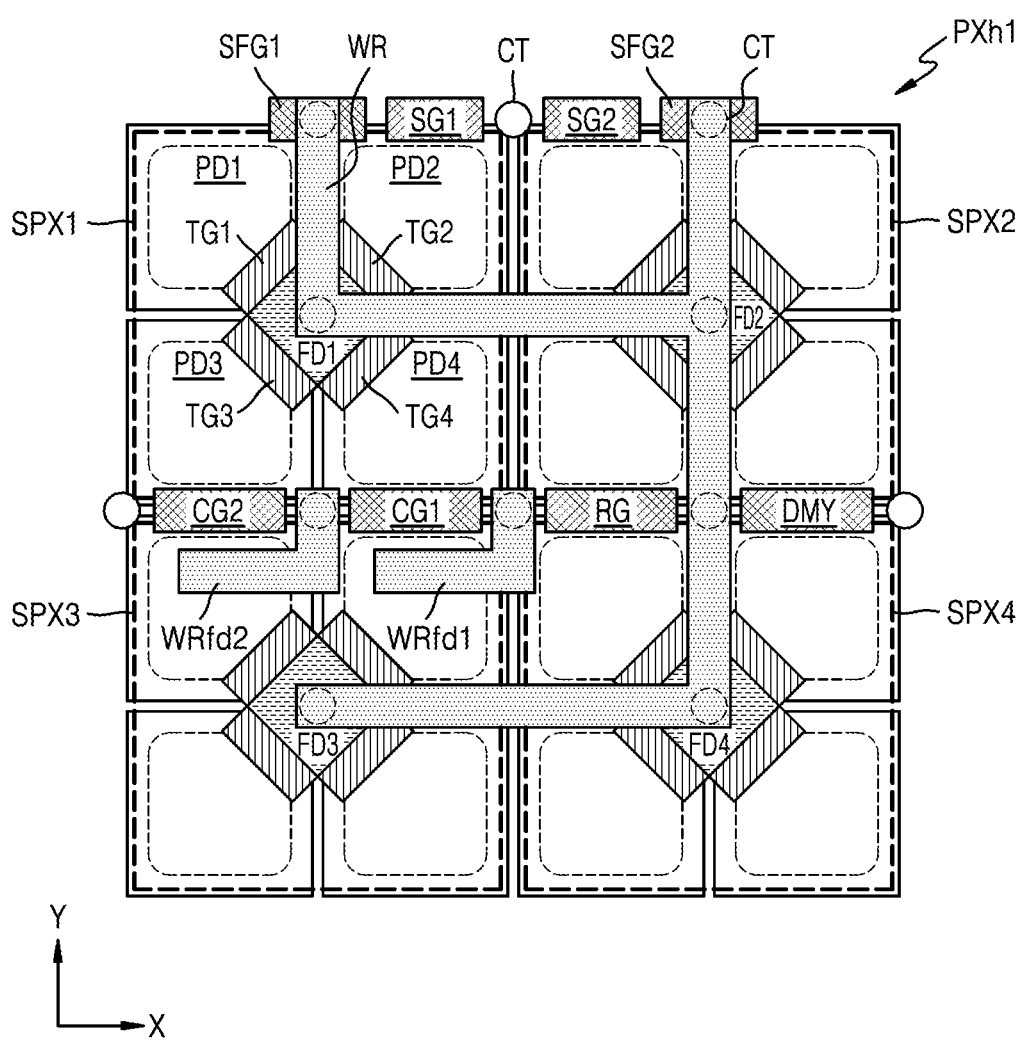
FIGS. 11A, 11B, and 11C are plan views of pixels according to an example embodiment.
Figure 11B:
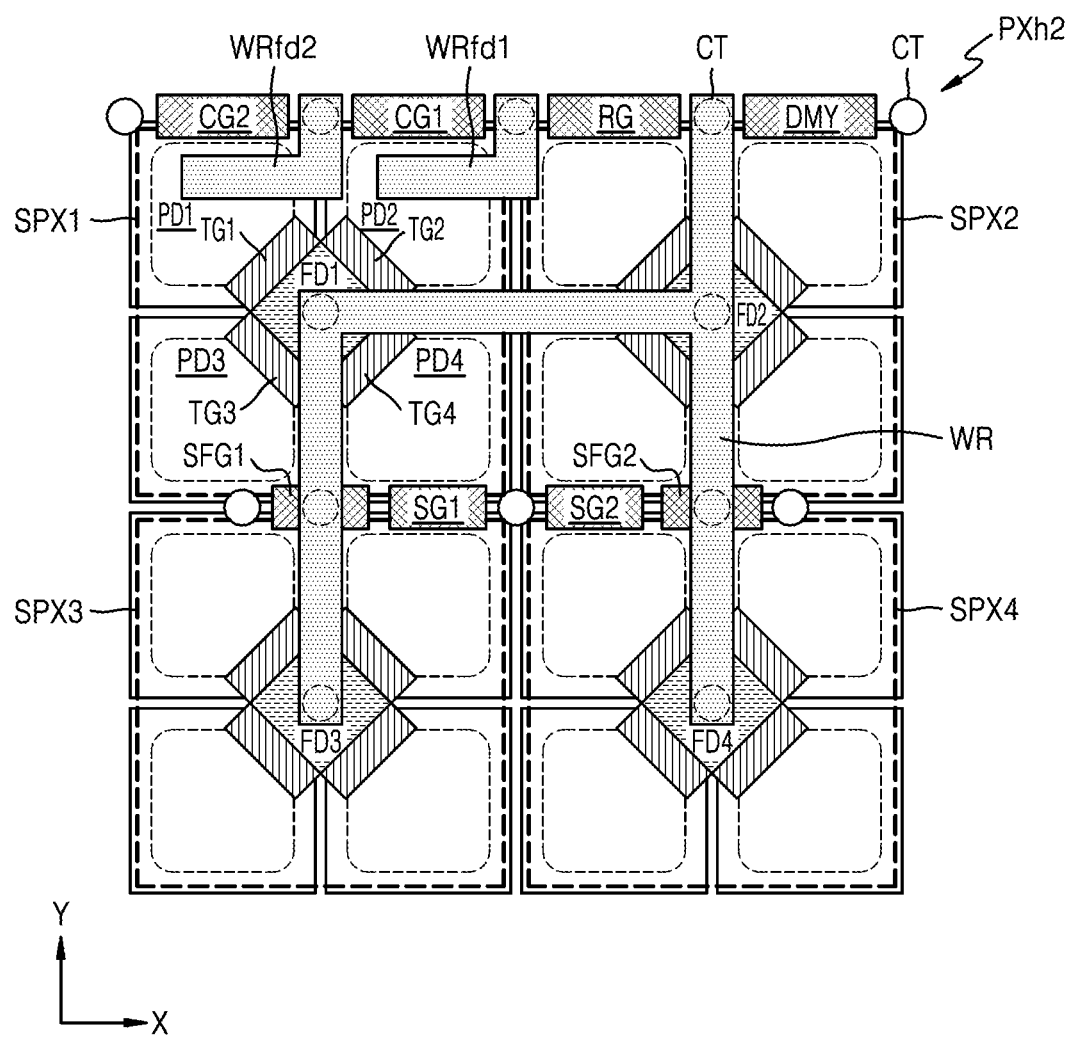
Figure 11C:
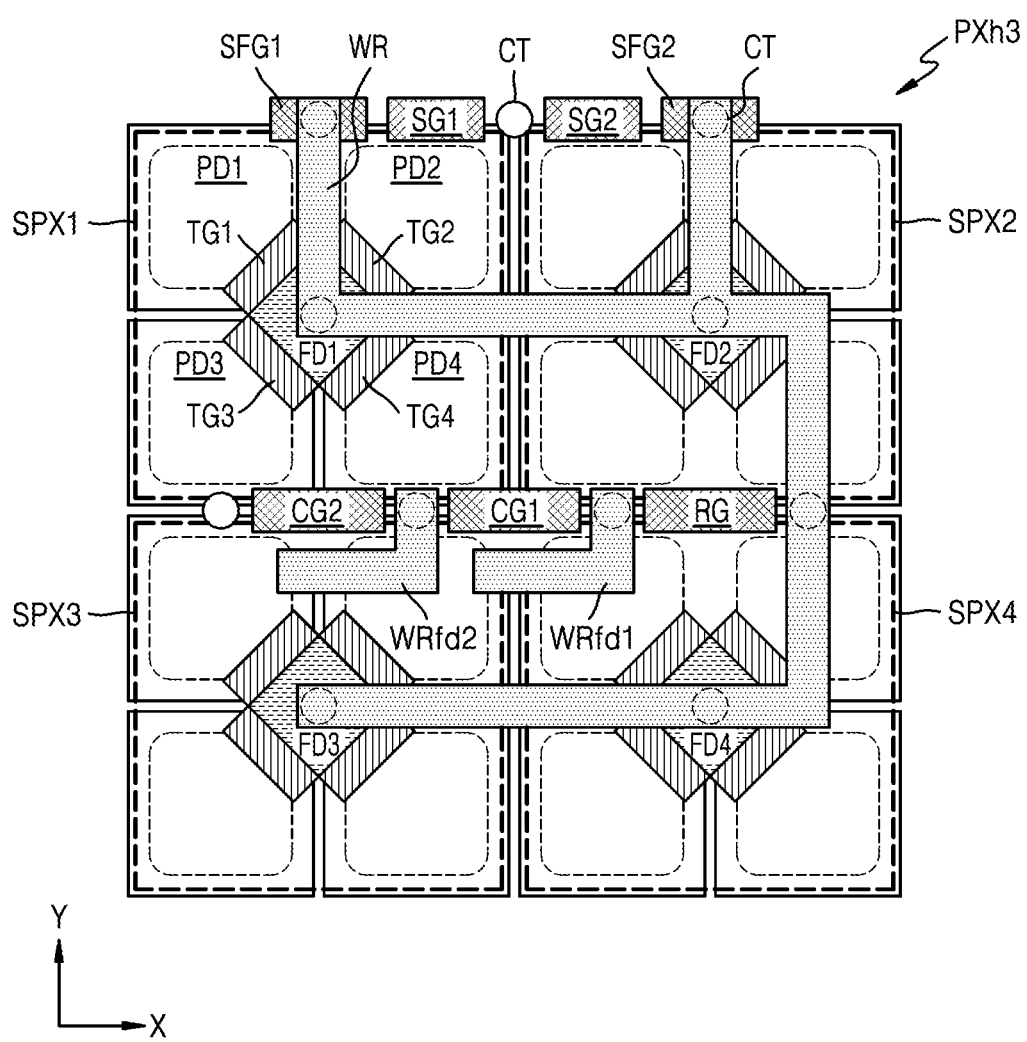

FIGS. 11A, 11B, and 11C are plan views of pixels PXh1, PXh2, and PXh3 according to an example embodiment. The pixel PXh1 of FIG. 11A is a modification of the pixel PXf1 of FIG. 9A. Accordingly, a difference between FIG. 9A and FIG. 11A will now be focused on and described.

Referring to FIG. 11A, the pixel PXh1 may include first through fourth subpixels SPX1 through SPX4, and the first through fourth subpixels SPX1 through SPX4 have the same structures. The first through fourth floating diffusion regions FD1 through FD4 may be arranged at respective centers of the first through fourth subpixels SPX1 through SPX4, respectively. The internal wiring WR may be connected to the first through fourth floating diffusion regions FD1 through FD4 via contacts CT.

The pixel PXh1 may include the first and second driving gates SFG1 and SFG2, the first and second selection gates SG1 and SG2, the reset gate RG, a first gain control gate CG1, a second gain control gate CG2, and the dummy gate DMY. The first and second driving gates SFG1 and SFG2 may be connected to the internal wiring WR via contacts CT.

The first and second driving gates SFG1 and SFG2 and the first and second selection gates SG1 and SG2 may be arranged side by side in the first direction in an upper (or, not shown, lower) portion of the pixel PXh1. The second gain control gate CG2, the first gain control gate CG1, the reset gate RG, and the dummy gate DMY may be arranged side by side in the first direction between the first and second subpixels SPX1 and SPX2 and the third and fourth subpixels SPX3 and SPX4. The second gain control gate CG2 and the dummy gate DMY may be arranged symmetrically with each other about center of the pixel PXh1 in the first direction. The first gain control gate CG1 and the reset gate RG may be arranged symmetrically with each other in the first direction.

Wiring WRfd1 may be connected to a well area between the first conversion gate CG1 and the reset gate RG via a contact CT. Wiring WRfd2 may be connected to a well area between the second conversion gate CG2 and the first conversion gate CG1. Each of the wirings WRfd1 and WRfd2 may extend in the first direction and/or the second direction. At least one of the wirings WRfd1 and WRfd2 may be connected to one of the floating diffusion nodes of adjacent pixels PXh1.

In an implementation (not shown in FIG. 11A), the first and second driving gates SFG1 and SFG2 and the first and second selection gates SG1 and SG2 may be arranged side by side in the second direction on a left side or right side of the pixel PXh1, and the second gain control gate CG2, the first gain control gate CG1, the reset gate RG, and the dummy gate DMY may be arranged side by side in the second direction between the first and third subpixels SPX1 and SPX3 and the second and fourth subpixels SPX2 and SPX4.

Referring to FIG. 11B, the pixel PXh2 may include the first through fourth subpixels SPX1 through SPX4, the first and second driving gates SFG1 and SFG2, the first and second selection gates SG1 and SG2, the reset gate RG, the first gain control gate CG1, the second gain control gate CG2, and the dummy gate DMY.

The first and second selection gates SG1 and SG2 and the first and second driving gates SFG1 and SFG2 may be arranged side by side in the first direction between the first and second subpixels SPX1 and SPX2 and the third and fourth subpixels SPX3 and SPX4. The second gain control gate CG2, the first gain control gate CG1, the reset gate RG, and the dummy gate DMY may be arranged side by side in the first direction in an upper (or, not shown, lower) portion of the pixel PXh2.

In an implementation (not shown in FIG. 11B), the first and second driving gates SFG1 and SFG2 and the first and second selection gates SG1 and SG2 may be arranged side by side in the second direction between the first and third subpixels SPX1 and SPX3 and the second and fourth subpixels SPX2 and SPX4, and the second gain control gate CG2, the first gain control gate CG1, the reset gate RG, and the dummy gate DMY may be arranged side by side in the first direction on a left side or right side of the pixel PXh2.

Referring to FIG. 11C, the pixel PXh3 may include the first through fourth subpixels SPX1 through SPX4, the first and second driving gates SFG1 and SFG2, the first and second selection gates SG1 and SG2, the reset gate RG, the first gain control gate CG1 and the second gain control gate CG2.

The structure of the pixel PXh3 of FIG. 11C is similar to that of the pixel PXh1 of FIG. 11A, except that the pixel PXh3 includes no dummy gates DMY.

The second gain control gate CG2, the first gain control gate CG1, and the reset gate RG may be arranged side by side in the first direction at the center of the pixel PXh3. The first gain control gate CG1 may be arranged at the center of the pixel PXh3, and the second gain control gate CG2 and the reset gate RG may be arranged symmetrically with each other about the first gain control gate CG1 in the first direction.

Figure 12A:
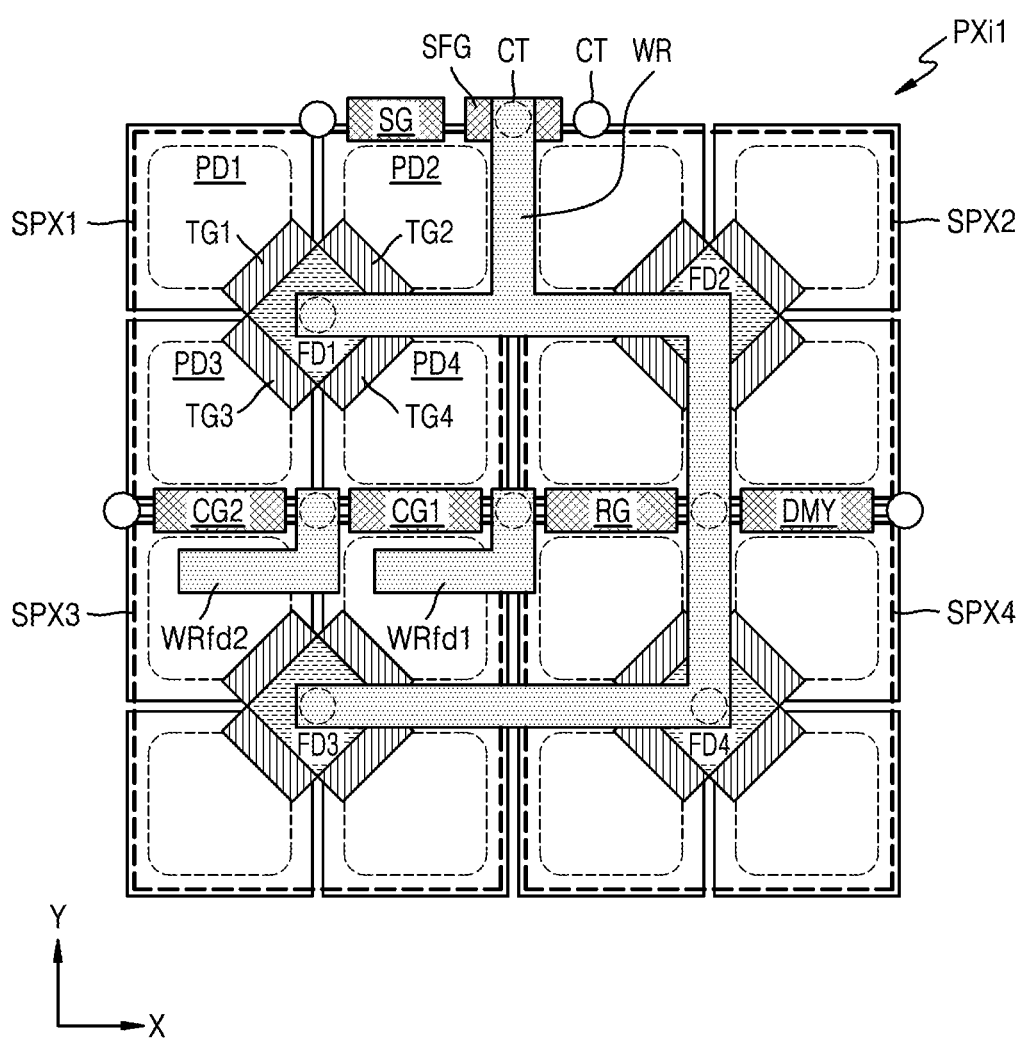
FIGS. 12A, 12B, and 12C are plan views of pixels according to an example embodiment.
Figure 12B:
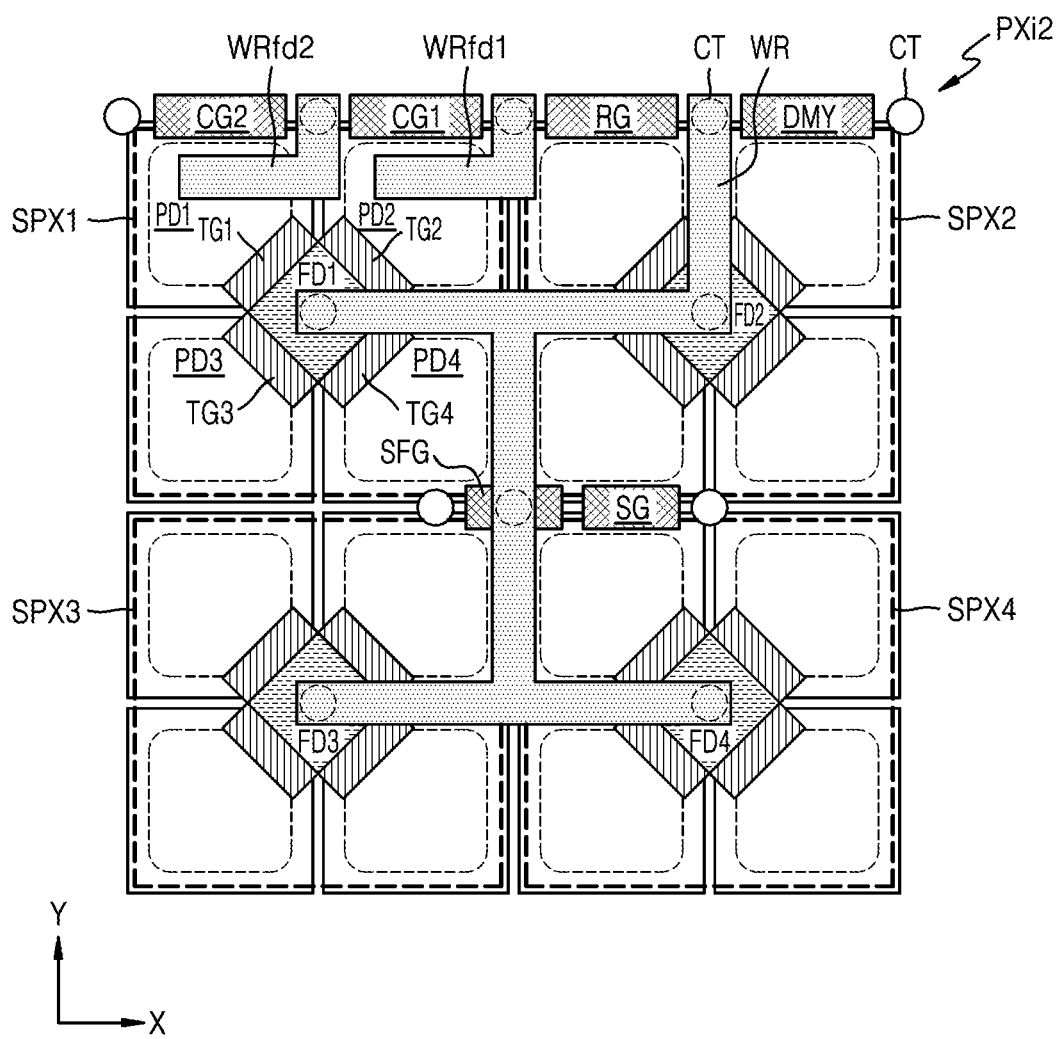
Figure 12C:
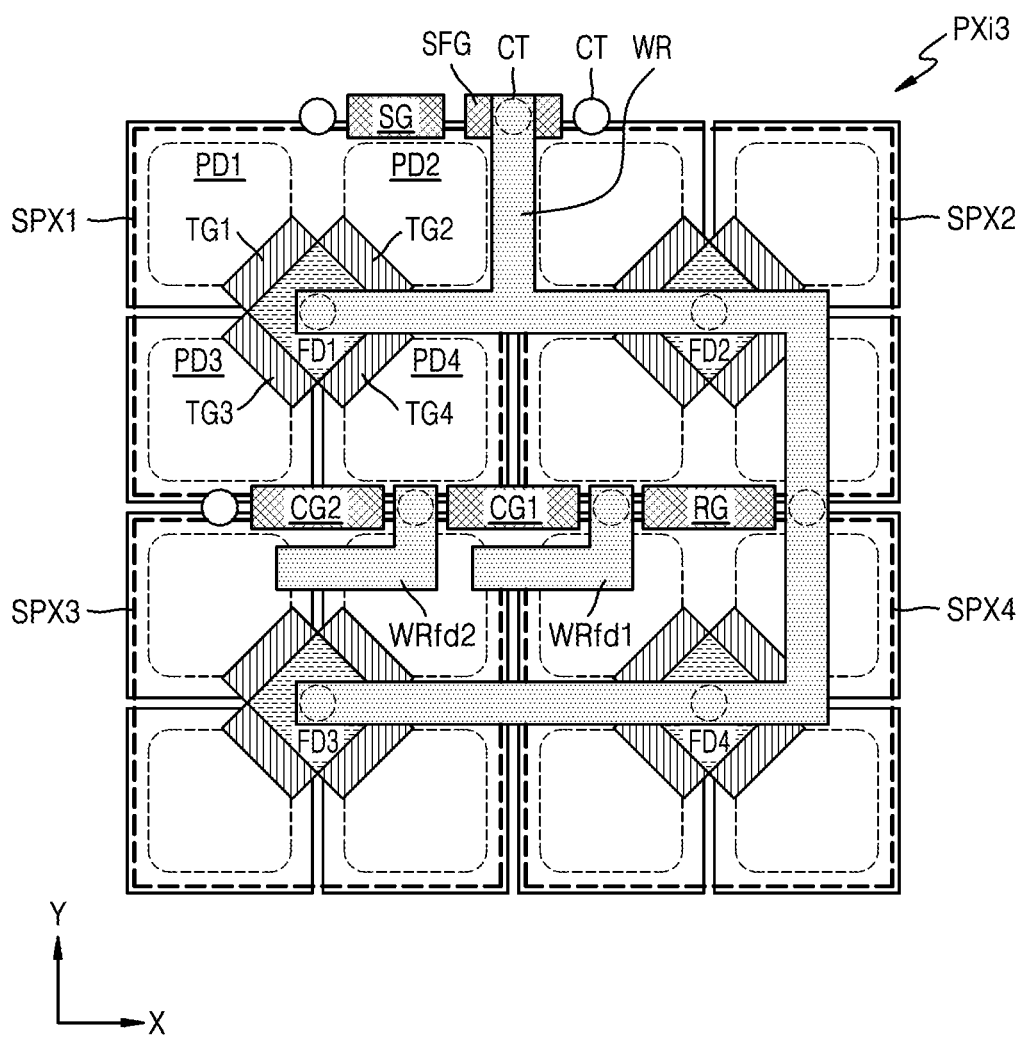

FIGS. 12A, 12B, and 12C are plan views of pixels PXi1, PXi2, and PXi3 according to an example embodiment. The pixel PXi1 of FIG. 12A is a modification of the pixel PXh1 of FIG. 11A. Accordingly, a difference between FIG. 12A and FIG. 11A will now be focused on and described.

Referring to FIG. 12A, the pixel PXi1 may include first through fourth subpixels SPX1 through SPX4, and the first through fourth subpixels SPX1 through SPX4 have the same structures. The first through fourth floating diffusion regions FD1 through FD4 may be arranged at respective centers of the first through fourth subpixels SPX1 through SPX4, respectively. The internal wiring WR may be connected to the first through fourth floating diffusion regions FD1 through FD4 via contacts CT.

The pixel PXi1 may include the driving gate SFG, the selection gate SG, the reset gate RG, the first gain control gate CG1, the second gain control gate CG2, and the dummy gate DMY. The driving gate SFG may be connected to the internal wiring WR via a contact CT.

The driving gate SFG and the selection transistor SG may be arranged side by side in the first direction in an upper (or, not shown, lower) portion of the pixel PXi1.

In an implementation (not shown in FIG. 12A), a dummy gate DMY may be arranged symmetrically with the selection transistor SG about the driving gate SFG in the first direction.

The second gain control gate CG2, the first gain control gate CG1, the reset gate RG, and the dummy gate DMY may be arranged side by side in the first direction between the first and second subpixels SPX1 and SPX2 and the third and fourth subpixels SPX3 and SPX4.

In an implementation (not shown in FIG. 12A), the driving gate SFG and the selection transistor SG may be arranged side by side in the second direction on a left side or right side of the pixel PXi1, and the second gain control gate CG2, the first gain control gate CG1, the reset gate RG, and the dummy gate DMY may be arranged side by side in the second direction between the first and third subpixels SPX1 and SPX3 and the second and fourth subpixels SPX2 and SPX4.

Referring to FIG. 12B, the pixel PXh2 may include the first through fourth subpixels SPX1 through SPX4, the driving gate SFG, the selection transistor SG, the reset gate RG, the first gain control gate CG1, the second gain control gate CG2, and the dummy gate DMY.

The driving gate SFG and the selection transistor SG may be arranged side by side in the first direction between the first and second subpixels SPX1 and SPX2 and the third and fourth subpixels SPX3 and SPX4. The second gain control gate CG2, the first gain control gate CG1, the reset gate RG, and the dummy gate DMY may be arranged side by side in the first direction in an upper (or, not shown, lower) portion of the pixel PXi2.

In an implementation (not shown in FIG. 12B), the driving gate SFG and the selection transistor SG may be arranged side by side in the second direction between the first and third subpixels SPX1 and SPX3 and the second and fourth subpixels SPX2 and SPX4, and the second gain control gate CG2, the first gain control gate CG1, the reset gate RG, and the dummy gate DMY may be arranged side by side in the first direction on a left side or right side of the pixel PXi2.

Referring to FIG. 12C, the pixel PXi3 may include the first through fourth subpixels SPX1 through SPX4, the driving gate SFG, the selection transistor SG, the second gain control gate CG2, the first gain control gate CG1, and the reset gate RG.

The structure of the pixel PXi3 of FIG. 12C is similar to that of the pixel PXh3 of FIG. 11A, except that the pixel PXi3 includes no dummy gates DMY.

The second gain control gate CG2, the first gain control gate CG1, and the reset gate RG may be arranged side by side in the first direction at the center of the pixel PXi3. The first gain control gate CG1 may be arranged at the center of the pixel PXi3, and the second gain control gate CG2 and the reset gate RG may be arranged symmetrically with each other about the first gain control gate CG1 in the first direction.

FIGS. 13A, 13B, 13C, 13D, 13E, and 13F are plan views of pixels PXj1, PXj2, PXj3, PXj4, PXj5, and PXj6 according to an example embodiment.

Referring to FIGS. 13A through 13F, the pixels PXj1, PXj2, PXj3, PXj4, PXj5, and PXj6 may include the first through fourth subpixels SPX1 through SPX4.

The first through fourth subpixels SPX1 through SPX4 may be arranged side by side in the first direction, e.g., the X-axis direction. The first direction may be a row direction of the pixel array 110 of FIG. 1.

Each of the first through fourth subpixels SPX1 through SPX4 may include first through fourth photoelectric conversion devices PD1 through PD4, first through fourth transmission gates TG1 through TG4, and a floating diffusion region FD. The first through fourth floating diffusion regions FD1 through FD4 may be arranged at respective centers of the first through fourth subpixels SPX1 through SPX4, respectively. The internal wiring WR may be connected to the first through fourth floating diffusion regions FD1 through FD4 via contacts CT.

Figure 13A:
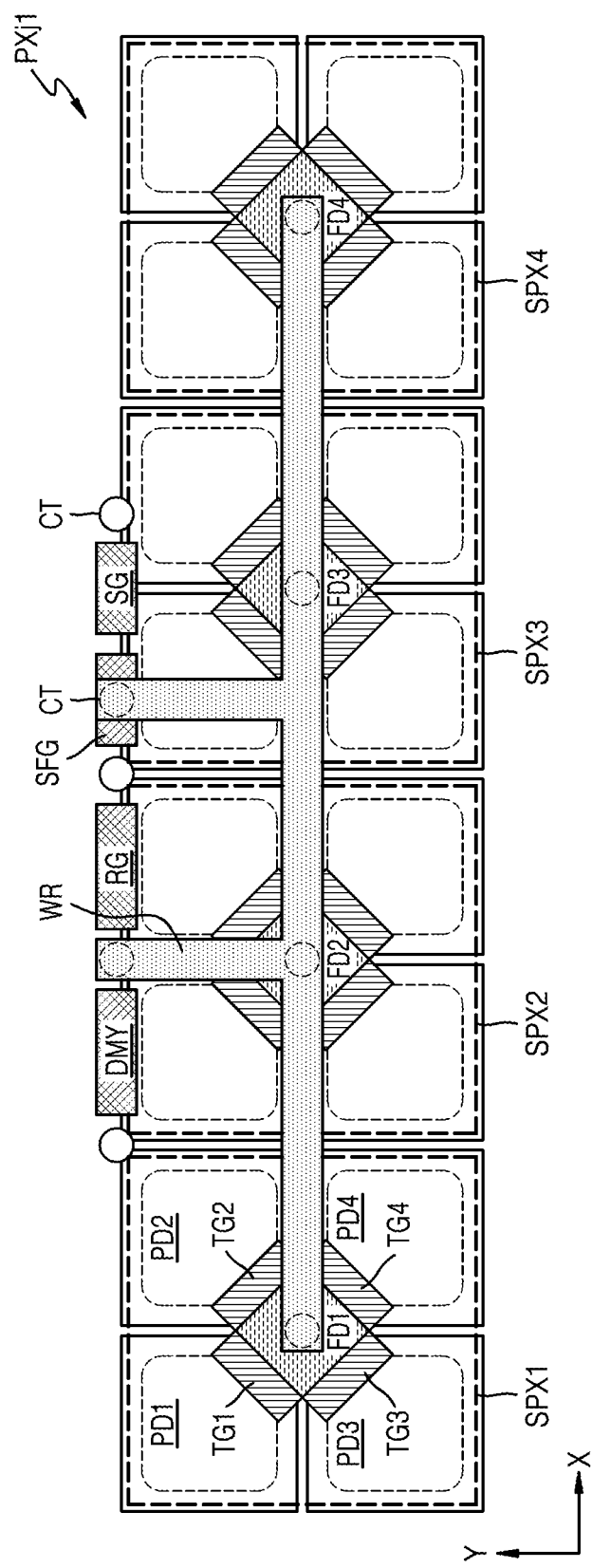
FIGS. 13A, 13B, 13C, 13D, 13E, and 13F are plan views of pixels according to an example embodiment.

Referring to FIG. 13A, the pixel PXj1 may include a driving gate SFG, a selection gate SG, a reset gate RG, and a dummy gate DMY.

The dummy gate DMY, the reset gate RG, the driving gate SFG, and the selection gate SG may be arranged side by side in the first direction in an upper (or, not shown, lower) portion of the pixel PXj1.

The driving gate SFG, the selection gate SG, the reset gate RG, and the dummy gate DMY may be arranged at the center of the upper (or, not shown, lower) portion of the pixel PXj1, but respective locations of the driving gate SFG, the selection gate SG, the reset gate RG, and the dummy gate DMY may be adjusted.

A source of the reset gate RG, and the driving gate SFG may be connected to the internal wiring WR via contacts CT.

Figure 13B:
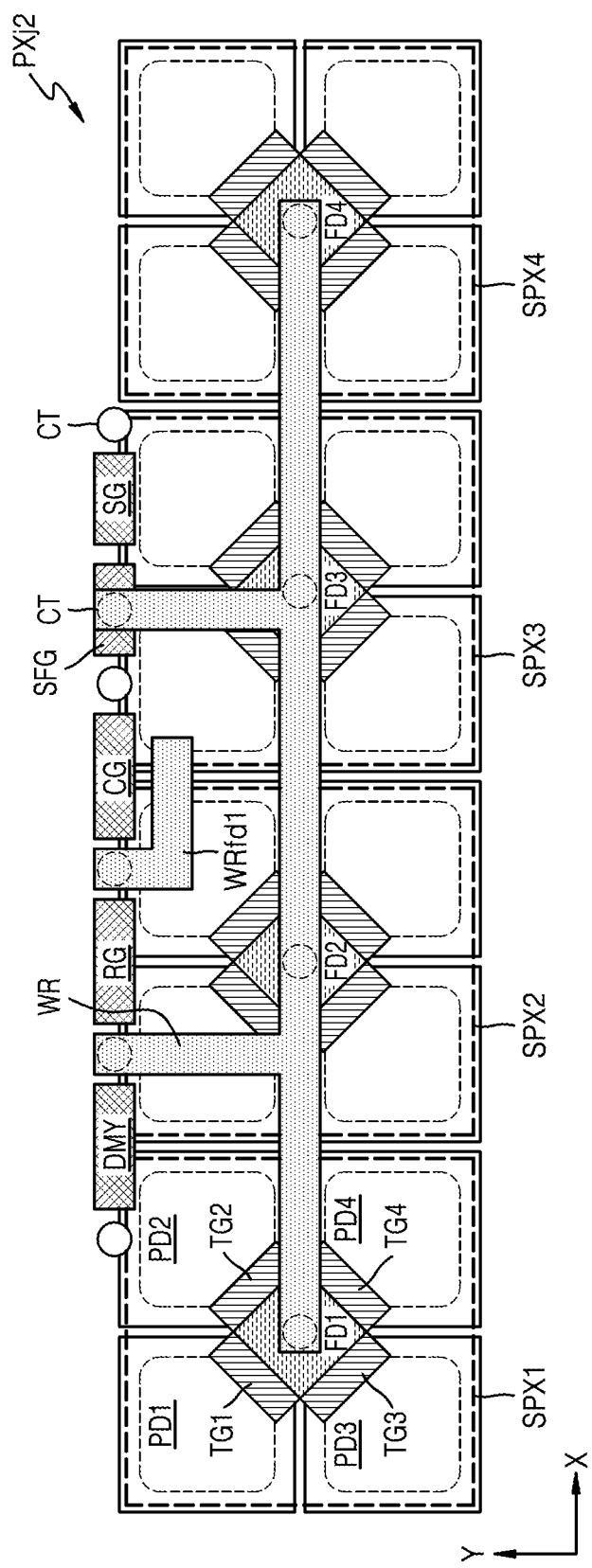

Referring to FIG. 13B, the pixel PXj2 may further the driving gate SFG, the selection gate SG, the reset gate RG, the gain control gate CG, and the dummy gate DMY.

The dummy gate DMY, the reset gate RG, the gain control gate CG, the driving gate SFG, and the selection gate SG may be arranged side by side in the first direction in an upper (or, not shown, lower) portion of the pixel PXj2. The gain control gate CG and the dummy gate DMY may be arranged on both sides of the reset gate RG, respectively.

Wiring WRfd1 may be connected to a well area between the reset gate RG and the gain control gate CG via a contact CT, and may extend in the first and second directions.

Figure 13C:
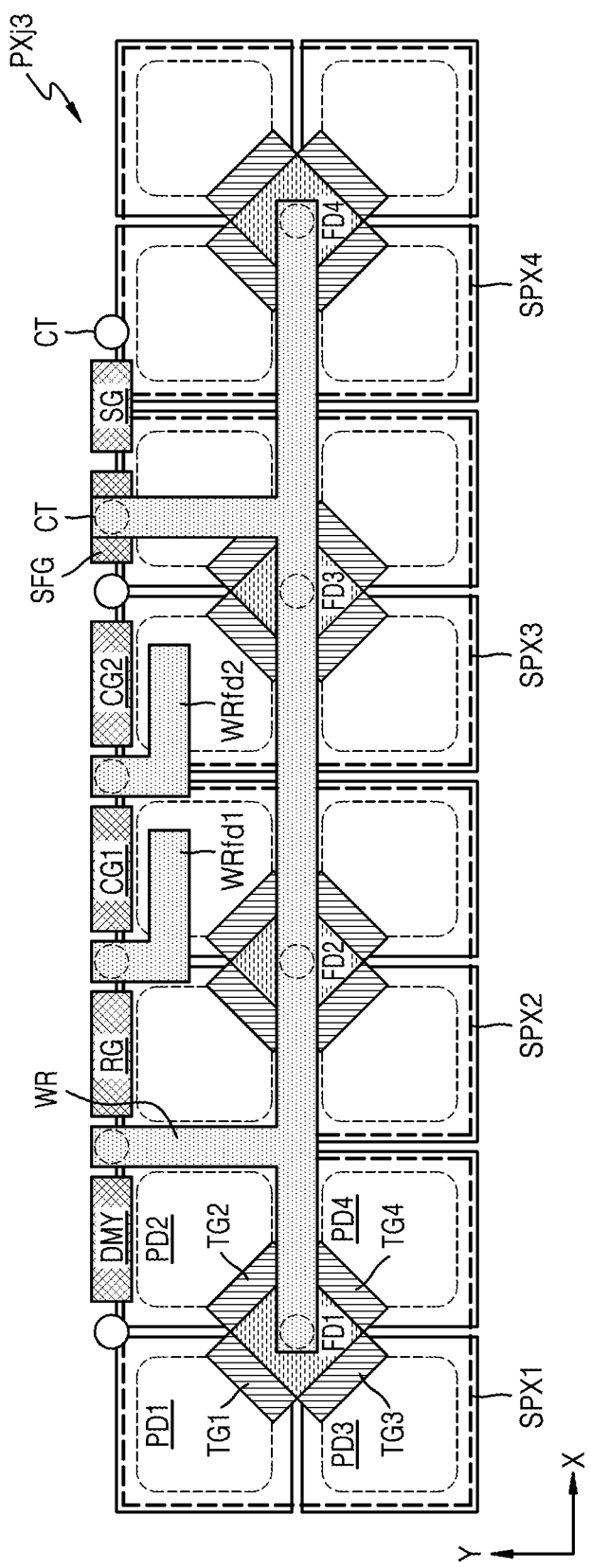

Referring to FIG. 13C, the pixel PXj3 may include the driving gate SFG, the selection gate SG, the reset gate RG, the first and second gain control gates CG1 and CG2, and the dummy gate DMY.

The dummy gate DMY, the reset gate RG, the first and second gain control gates CG1 and CG2, the driving gate SFG, and the selection gate SG may be arranged side by side in the first direction in an upper (or, not shown, lower) portion of the pixel PXj3.

Wirings WRfd1 and WRfd2 may be connected to a well area between the reset gate RG and the first gain control gate CG1 and a well area between the first gain control gate CG1 and the second gain control gate CG2, respectively, via contacts CT. Each of the wirings WRfd1 and WRfd2 may extend in the first and second directions.

Figure 13D:
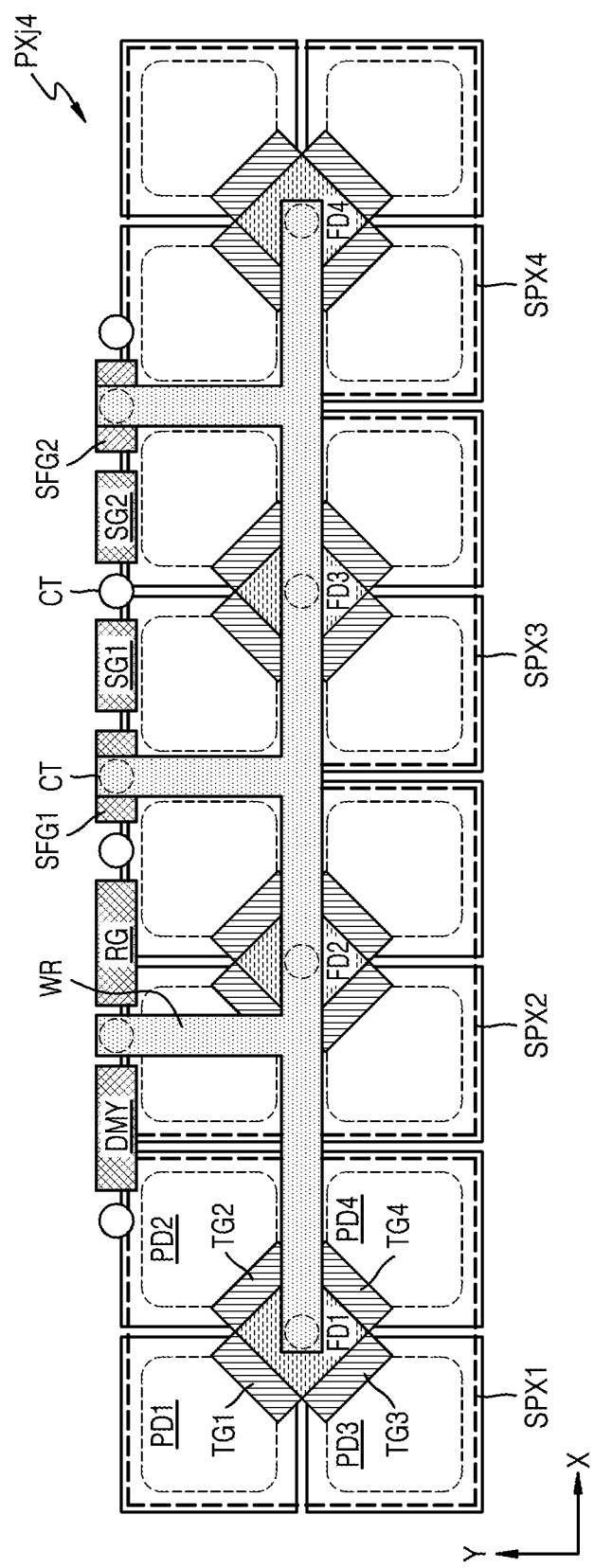

Referring to FIG. 13D, the pixel PXj4 may include the first and second driving gates SFG1 and SFG2, the first and second selection gates SG1 and SG2, the reset gate RG, and the dummy gate DMY.

The dummy gate DMY, the reset gate RG, the first driving gate SFG1, the first and second selection gates SG1 and SG2, and the second driving gate SFG2 may be arranged side by side in the first direction in an upper (or, not shown, lower) portion of the pixel PXj2. The first and second selection gates SG1 and SG2 may be arranged between the first and second driving gates SFG1 and SFG2.

The first driving gate SFG1, the second driving gate SFG2, and a source of the reset gate RG may be connected to the internal wiring WR via contacts CT.

Figure 13E:
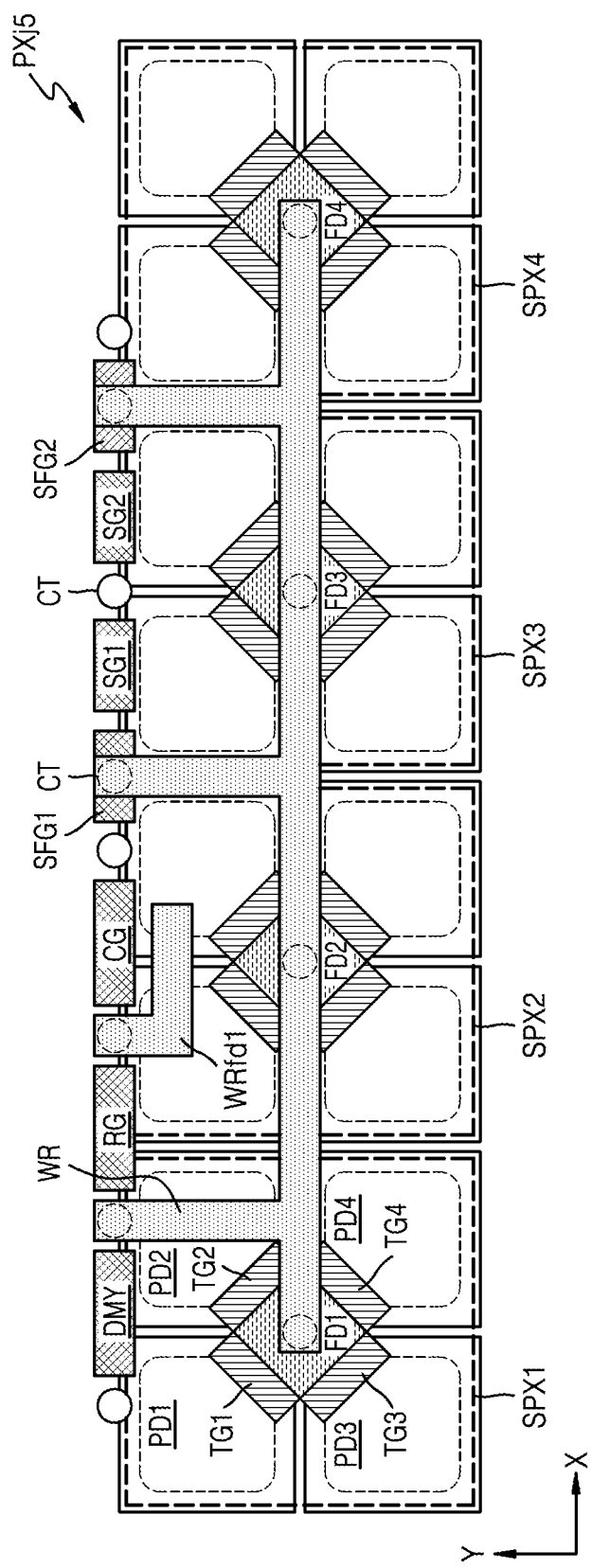

Referring to FIG. 13E, the pixel PXj5 may include the first and second driving gates SFG1 and SFG2, the first and second selection gates SG1 and SG2, the reset gate RG, the gain control gate CG, and the dummy gate DMY.

The dummy gate DMY, the reset gate RG, the gain control gate CG, the first driving gate SFG1, the first and second selection gates SG1 and SG2, and the second driving gate SFG2 may be arranged side by side in the first direction in an upper (or, not shown, lower) portion of the pixel PXj5.

Figure 13F:
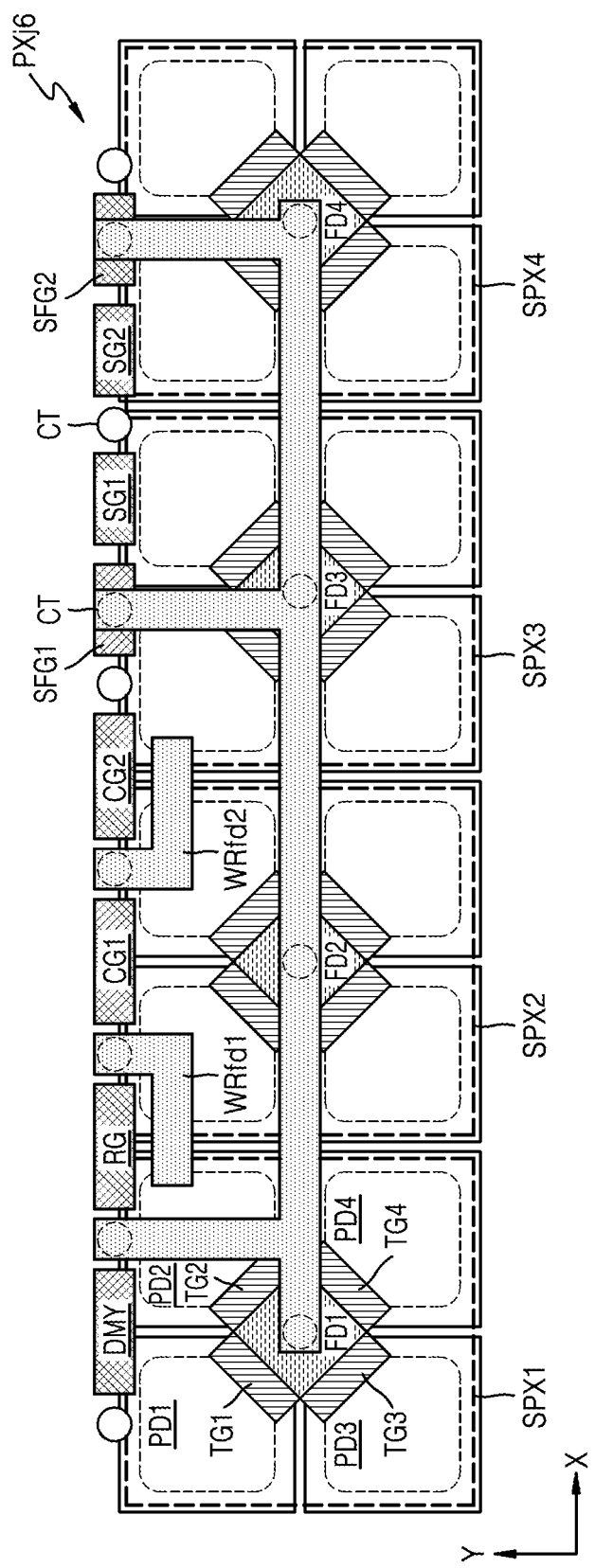

Referring to FIG. 13F, the pixel PXj6 may include the first and second driving gates SFG1 and SFG2, the first and second selection gates SG1 and SG2, the reset gate RG, the first and second gain control gates CG1 and CG2, and the dummy gate DMY.

The dummy gate DMY, the reset gate RG, the first and second control gates CG1 and CG2, the first driving gate SFG1, the first and second selection gates SG1 and SG2, and the second driving gate SFG2 may be arranged side by side in the first direction in an upper (or, not shown, lower) portion of the pixel PXj6.

FIGS. 14A, 14B, 14C, 14D, 14E, and 14F are plan views of pixels PXk1, PXk2, PXk3, PXk4, PXk5, and PXk6 according to an example embodiment.

Referring to FIGS. 14A through 14F, the pixels PXk1, PXk2, PXk3, PXk4, PXk5, and PXk6 may include the first through fourth subpixels SPX1 through SPX4.

The first through fourth subpixels SPX1 through SPX4 may be arranged side by side in the second direction, e.g., the Y-axis direction. The second direction may be a column direction of the pixel array 110 of FIG. 1.

Each of the first through fourth subpixels SPX1 through SPX4 may include first through fourth photoelectric conversion devices PD1 through PD4, first through fourth transmission gates TG1 through TG4, and a floating diffusion region FD.

The first through fourth floating diffusion regions FD1 through FD4 may be arranged at respective centers of the first through fourth subpixels SPX1 through SPX4, respectively. The internal wiring WR may be connected to the first through fourth floating diffusion regions FD1 through FD4 via contacts CT.

Figure 14A:
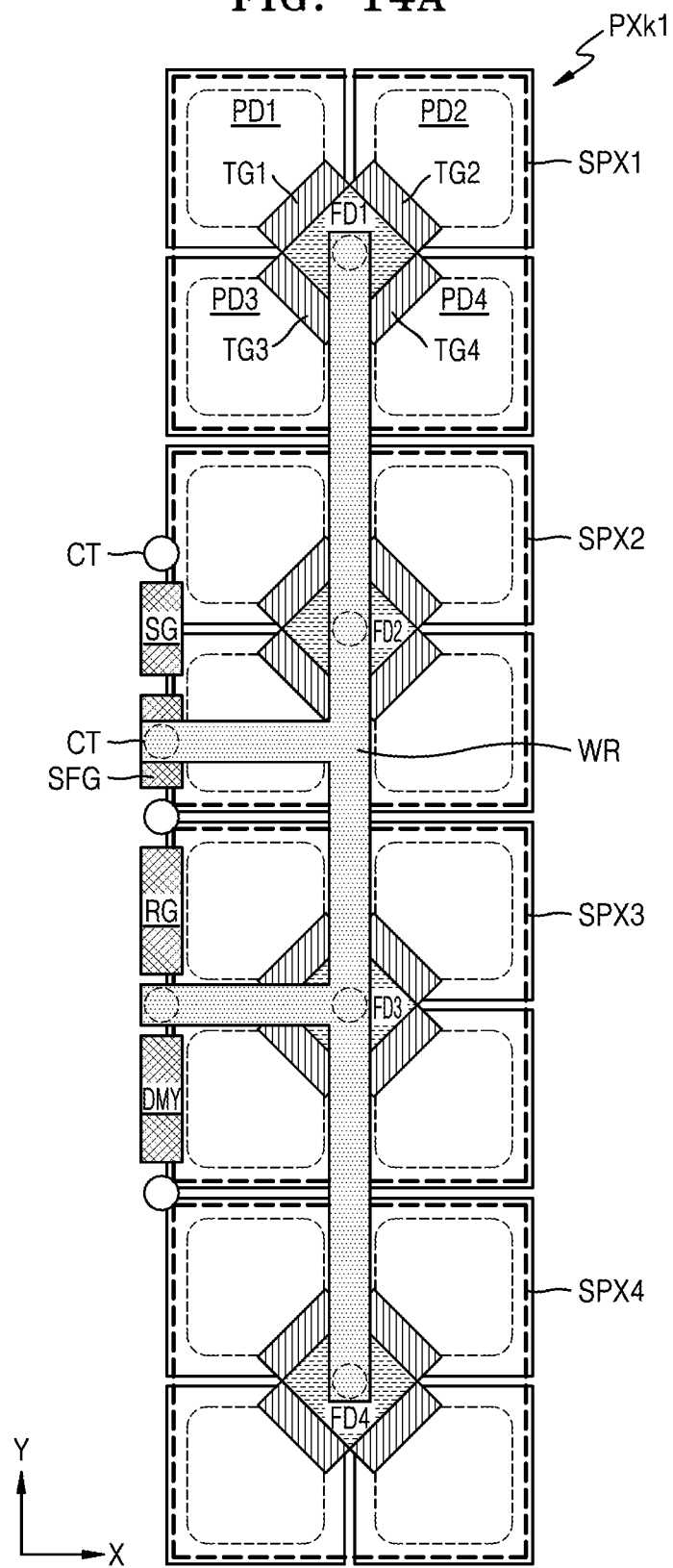
FIGS. 14A, 14B, 14C, 14D, 14E, and 14F are plan views of pixels according to an example embodiment.

Referring to FIG. 14A, the pixel PXk1 may include a driving gate SFG, a selection gate SG, a reset gate RG, and a dummy gate DMY.

The dummy gate DMY, the reset gate RG, the driving gate SFG, and the selection gate SG may be arranged side by side in the second direction in a left (or, not shown, right) portion of the pixel PXk1.

The driving gate SFG, the selection gate SG, the reset gate RG, and the dummy gate DMY may be arranged at the center of the left (or, not shown, right) portion of the pixel PXk1. However, respective locations of the driving gate SFG, the selection gate SG, the reset gate RG, and the dummy gate DMY may be adjusted.

A source of the reset gate RG, and the driving gate SFG may be connected to the internal wiring WR via contacts CT.

Figure 14B:
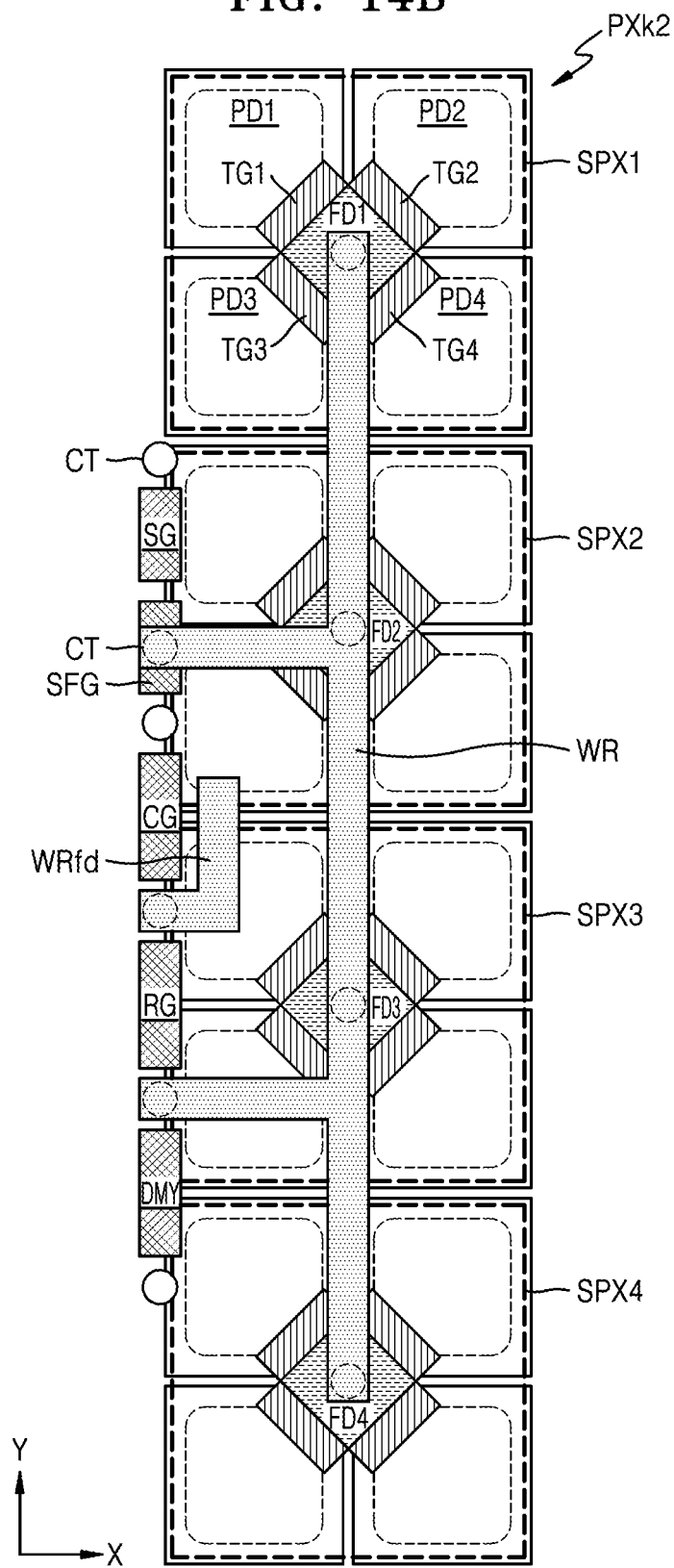

Referring to FIG. 14B, the pixel PXk2 may include the driving gate SFG, the selection gate SG, the reset gate RG, the gain control gate CG, and the dummy gate DMY.

The dummy gate DMY, the reset gate RG, the control gate CG, the driving gate SFG, and the selection gate SG may be arranged side by side in the second direction in a left (or, not shown, right) portion of the pixel PXk2.

The gain control gate CG and the dummy gate DMY may be arranged over and under the reset gate RG, respectively. Wiring WRfd1 may be connected to a well area between the reset gate RG and the gain control gate CG via a contact CT, and may extend in the first and second directions.

Figure 14C:
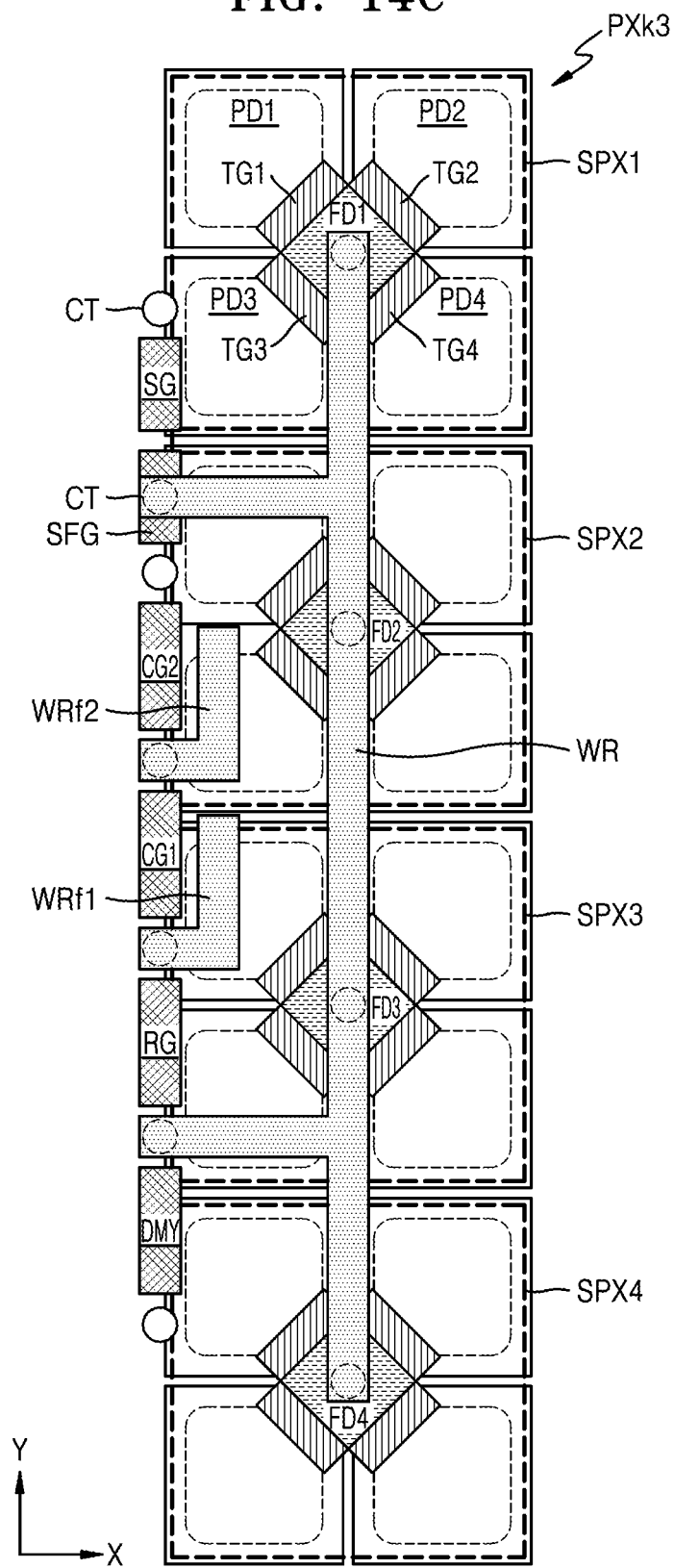

Referring to FIG. 14C, the pixel PXk3 may include the driving gate SFG, the selection gate SG, the reset gate RG, the first and second gain control gates CG1 and CG2, and the dummy gate DMY.

The dummy gate DMY, the reset gate RG, the first and second gain control gates CG1 and CG2, the driving gate SFG, and the selection gate SG may be arranged side by side in the second direction in a left (or, not shown, right) portion of the pixel PXk3.

Wirings WRfd1 and WRfd2 may be connected to a well area between the reset gate RG and the first gain control gate CG1 and a well area between the first gain control gate CG1 and the second gain control gate CG2, respectively, via contacts CT. Each of the wirings WRfd1 and WRfd2 may extend in the first and second directions.

Figure 14D:
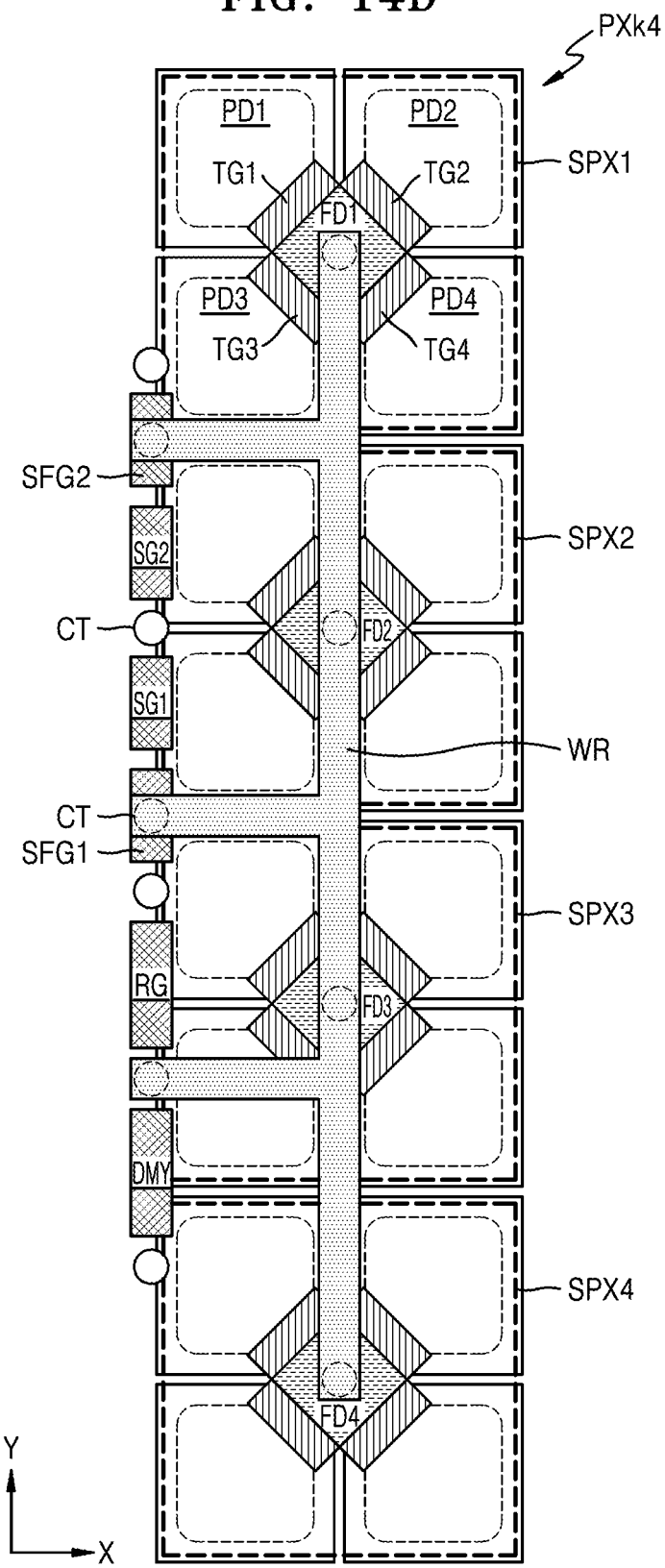

Referring to FIG. 14D, the pixel PXk4 may include the first and second driving gates SFG1 and SFG2, the first and second selection gates SG1 and SG2, the reset gate RG, and the dummy gate DMY.

The dummy gate DMY, the reset gate RG, the first driving gate SFG1, the first and second selection gates SG1 and SG2, and the second driving gate SFG2 may be arranged side by side in the second direction in a left (or, not shown, right) portion of the pixel PXk2. The first and second selection gates SG1 and SG2 may be arranged between the first and second driving gates SFG1 and SFG2.

The first driving gate SFG1, the second driving gate SFG2, and a source of the reset gate RG may be connected to the internal wiring WR via contacts CT.

Figure 14E:
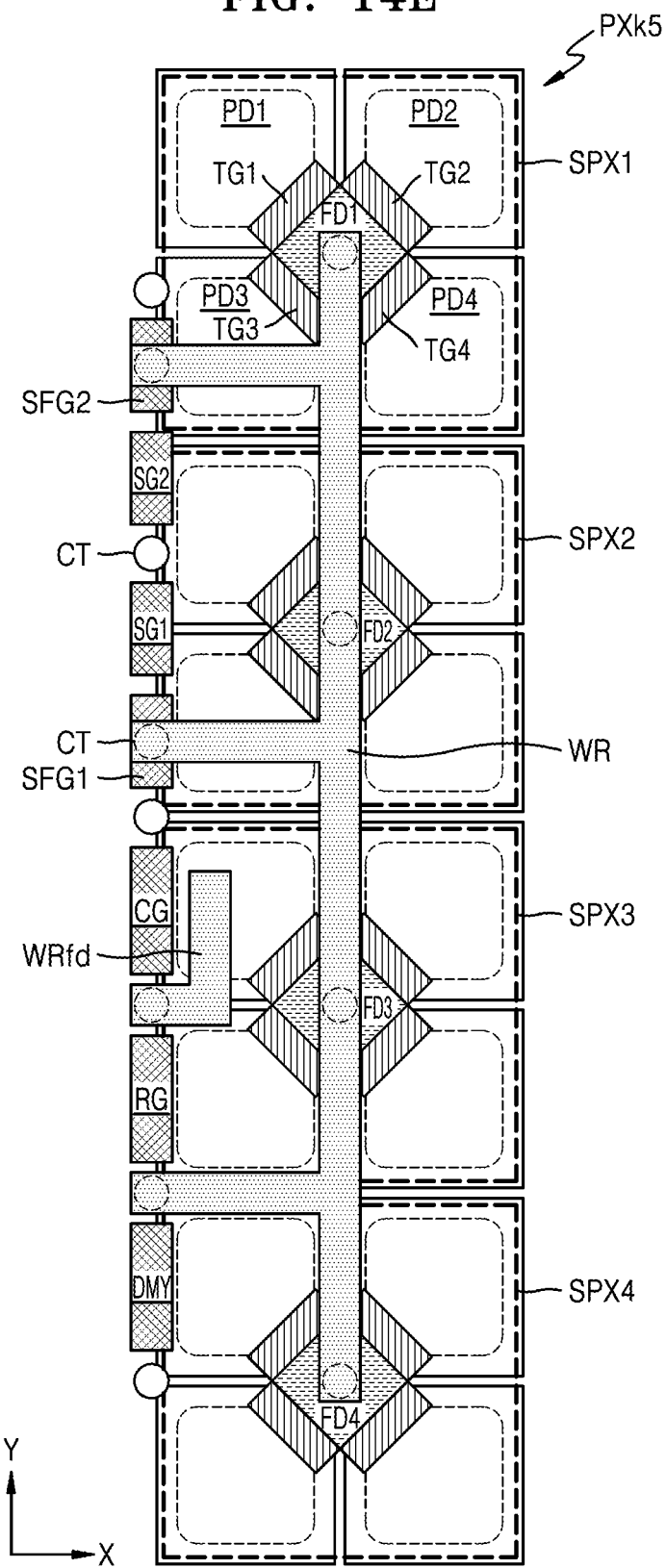

Referring to FIG. 14E, the pixel PXk5 may include the first and second driving gates SFG1 and SFG2, the first and second selection gates SG1 and SG2, the reset gate RG, the gain control gate CG, and the dummy gate DMY.

The dummy gate DMY, the reset gate RG, the control gate CG, the first driving gate SFG1, the first and second selection gates SG1 and SG2, and the second driving gate SFG2 may be arranged side by side in the second direction in a left (or, not shown, right) portion of the pixel PXk5.

Figure 14F:
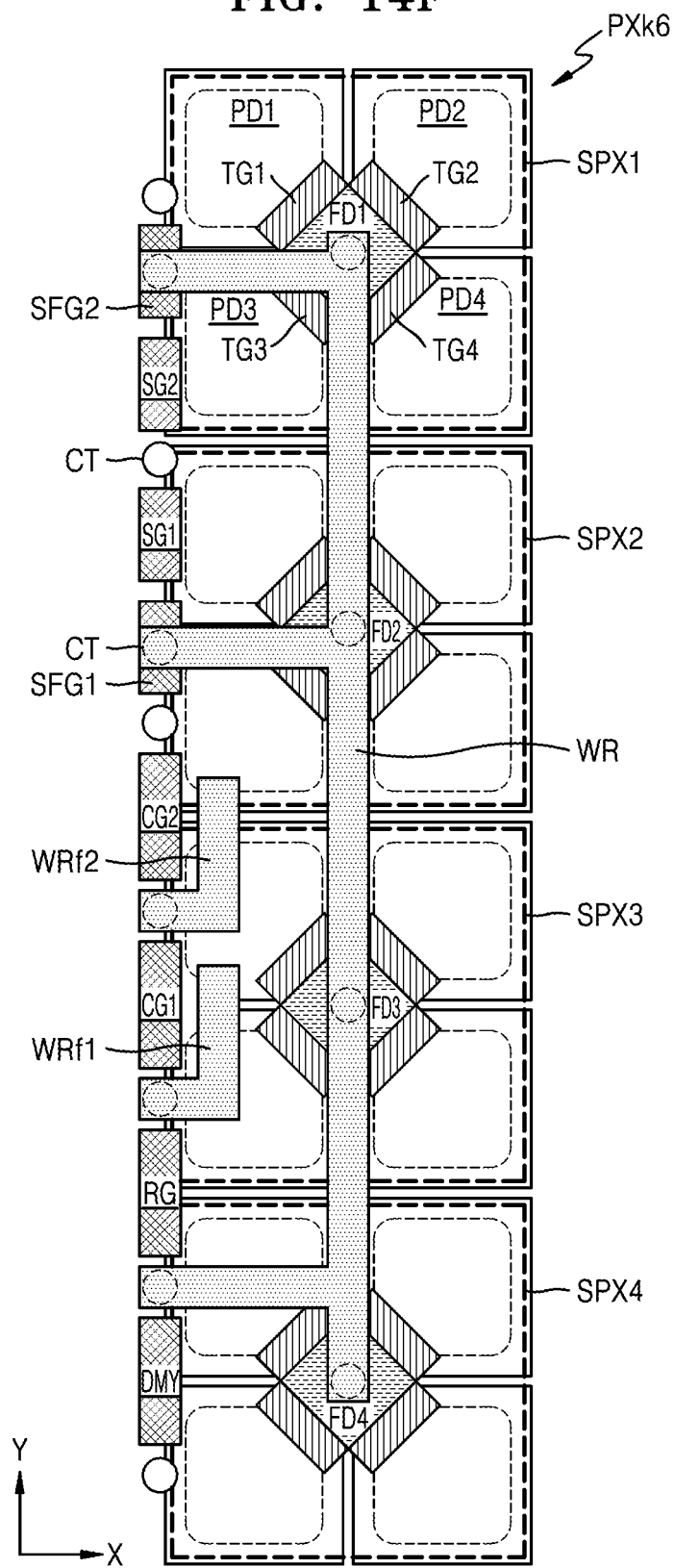

Referring to FIG. 14F, the pixel PXk6 may include the first and second driving gates SFG1 and SFG2, the first and second selection gates SG1 and SG2, the reset gate RG, the first and second gain control gates CG1 and CG2, and the dummy gate DMY.

The dummy gate DMY, the reset gate RG, the first and second gain control gates CG1 and CG2, the first driving gate SFG1, the first and second selection gates SG1 and SG2, and the second driving gate SFG2 may be arranged side by side in the second direction in a left (or, not shown, right) portion of the pixel PXk6.

Figure 15A:
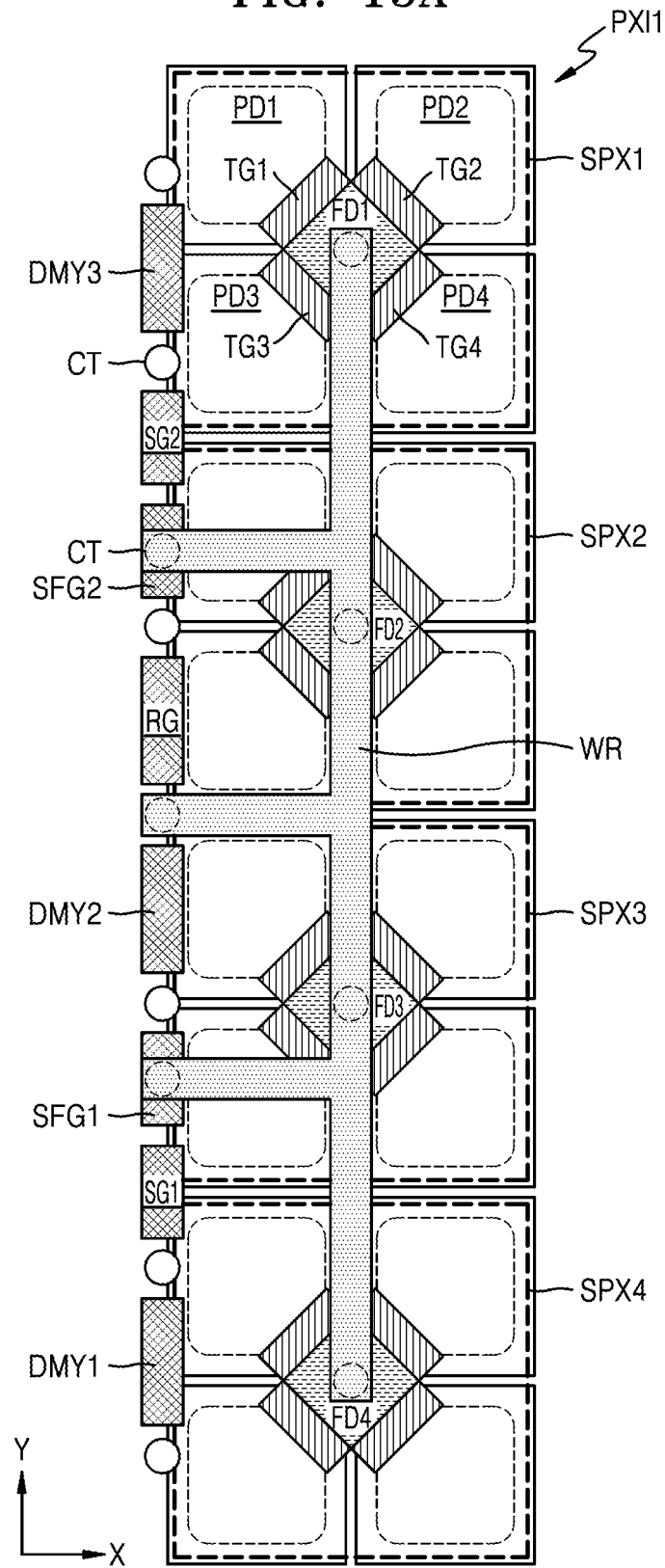
FIGS. 15A, 15B, and 15C are plan views of pixels according to an example embodiment.
Figure 15B:
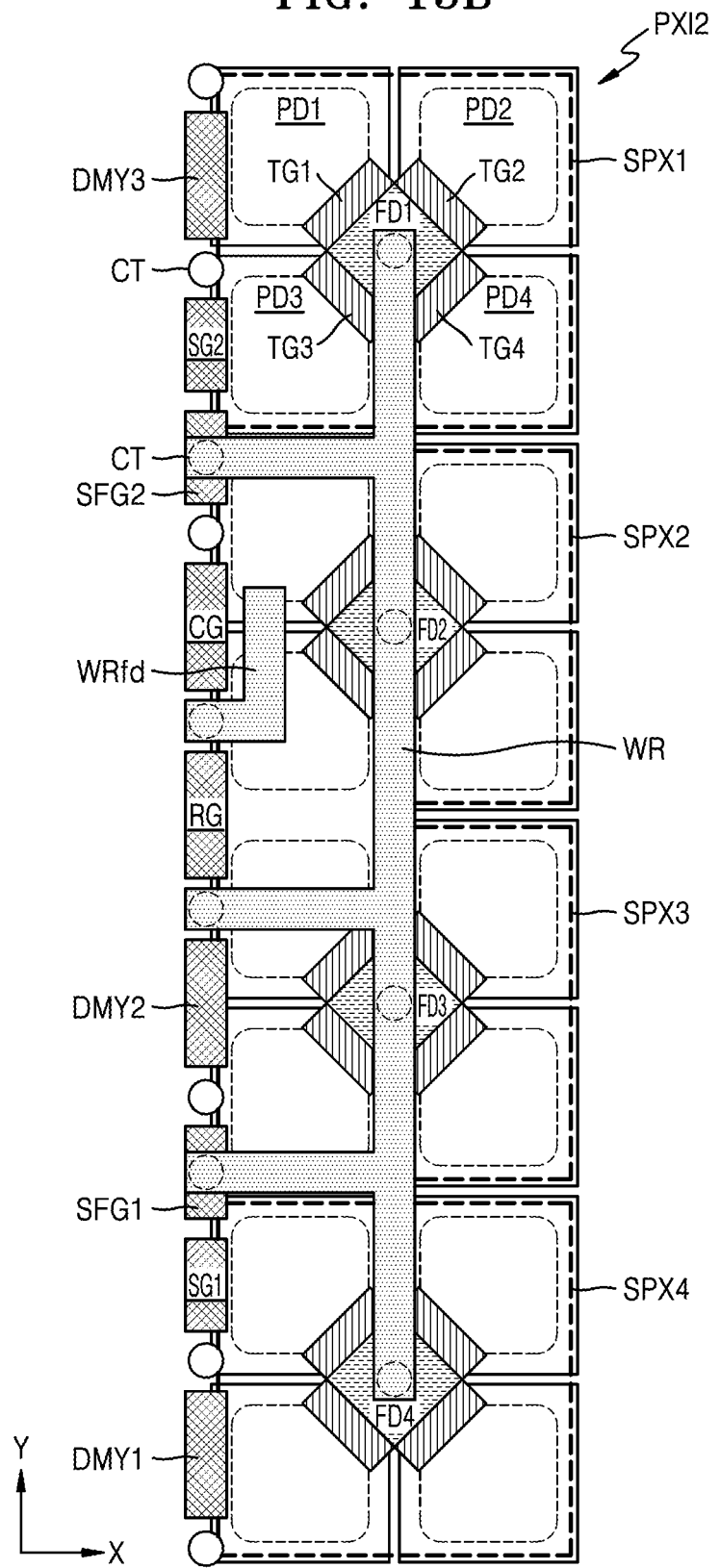
Figure 15C:
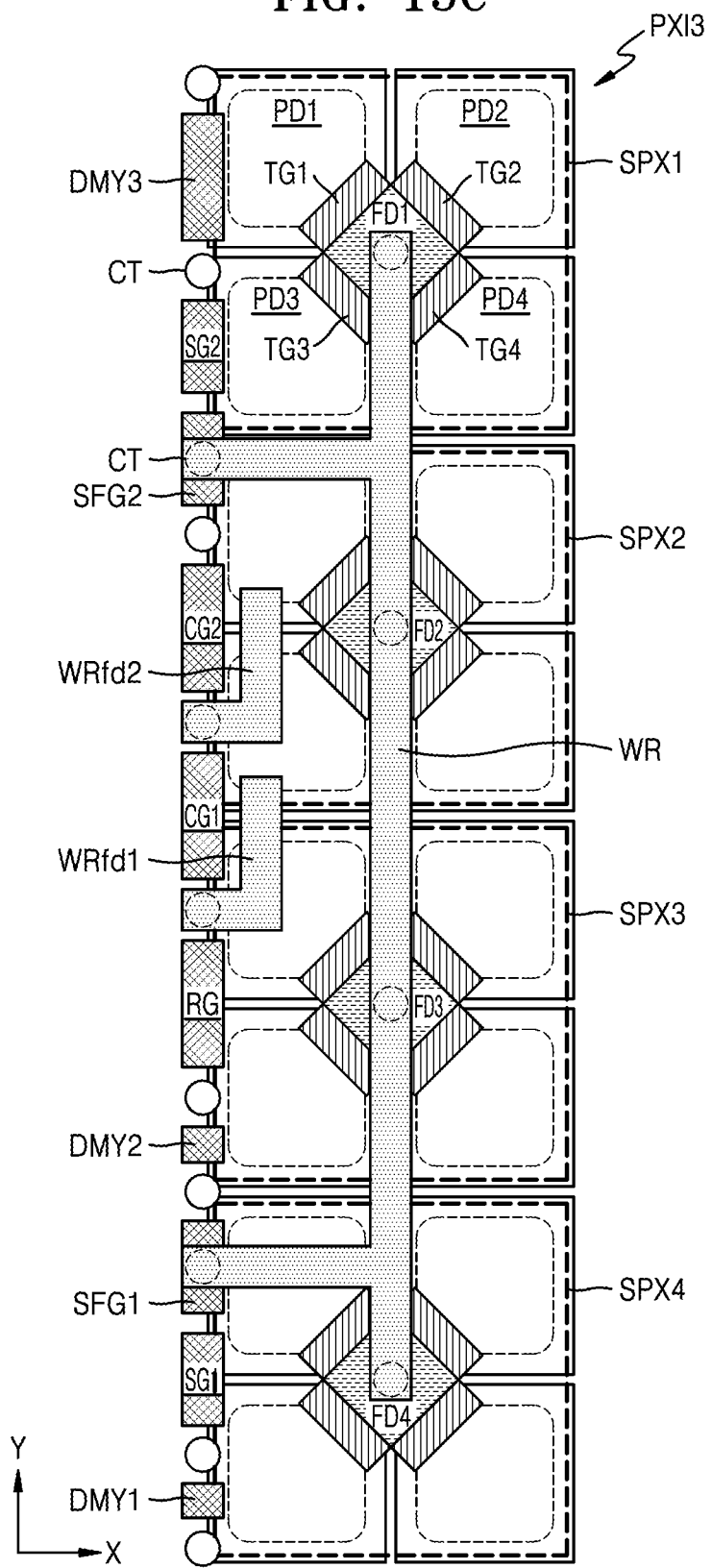

FIGS. 15A, 15B, and 15C are plan views of pixels PX11, PX12, and PX13 according to an example embodiment.

Referring to FIGS. 15A through 15C, the pixels PX11, PX12, and PX13 may include the first through fourth subpixels SPX1 through SPX4.

The first through fourth subpixels SPX1 through SPX4 may be arranged side by side in the second direction, e.g., the Y-axis direction. The second direction may be a column direction of the pixel array 110 of FIG. 1.

Each of the first through fourth subpixels SPX1 through SPX4 may include first through fourth photoelectric conversion devices PD1 through PD4, first through fourth transmission gates TG1 through TG4, and a floating diffusion region FD.

The first through fourth floating diffusion regions FD1 through FD4 may be arranged at respective centers of the first through fourth subpixels SPX1 through SPX4, respectively. The internal wiring WR may be connected to the first through fourth floating diffusion regions FD1 through FD4 via contacts CT.

Referring to FIG. 15A, the pixel PX11 may include the first and second driving gates SFG1 and SFG2, the first and second selection gates SG1 and SG2, the reset gate RG, and first through third dummy gates DMY1 through DMY3.

The first dummy gate DMY1, the first selection gate SG1, the first driving gate SFG1, the second dummy gate DMY2, the reset gate RG, the second driving gate SFG2, the second selection gate SG2, and the third dummy gate DMY3 may be arranged side by side in the second direction in a left (or, not shown, right) portion of the pixel PX11.

The first driving gate SFG1 and the first selection gate SG1 may be arranged between the first dummy gate DMY1 and the second dummy gate DMY2. The reset gate RG, the second driving gate SFG2, and the second selection gate SG2 may be sequentially arranged between the second dummy gate DMY2 and third dummy gate DMY3.

The first driving gate SFG1, the second driving gate SFG2, and a source of the reset gate RG may be connected to the internal wiring WR via contacts CT.

Referring to FIG. 15B, compared with the pixel PX11 of FIG. 15A, the pixel PX12 may further include the gain control gate CG.

The gain control gate CG may be arranged between the reset gate RG and the second driving gate SFG2. Wiring WRfd1 may be connected to a well area between the reset gate RG and the gain control gate CG via a contact CT, and may extend in the first and second directions.

Referring to FIG. 15C, compared with the pixel PX11 of FIG. 15A, the pixel PX13 may further include the first and second gain control gates CG1 and CG2.

The first and second gain control gates CG1 and CG2 may be arranged between the reset gate RG and the second driving gate SFG2. Wirings WRfd1 and WRfd2 may be connected to a well area between the reset gate RG and the first gain control gate CG1 and a well area between the first gain control gate CG1 and the second gain control gate CG2, respectively, via contacts CT. Each of the wirings WRfd1 and WRfd2 may extend in the first and second directions.

FIGS. 16A, 16B, 16C, and 16D illustrate microlenses ML arranged in a pixel PX according to an example embodiment.

Pixels according to the above-described various embodiments are applicable to the pixel PX according to the present embodiment.

The pixel PX may include the first through fourth subpixels SPX1 through SPX4. Each of the first through fourth subpixels SPX1 through SPX4 may include a plurality of photoelectric conversion devices PD and a floating diffusion region FD. The plurality of photoelectric conversion devices PD included in the first through fourth subpixels SPX1 through SPX4 may be connected to one another via internal wiring.

Figure 16A:
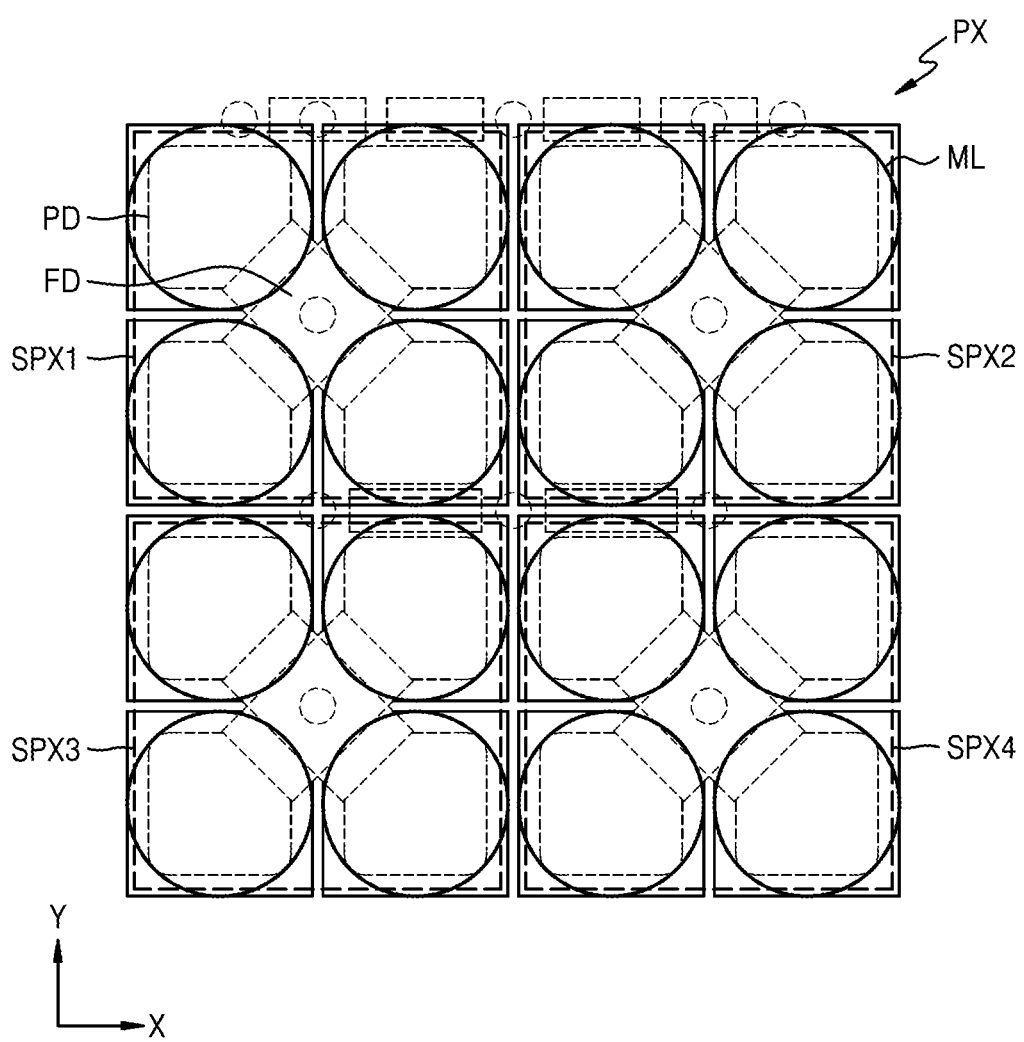
FIGS. 16A, 16B, 16C, and 16D illustrate microlenses arranged in a pixel according to an example embodiment.

Referring to FIG. 16A, a microlens ML may be arranged over each photoelectric conversion device PD. A plurality of microlenses ML may be respectively arranged for each of the plurality of photoelectric conversion devices PD included in the pixel PX. The pixel PX may output a pixel signal based on electric charges respectively generated by the plurality of photoelectric conversion devices PD, or may output a pixel signal based on electric charges respectively generated by some or all of the plurality of photoelectric conversion devices PD.

Figure 16B:
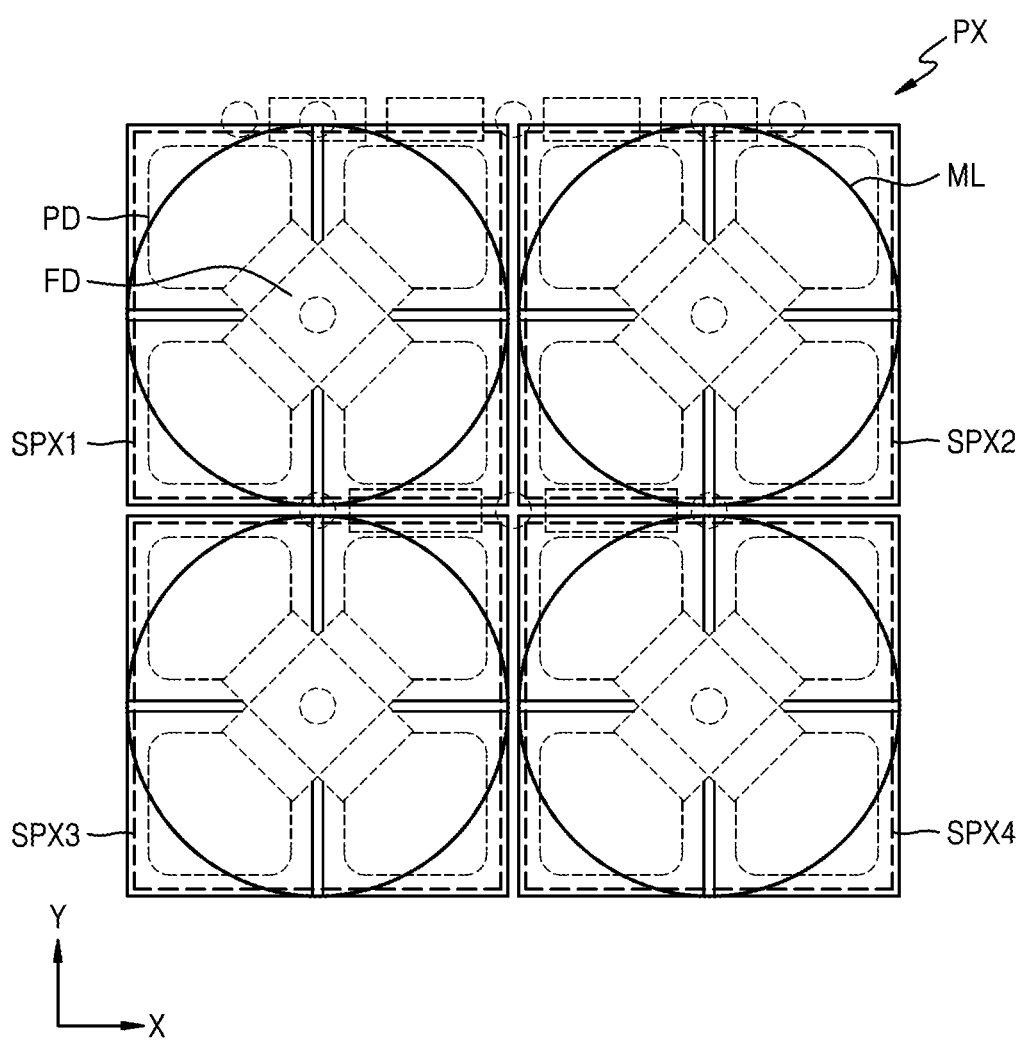

Referring to FIG. 16B, a microlens ML may be arranged over group of four photoelectric conversion devices PD included in each of the first through fourth subpixels SPX1 through SPX4. Thus, a single microlens ML may be arranged in each of the first through fourth pixels SPX1 through SPX4. The pixel PX may output a pixel signal based on electric charges respectively generated by the first through fourth pixels SPX1 through SPX4, or may output a pixel signal based on electric charges respectively generated by some or all of the first through fourth pixels SPX1 through SPX4.

Figure 16C:
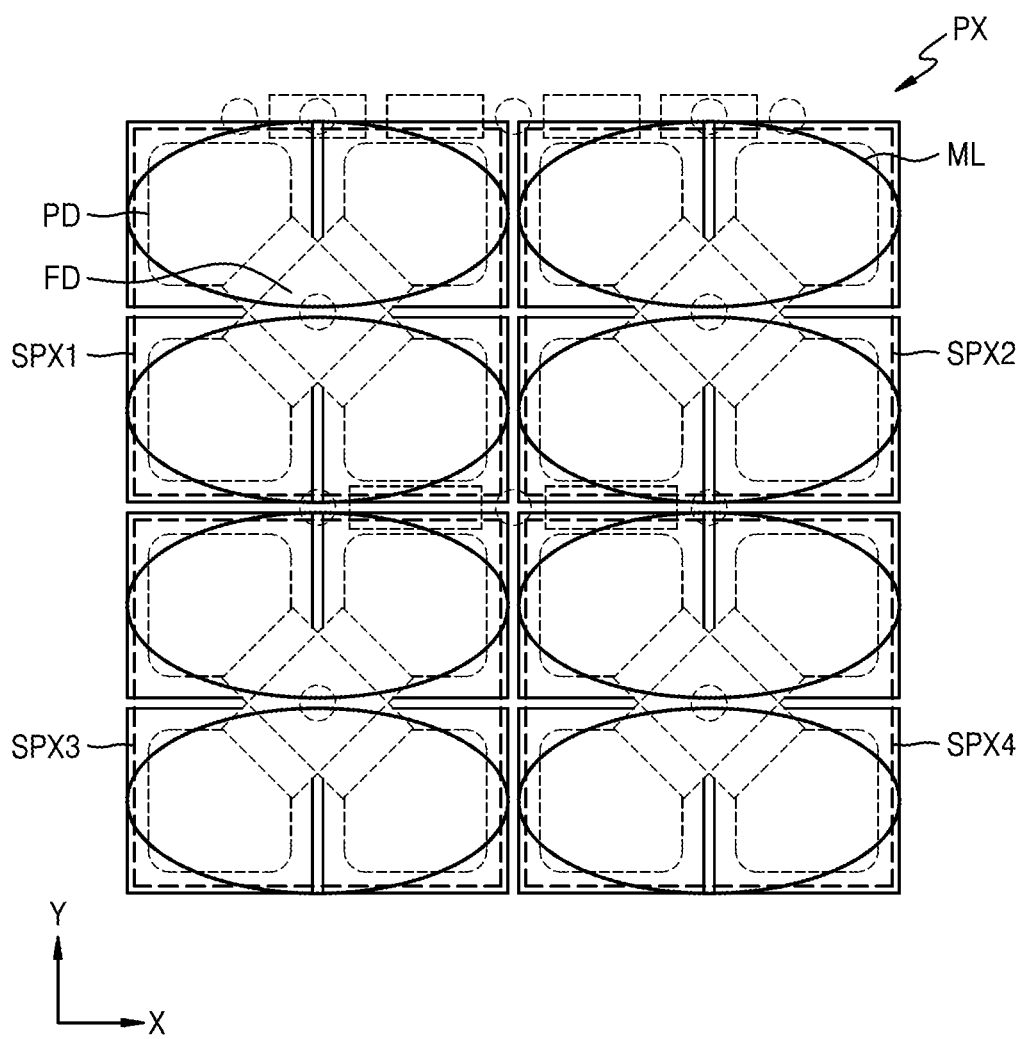
Figure 16D:
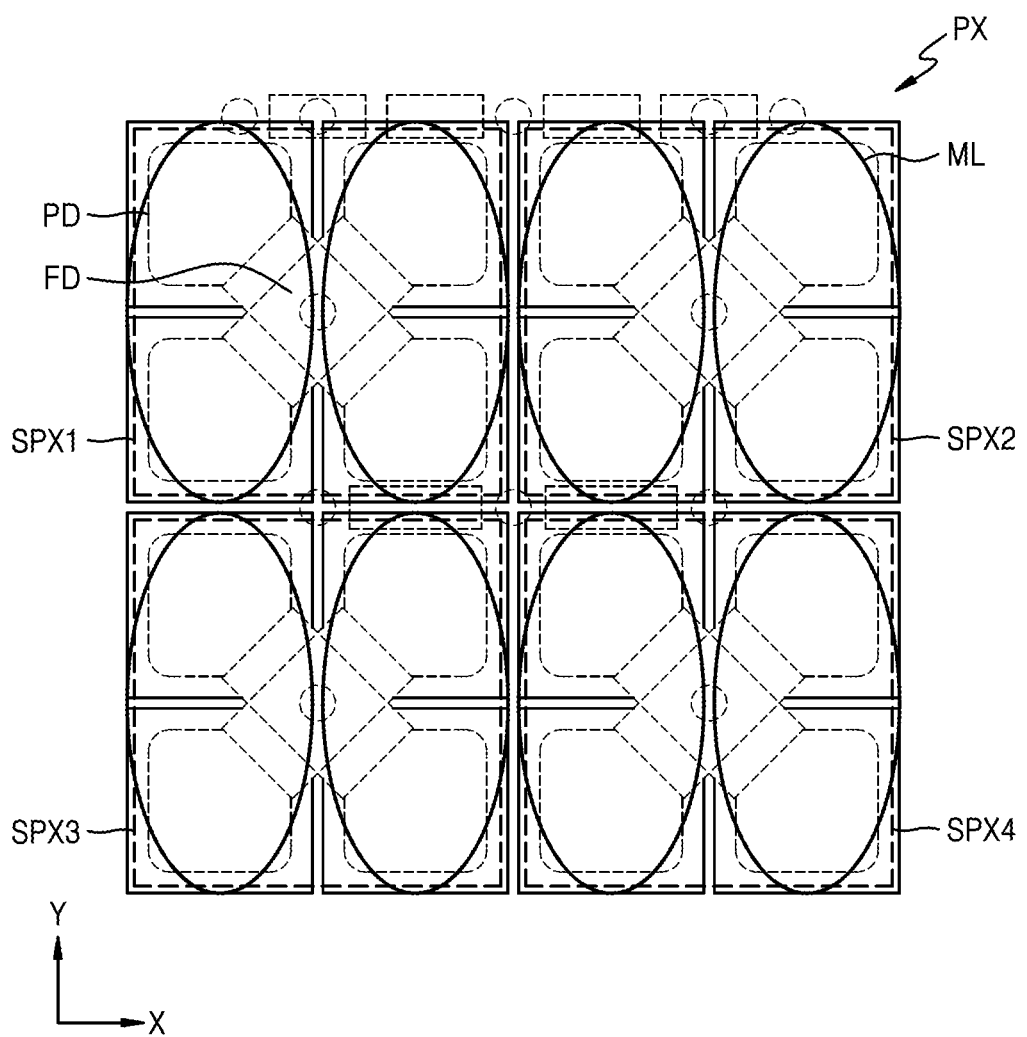

Referring to FIGS. 16C and 16D, a single microlens ML may be arranged for every two adjacent photoelectric conversion devices from among the plurality of photoelectric conversion devices PD. As shown in FIG. 16C, a single microlens ML may be arranged on two photoelectric conversion devices adjacent to each other in the first direction. As shown in FIG. 16D, a single microlens ML may be arranged on two photoelectric conversion devices adjacent to each other in the second direction.

In another implementation (not shown in FIGS. 16C and 16D), a microlens ML may be arranged on two photoelectric conversion devices adjacent to each other in the first direction within some of the first through fourth subpixels SPX1 through SPX4, and a microlens ML may be arranged on two photoelectric conversion devices adjacent to each other in the second direction within the others of the first through fourth subpixels SPX1 through SPX4.

FIGS. 17A, 17B, 17C, 17D, 17E, and 17F illustrate color filters arranged in the pixel array 110 according to an example embodiment.

Pixels according to the above-described various embodiments are applicable to a pixel PX according to the present embodiment.

The pixel PX may include the first through fourth subpixels SPX1 through SPX4. Each of the first through fourth subpixels SPX1 through SPX4 may include a plurality of photoelectric conversion devices PD and a floating diffusion region FD. The plurality of photoelectric conversion devices PD included in the first through fourth subpixels SPX1 through SPX4 may be connected to one another via internal wiring.

Figure 17A:
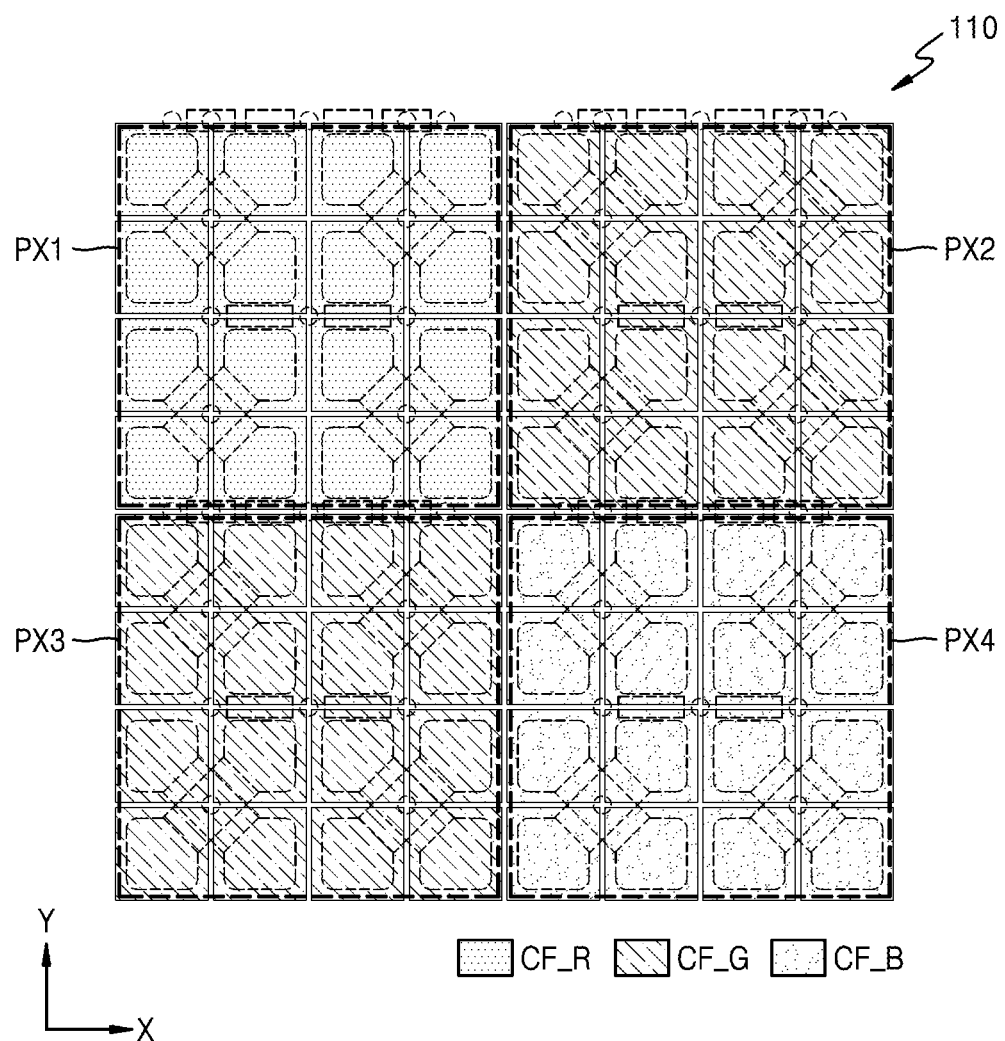
FIGS. 17A, 17B, 17C, 17D, 17E, and 17F illustrate color filters arranged in a pixel array according to an example embodiment.

Referring to FIG. 17A, the first through fourth pixels PX1 through PX4 may be arranged in a 2×2 matrix.

Color filters may be arranged per-pixel. A red color filter CF_R may be arranged on the first pixel PX1. Green color filters CF_G may be arranged on the second and third pixels PX2 and PX3. A blue color filter CF_B may be arranged on the fourth pixel PX4.

The above combination of the one red color filter CF_R, the two green color filters CF_G, and the one blue color filter CF_B may be referred to as a Bayer pattern.

In the pixel array 110, every four pixels arranged in the 2×2 matrix may have a Bayer pattern.

In other implementations (not shown in FIG. 17A), a color combination of the color filters arranged on the first through fourth pixels PX1 through PX4 may be changed. For example, a white color filter may be arranged on one of the second and third pixels PX2 and PX3. As another example, a white color filter may be arranged on the second and third pixels PX2 and PX3. As another example, a yellow color filter may be arranged on the second and third pixels PX2 and PX3.

Figure 17B:
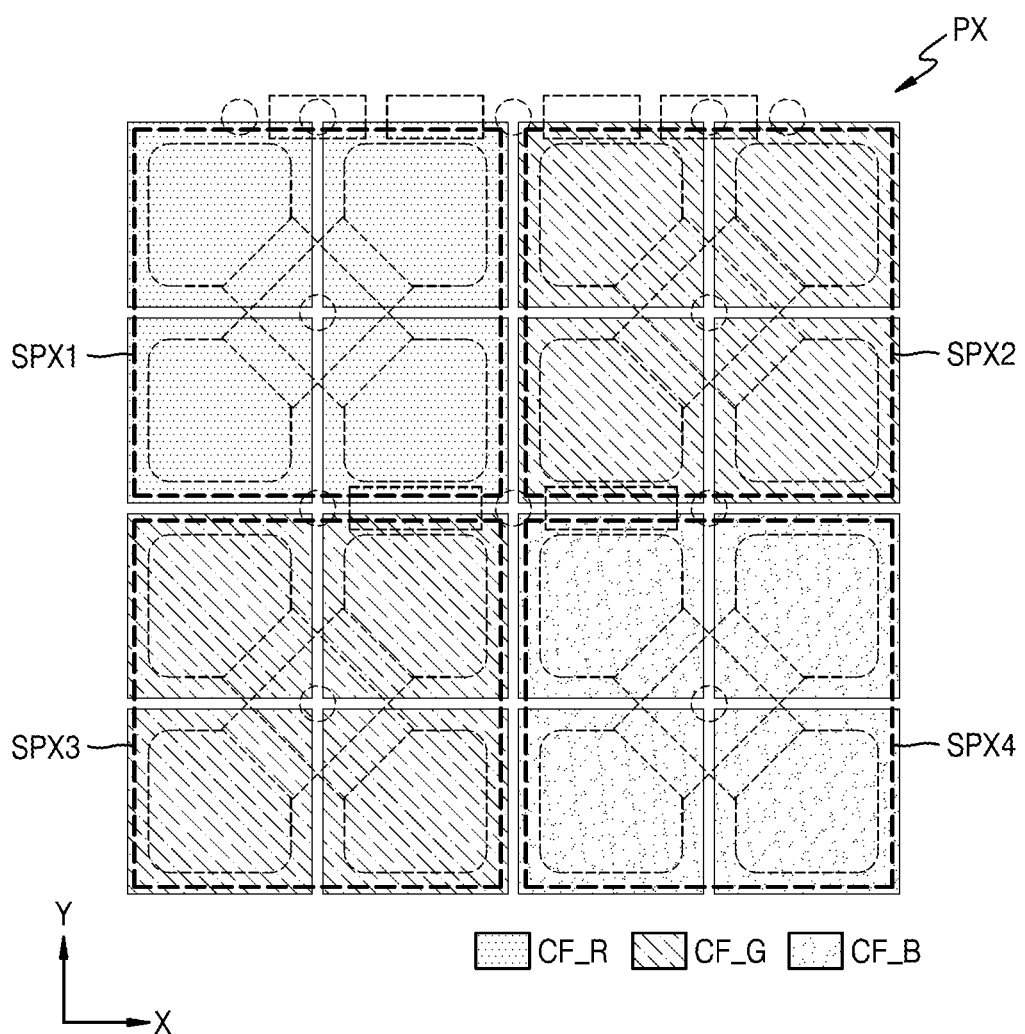

Referring to FIG. 17B, the first through fourth subpixels SPX1 through SPX4 may be arranged in a 2×2 matrix.

As compared to FIG. 17A, in FIG. 17 the color filters may be arranged per-sub-pixel. A red color filter CF_R may be arranged on the first subpixel SPX1. Green color filters CF_G may be arranged on the second and third subpixels SPX2 and SPX3. A blue color filter CF_B may be arranged on the fourth subpixel SPX4. Each of a plurality of pixels PX arranged in the pixel array 110 may have a Bayer pattern.

Figure 17C:
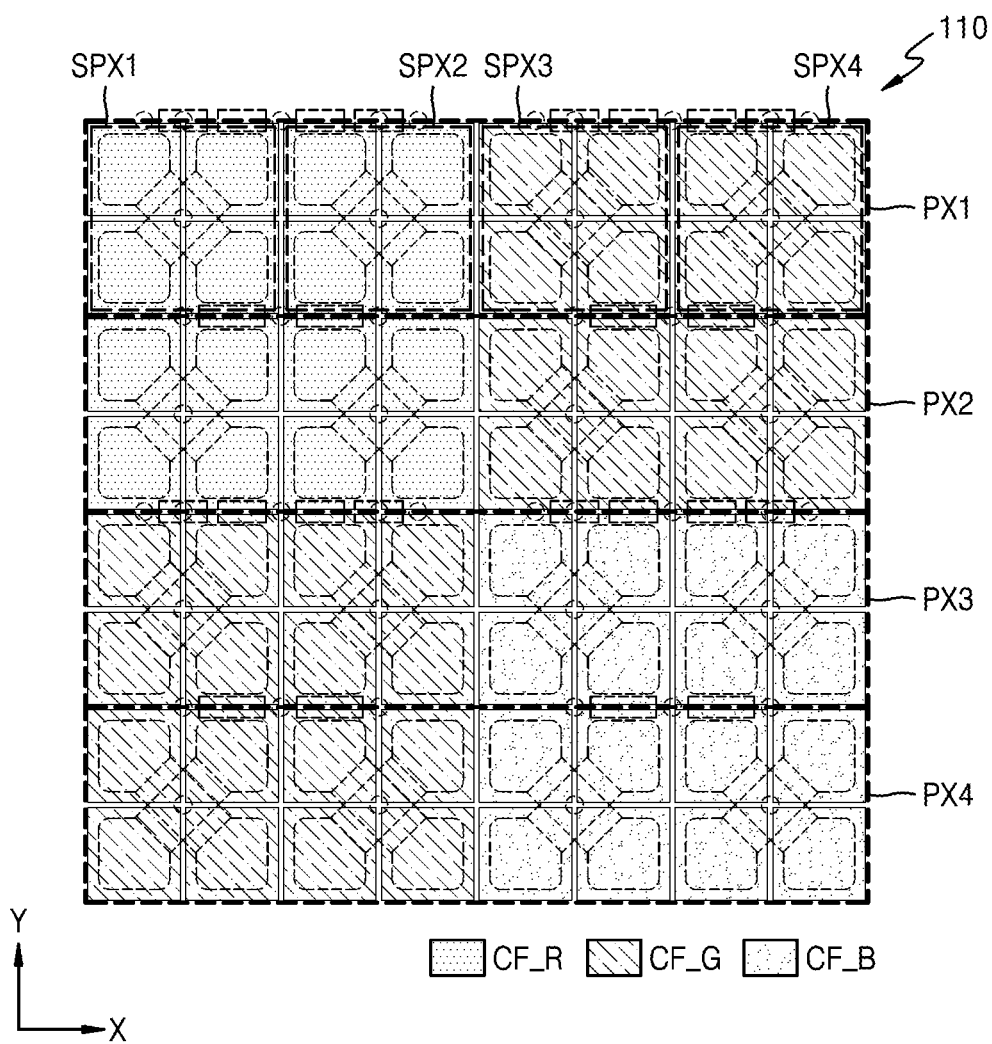

Referring to FIG. 17C, the first through fourth pixels PX1 through PX4 may be arranged in the second direction. Each of the first through fourth pixels PX1 through PX4 may include the first through fourth subpixels SPX1 through SPX4 arranged side by side in the first direction.

A red color filter CF_R may be arranged in the first and second subpixels SPX1 and SPX2 of the first and second pixels PX1 and PX2. Green color filters CF_G may be arranged in the third and fourth subpixels SPX3 and SPX4 of the first and second pixels PX1 and PX2 and the first and second subpixels SPX1 and SPX2 of the third and fourth pixels PX3 and PX4, respectively. A blue color filter CF_B may be arranged in the third and fourth subpixels SPX3 and SPX4 of the third and fourth pixels PX3 and PX4. As such, in the pixel array 110, every sixteen pixels arranged in an 8×8 matrix may have a Bayer pattern.

Figure 17D:
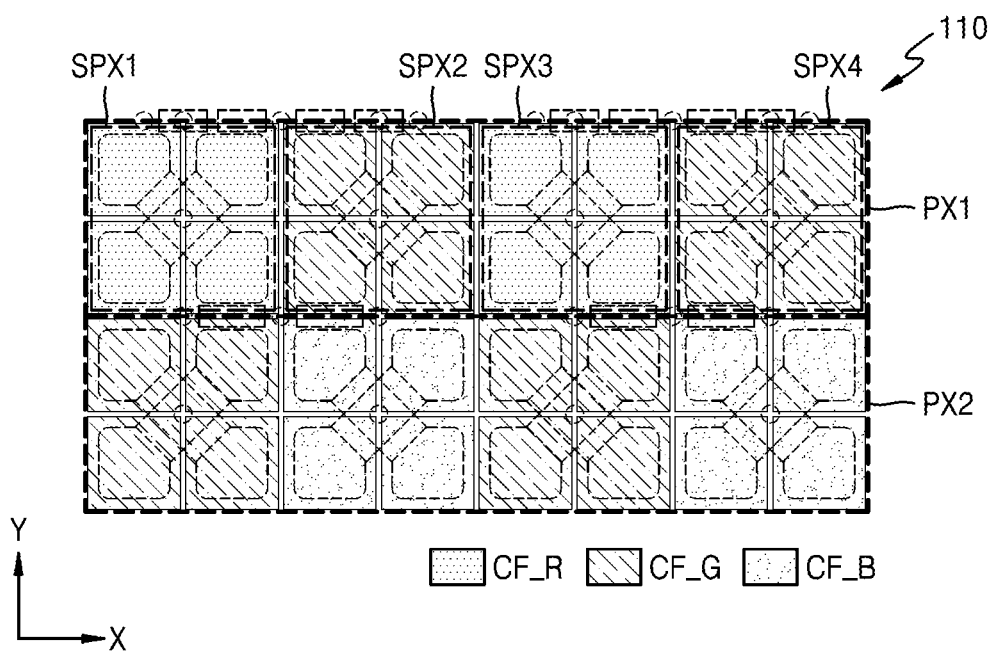

Referring to FIG. 17D, the first and second pixels PX1 and PX2 may be arranged in the second direction, and each of the first and second pixels PX1 and PX2 may include the first through fourth subpixels SPX1 through SPX4 arranged side by side in the first direction.

Red color filters CF_R may be arranged in the first and third subpixels SPX1 and SPX3 of the first pixel PX1, respectively. Green color filters CF_G may be arranged in the second and fourth subpixels SPX2 and SPX4 of the first pixel PX1, respectively. Green color filters CF_G may be arranged in the first and third subpixels SPX1 and SPX3 of the second pixel PX2, respectively. Blue color filters CF_B may be arranged in the second and fourth subpixels SPX2 and SPX4 of the second pixel PX2, respectively. As such, every four subpixels arranged in the 2×2 matrix may have a Bayer pattern.

Figure 17E:
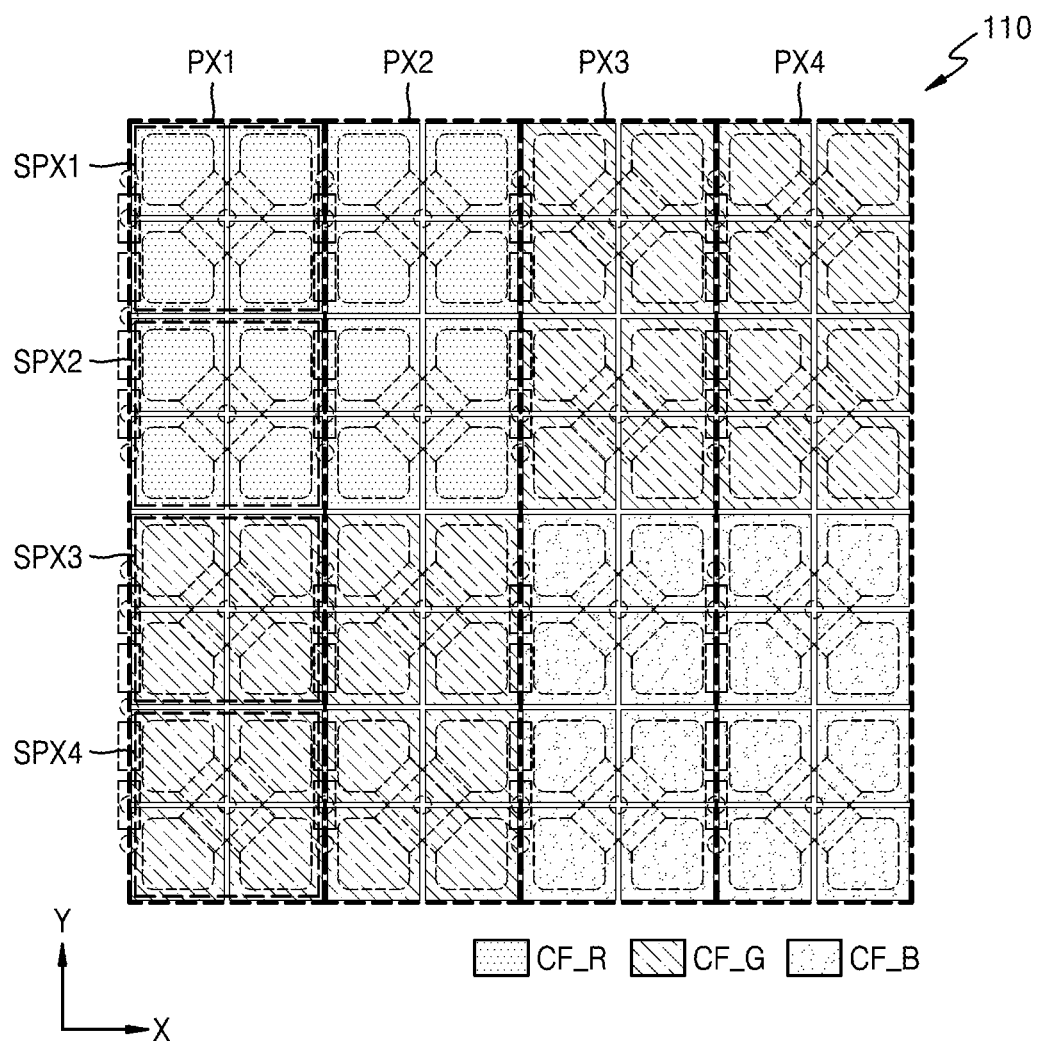

Referring to FIG. 17E, the first through fourth pixels PX1 through PX4 may be arranged in the first direction, and each of the first through fourth pixels PX1 through PX4 may include the first through fourth subpixels SPX1 through SPX4 arranged side by side in the second direction.

A red color filter CF_R may be arranged in the first and second subpixels SPX1 and SPX2 of the first and second pixels PX1 and PX2. Green color filters CF_G may be arranged in the third and fourth subpixels SPX3 and SPX4 of the first and second pixels PX1 and PX2 and the first and second subpixels SPX1 and SPX2 of the third and fourth pixels PX3 and PX4, respectively. A blue color filter CF_B may be arranged in the third and fourth subpixels SPX3 and SPX4 of the third and fourth pixels PX3 and PX4. As such, in the pixel array 110, every sixteen pixels arranged in an 8×8 matrix may have a Bayer pattern.

Figure 17F:
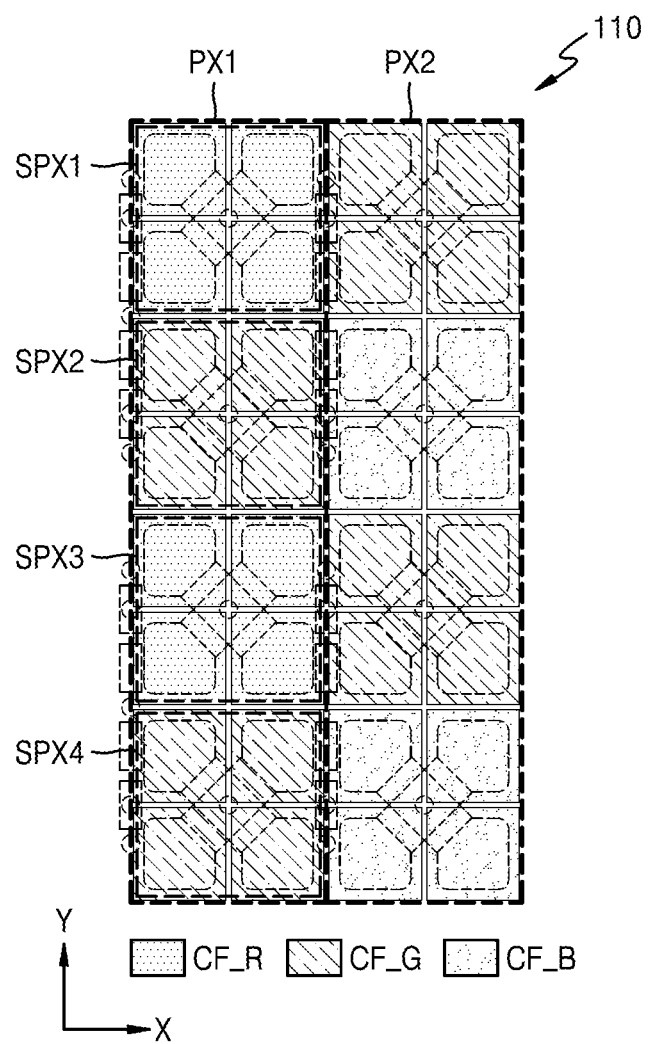

Referring to FIG. 17F, the first and second pixels PX1 and PX2 may be arranged in the first direction. Each of the first and second pixels PX1 and PX2 may include the first through fourth subpixels SPX1 through SPX4 arranged side by side in the second direction.

Red color filters CF_R may be arranged in the first and third subpixels SPX1 and SPX3 of the first pixel PX1, respectively. Green color filters CF_G may be arranged in the second and fourth subpixels SPX2 and SPX4 of the first pixel PX1, respectively. Green color filters CF_G may be arranged in the first and third subpixels SPX1 and SPX3 of the second pixel PX2, respectively. Blue color filters CF_B may be arranged in the second and fourth subpixels SPX2 and SPX4 of the second pixel PX2, respectively. As such, every four subpixels arranged in the 2×2 matrix may have a Bayer pattern.

Figure 18:
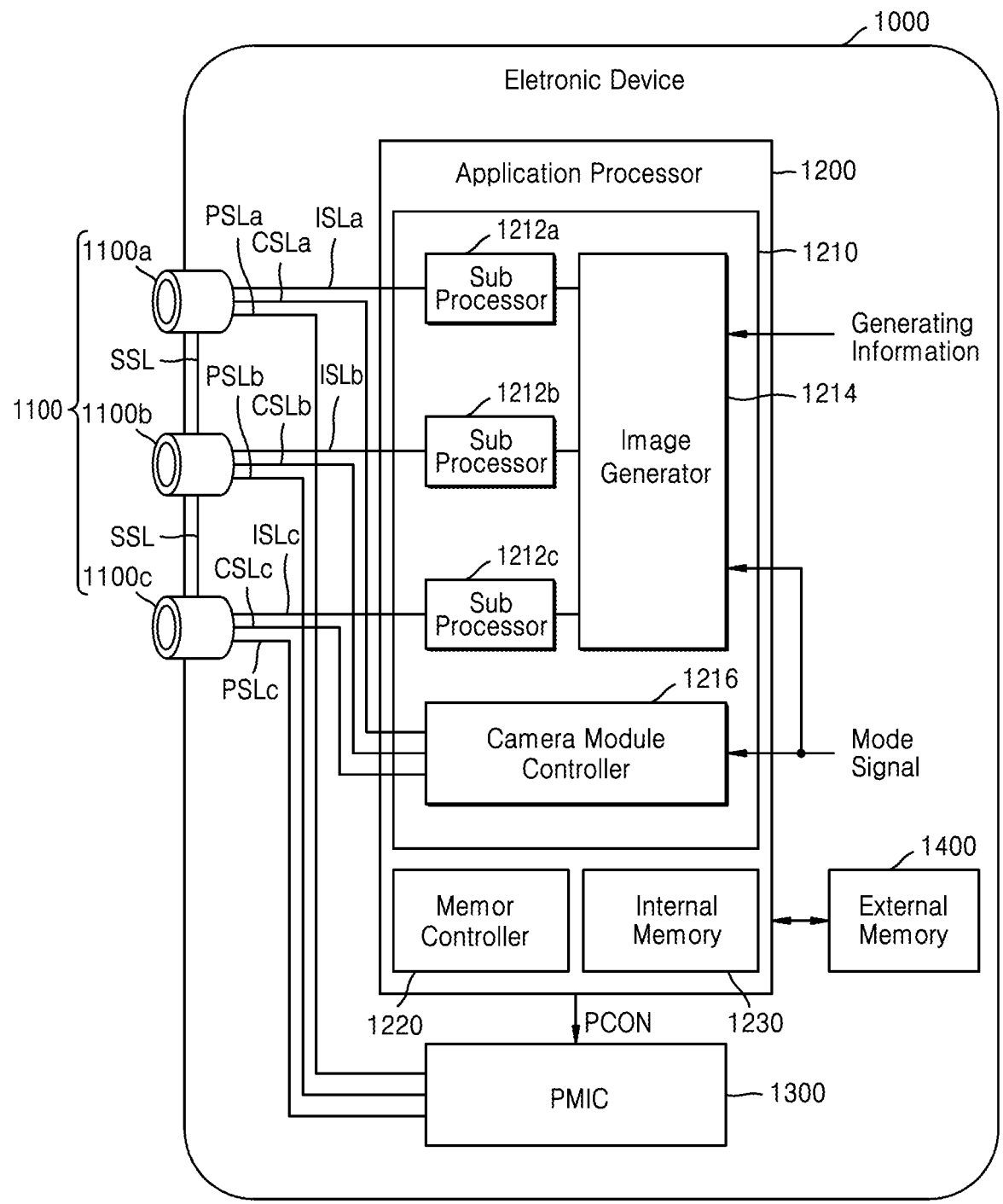
FIG. 18 is a block diagram of an electronic device including a multi-camera module.
Figure 19:
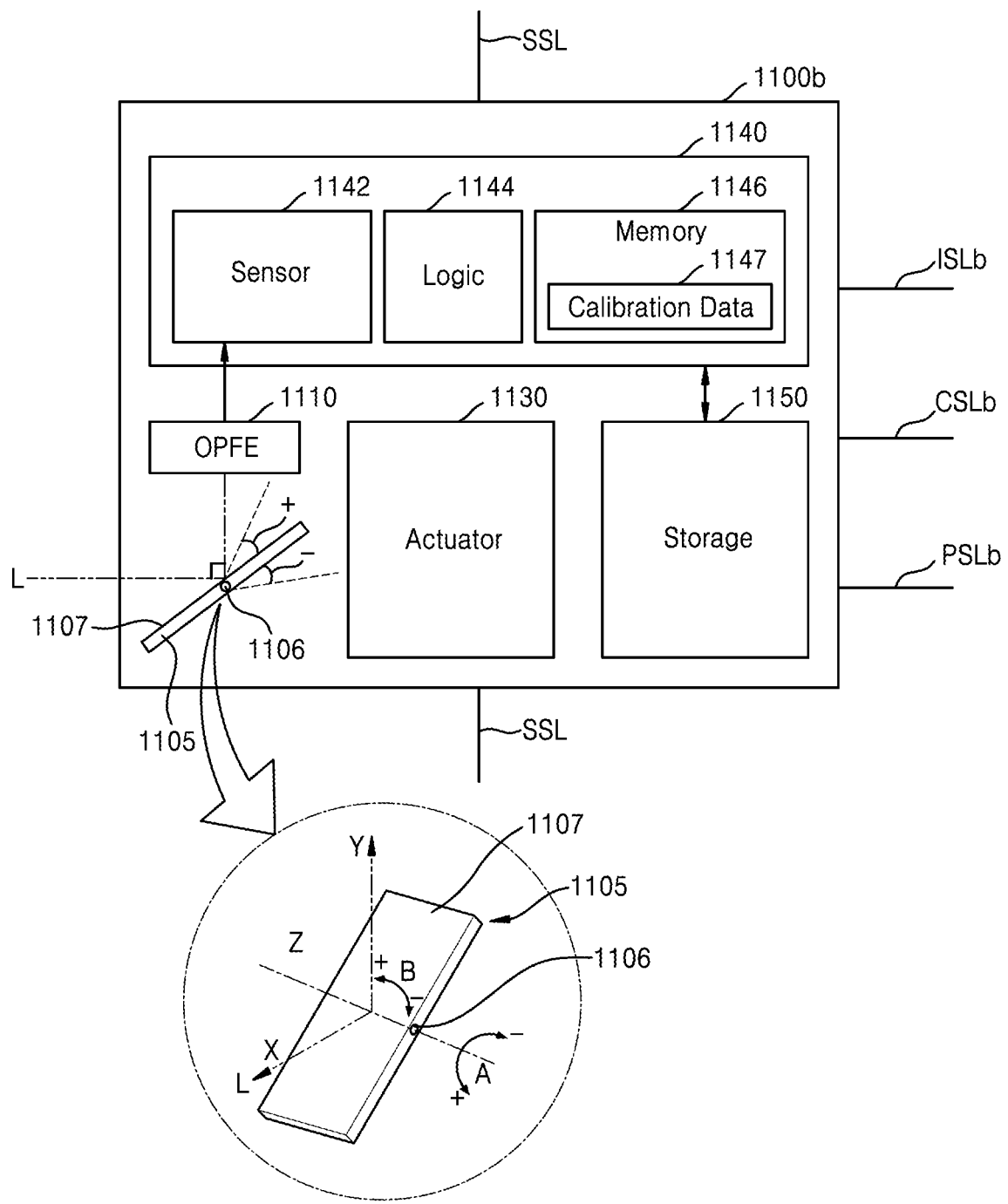
FIG. 19 is a detailed block diagram of the multi-camera module of FIG. 18.

FIG. 18 illustrates an electronic device including a multi-camera module. FIG. 19 is a detailed block diagram of a camera module of FIG. 18.

Referring to FIG. 18, an electronic device 1000 may include a camera module group 1100, an application processor 1200, a power management integrated circuit (PMIC) 1300, and an external memory 1400.

The camera module group 1100 may include a plurality of camera modules 1100a, 1100b, and 1100c. Although FIG. 18 shows an embodiment in which three camera modules 1100a, 1100b, and 1100c are arranged, in other embodiments the camera module group 1100 may include. e.g., two camera modules, or may include k (where k is a natural number greater than or equal to 4) camera modules.

Hereinafter, a detailed configuration of the camera module 1100b will be described in more detail with reference to FIG. 19, and the following description may be equally applied to the other camera modules 1100a and 1100c according to embodiments.

Referring to FIG. 19, the camera module 1100b may include a prism 1105, an optical path folding element (hereinafter, referred to as "OPFE") 1110, an actuator 1130, an image sensing device 1140, and a storage 1150.

The prism 1105 may include a reflective surface 1107 of a light reflecting material and change a path of light L incident from the outside. The prism 1105 may change the path of the light L incident in a first direction X to a second direction Y perpendicular to the first direction X. In addition, the prism 1105 may rotate on a central axis 1106 of the reflective surface 1107 of a light reflecting material in an A direction or a B direction, thereby changing the path of the light L incident in the first direction X to the second direction Y perpendicular thereto. In this case, the OPFE 1110 may also move in a third direction Z perpendicular to the first direction X and the second direction Y. The greatest rotation angle of the prism 1105 in the A direction may be less than 15 degrees in a +A direction and may be greater than 15 degrees in a −A direction. The prism 1105 may move in a range of approximately 20 degrees or may move between 10 degrees and 20 degrees or between 15 degrees and 20 degrees in a +B or −B direction, and angles of movement may be the same as each other in the +B or −B direction or may be within a range of 1 degree. The reflective surface 1107 of the light reflective material of the prism 1105 may move in the third direction (e.g., the Z direction) parallel to an extension direction of the central axis 1106. The camera module 1100b may include two or more prisms, thereby variously changing the path of the light L incident in the first direction X to a second direction Y perpendicular to the first direction X, to the first direction X or the third direction Z, and then to the second direction Y again.

The OPFE 1110 may include, e.g., an optical lens including m (m is a natural number) groups. The m lenses may move in the second direction Y to change an optical zoom ratio of the camera module 1100b. For example, when a basic optical zoom ratio of the camera module 1100b is referred to as Z, and when m optical lenses included in the OPFE 1110 are moved, the optical zoom ratio of the camera module 1100b may be changed to 3Z, 5Z, or more. The actuator 1130 may move the OPFE 1110 or an optical lens (hereinafter, referred to as an optical lens) to a specific position. For example, the actuator 1130 may adjust a position of the optical lens for accurate sensing so that an image sensor 1142 is located at a focal length of the optical lens.

The image sensing device 1140 may include an image sensor 1142, a control logic 1144, and a memory 1146. The image sensor 1142 may sense an image of a sensing target by using the light L provided through the optical lens.

The pixels and the pixel array described above with reference to FIGS. 2 through 17F are applicable to the image sensor 1142.

A pixel may include a plurality of subpixels (e.g., four subpixels) each including a plurality of photoelectric conversion devices and a floating diffusion region. A plurality of floating diffusion regions of the plurality of subpixels may be electrically connected to one another via wiring. The plurality of subpixels may each have improved sensitivities. Therefore, the image sensor 1142 may have an improved resolution and an improved image quality.

The control logic 1144 may control operations of the camera module 1100b and process the sensed image. For example, the control logic 1144 may control the operations of the camera module 1100b according to a control signal provided through a control signal line CSLb, and may extract image data (e.g., face, arms, legs, and the like of in an image) corresponding to a specific image in the sensed image or perform image processing such as noise removal. In some embodiments, the image sensor 1142 may include a pixel array, and the control logic 1144 may include an analog to digital converter and an image signal processor for processing the sensed image.

The memory 1146 may store information, such as calibration data 1147 for the operation of the camera module 1100b. The calibration data 1147 may be information for the camera module 1100b to generate image data by using the light L provided from the outside and may include, e.g., information on a degree of rotation, information on a focal length, information on an optical axis, and the like. When the camera module 1100b includes a multi-state camera whose focal length is changed according to a position of the optical lens, the calibration data 1147 may include information on focal length values for each position (or state) of the optical lens and on auto focusing.

The storage 1150 may store image data sensed by the image sensor 1142. The storage 1150 may be arranged outside the image sensing device 1140 and may be implemented in a stacked form with a sensor chip constituting the image sensing device 1140. In some embodiments, the image sensor 1142 may include a first chip, and the control logic 1144, the storage 1150, and the memory 1146 may include a second chip so that the two chips may be stacked. The storage 1150 may include an electrically erasable programmable read-only memory (EEPROM).

Each of the plurality of camera modules 1100a, 1100b, and 1100c may include an actuator 1130. Accordingly, the plurality of camera modules 1100a, 1100b, and 1100c may each include the calibration data 1147, which are the same as each other or different from each other according to an operation of the actuator 1130 included therein.

One camera module (e.g., 1100b) may be a folded lens-type camera module including the prism 1105 and OPFE 1110 described above, and the other camera modules (e.g., 1100a and 1100c) may be vertical-type camera modules that do not include the prism 1105 and the OPFE 1110.

One camera module (e.g., 1100c) may be a depth camera of a vertical shape for extracting depth information by using, e.g., infrared ray (IR). In this case, the application processor 1200 may merge image data provided from the depth camera with image data provided from another camera module (e.g., 1100a or 1100b), and provide a three-dimensional (3D) depth image.

Two or more camera modules (e.g., 1100a and 1100b) may have respectively different angles of field of view. For example, optical lenses of the two or more camera modules (e.g., 1100a and 1100b) may be different from each other.

Angles of field of view of each of the plurality of camera modules 1100a, 1100b, and 1100c may be different from each other. For example, the camera module 1100a may be an ultrawide camera, the camera module 1100b may be a wide camera, and the camera module 1100c may be a tele camera. In this case, the optical lenses included in each of the plurality of camera modules 1100a, 1100b, and 1100c may also be different from each other.

The camera modules 1100a, 1100b, and 1100c may be physically separated from each other and arranged. That is, a sensing region of one image sensor 1142 is not divided by the plurality of camera modules 1100a, 1100b, and 1100c, and an independent image sensor 1142 may be arranged inside each of the plurality of camera modules 1100a, 1100b, and 1100c.

Referring back to FIG. 18, the application processor 1200 may include an image processing device 1210, a memory controller 1220, and an internal memory 1230. The application processor 1200 may implemented separately from the plurality of camera modules 1100a, 1100b, and 1100c. For example, the application processor 1200 and the plurality of camera modules 1100a, 1100b, and 1100c may be implemented as separate semiconductor chips. The image processing device 1210 may include a plurality of sub-image processors 1212a, 1212b, and 1212c, an image generator 1214, and a camera module controller 1216.

The image processing device 1210 may include the plurality of sub-image processors 1212a, 1212b, and 1212c corresponding to the plurality of camera modules 1100a, 1100b, and 1100c, respectively.

Image data generated from each of the camera modules 1100a, 1100b, and 1100c may be provided to the corresponding sub-image processors 1212a, 1212b, and 1212c through image signal lines ISLa, ISLb, and ISLc separated from each other. For example, image data generated by the camera module 1100a may be provided to the sub-image processor 1212a through an image signal line ISLa, image data generated by the camera module 1100b may be provided to the sub-image processor 1212b through an image signal line ISLb, and image data generated by the camera module 1100c may be provided to the sub-image processor 1212c through an image signal line ISLc. Such image data transmission may be performed by using, e.g., a camera serial interface (CSI) based on a mobile industry processor interface (MIPI).

One sub-image processor may be arranged to correspond to a plurality of camera modules. For example, the sub-image processor 1212a and the sub-image processor 1212c may be integrated into one sub-image processor without being separated from each other as shown in FIG. 15A, and image data provided from the camera modules 1100a and 1100c may be selected by a selection element (e.g., a multiplexer) or the like and then provided to the integrated sub-image processor. In this case, the sub-image processor 1212b may receive image data from the camera module 1100b without being integrated thereinto.

Image data generated by the camera module 1100a may be provided to the sub-image processor 1212a through the image signal line ISLa, image data generated by the camera module 1100b may be provided to the sub-image processor 1212b through the image signal line ISLb, and image data generated by the camera module 1100c may be provided to the sub-image processor 1212c through the image signal line ISLc. In addition, image data processed by the sub-image processor 1212b may be directly provided to the image generator 1214, and image data processed by the sub-image processors 1212a and 1212c may be selected by selection elements (e.g., multiplexers) or the like and then provided to the image generator 1214.

Each of the sub-image processors 1212a, 1212b, and 1212c may perform image processing such as bad pixel correction, 3A adjustments of auto-focus correction, auto-white balance, and auto-exposure, noise reduction, sharpening, gamma control, and re-mosaic for the image data provided from the camera modules 1100a, 1100b, and 1100c.

Re-mosaic signal processing may be performed for each of the camera modules 1100a, 1100b, and 1100c, and then, results of the re-mosaic signal processing may be provided to the sub-image processors 1212a, 1212b, and 1212c.

The image data processed by each of the sub-image processors 1212a, 1212b, and 1212c may be provided to the image generator 1214. The image generator 1214 may generate an output image by using the image data provided from each of the sub-image processors 1212a, 1212b, and 1212c according to image generation information or a mode signal.

The image generator 1214 may generate an output image by merging at least some of the image data generated by the image processors 1212a, 1212b, and 1212c according to the image generation information or the mode signal. In addition, the image generator 1214 may generate the output image by selecting any one of the image data generated by the image processors 1212a, 1212b, and 1212c according to the image generation information or the mode signal.

The image generation information may include a zoom signal or a zoom factor. The mode signal may be a signal based on, e.g., a mode selected by a user.

When the image generation information is a zoom signal (zoom factor), and when the camera modules 1100a, 1100b, and 1100c have different fields of view (angles of field of view), the image generator 1214 may perform different operations depending on types of the zoom signal. For example, when the zoom signal is a first signal, the image generator 1214 may generate an output image by using image data outputted from the sub-image processors 1212a and 1212b among image data outputted from the sub-image processors 1212a and 1212c. When the zoom signal is a second signal different from the first signal, the image generator 1214 may generate an output image by using image data outputted from the sub-image processors 1212c and 1212b among image data outputted from the sub-image processors 1212a and 1212c. If the zoom signal is a third signal different from the first signal and the second signal, the image generator 1214 does not perform the image data merging and generate the output image by selecting any one of image data outputted from each of the sub-image processors 1212a, 1212b, and 1212c. A method of processing image data may be modified to meet application criteria.

The image processing device 1210 may include a selector (not shown) that selects outputs of the sub-image processors 1212a, 1212b, and 1212c and transmits the selected output to the image generator 1214. The selector may be implemented as a multiplexer, e.g., a 3×1 multiplexer. In this case, the selector may perform different operations according to a zoom signal or a zoom factor. For example, when the zoom signal is a fourth signal (e.g., a zoom ratio is a first ratio), the selector may select any one of outputs of the sub-image processors 1212a, 1212b, and 1212c and transmit the selected output to the image generator 1214. In addition, when the zoom signal is a fifth signal different from the fourth signal (e.g., the zoom ratio is a second ratio), the selector may sequentially transmit p (p is a natural number greater than or equal to 2) outputs among the outputs of the sub-image processors 1212a, 1212b, and 1212c to the image generator 1214. For example, the selector may sequentially transmit the output of the sub-image processor 1212b and the output of the sub-image processor 1212c to the image generator 1214. In addition, the selector may sequentially transmit the output of the sub-image processor 1212a and the output of the sub-image processor 1212b to the image generator 1214. The image generator 1214 may generate one output image by merging the p outputs that are sequentially received. The sub-image processors 1212a, 1212b, and 1212c may perform image processing such as re-mosaic, down scaling to a video/preview resolution size, gamma correction, and high dynamic range (HDR) processing, and then the processed image data may be transmitted to the image generator 1214. Accordingly, even when the processed image data is provided to the image generator 1214 through the selector and one signal line, an image merging operation of the image generator 1214 may be performed at a high speed.

The image generator 1214 may receive a plurality of pieces of image data having different exposure times from at least one of the plurality of sub-image processors 1212a, 1212b, and 1212c, and perform the high dynamic range (HDR) processing on the plurality of pieces of image data, thereby generating merged image data with an increased dynamic range.

The camera module controller 1216 may provide control signals to the camera modules 1100a, 1100b, and 1100c. The control signals generated by the camera module controller 1216 may be provided to the corresponding camera modules 1100a, 1100b, and 1100c through the control signal lines CSLa, CSLb, and CSLc separated from each other.

Any one of the plurality of camera modules 1100a, 1100b, and 1100c may be designated as a master camera (e.g., 1100b) according to image generation information including a zoom signal, or a mode signal, and the other camera modules (e.g., 1100a and 1100c) may be designated as slave cameras. Such information may be included in the control signals and provided to the corresponding camera modules 1100a, 1100b, and 1100c through the control signal lines CSLa, CSLb, and CSLc separated from each other. Camera modules operating as a master and slaves may be changed according to a zoom factor or an operation mode signal. For example, when an angle of field of view of the camera module 1100a is wider than an angle of field of view of the camera module 1100b and a zoom factor thereof represents a low zoom ratio, the camera module 1100a may operate as a master, and the camera module 1100b may operate as a slave. In contrast to this, when the zoom factor represents a high zoom ratio, the camera module 1100b may operate as a master and the camera module 1100a may operate as a slave.

The control signal provided from the camera module controller 1216 to each of the camera modules 1100a, 1100b, and 1100c may include a sync enable signal. For example, when the camera module 1100b is a master camera and the camera modules 1100a and 1100c are slave cameras, the camera module controller 1216 may transmit the sync enable signal to the camera module 1100b. When receiving the sync enable signal, the camera module 1100b may generate a sync signal based on the provided sync enable signal and transmit the generated sync signal to the camera modules 1100a and 1100c through a sync signal line SSL. The camera module 1100b and the camera modules 1100a and 1100c may be synchronized with the sync signal to transmit image data to the application processor 1200.

The control signals provided from the camera module controller 1216 to the plurality of camera modules 1100a, 1100b, and 1100c may include mode information according to a mode signal. The camera modules 1100a, 1100b, and 1100c may operate in first or second operation modes in relation to a sensing speed, based on the mode information. The camera modules 1100a, 1100b, and 1100c may generate image signals at a first speed in a first operation mode (e.g., generate the image signals of a first frame rate), and encode the image signals at a second speed higher than the first speed (e.g., encode image signals of a second frame rate higher than the first frame rate), and transmit the encoded image signals to the application processor 1200. The second speed may be lower than or equal to 30 times the first speed.

The application processor 1200 may store the received image signal, i.e., the encoded image signal, in the memory 1230 included therein or in the external memory 1400 outside the application processor 1200, and then, read the encoded image signal from the memory 1230 or the external memory 1400 and decode the encoded signal, and display image data generated based on the decoded image signal. For example, a corresponding sub-image processor among the plurality of sub-image processors 1212a, 1212b, and 1212c of the image processing device 1210 may perform decoding, and also perform image processing on the decoded image signal.

The camera modules 1100a, 1100b, and 1100c may each generate an image signal at a third speed lower than the first speed in the second operation mode (e.g., an image signal of a third frame rate lower than the first frame rate), and transmit the image signal to the application processor 1200. The image signal provided to the application processor 1200 may be a signal which is not encoded. The application processor 1200 may perform image processing on the received image signal or store the image signal in the memory 1230 or the external memory 1400.

The PMIC 1300 may supply power, e.g., a power supply voltage to the plurality of camera modules 1100a, 1100b, and 1100c. For example, the PMIC 1300 may supply first power to the camera module 1100a through a power signal line PSLa, second power to the camera module 1100b through a power signal line PSLb, and third power to the camera module 1100c through a power signal line PSLc, under the control of the application processor 1200. The PMIC 1300 may generate power corresponding to each of the plurality of camera modules 1100a, 1100b, and 1100c in response to a power control signal PCON from the application processor 1200 and may also adjust a level of the power. The power control signal PCON may include power adjustment signals for each operation mode of the plurality of camera modules 1100a, 1100b, and 1100c. For example, the operation mode may include a low power mode, and in this case, the power control signal PCON may include information on a camera module operating in the low power mode and a level of power to be set. Levels of powers provided to the plurality of camera modules 1100a, 1100b, and 1100c may be the same as each other or different from each other. In addition, the levels of power may be dynamically changed.

As described above, embodiments relate to image sensors, and more particularly, to a pixel array having a pixel structure in which a plurality of photoelectric conversion devices share a floating diffusion region, and an image sensor including the pixel array. Embodiments may provide a pixel array having a pixel structure in which sixteen photoelectric conversion devices share a floating diffusion region, and an image sensor including the pixel array.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A pixel array included in an image sensor, the pixel array comprising:
    pixels, arranged in a matrix, and column lines, each of which is commonly connected to pixels arranged on a same column, wherein:
    each of the pixels includes four subpixels, each of the four subpixels including:
    four photoelectric conversion devices;
    a floating diffusion region configured to store electric charges generated by the four photoelectric conversion devices; and
    four transmission gates configured to transmit the electric charges generated by the four photoelectric conversion devices to the floating diffusion region,
    in each pixel, four floating diffusion regions respectively included in the four subpixels are electrically connected to one another via internal wiring, and
    each of the pixels further includes:
    a reset gate configured to reset the four floating diffusion regions by providing a power voltage to the internal wiring;
    a first driving gate configured to receive a first voltage via the internal wiring; and
    a first selection gate arranged adjacent to the first driving gate in a first direction.

2. The pixel array as claimed in claim 1, wherein each of the pixels further includes:

a second selection gate arranged adjacent to the first selection gate in the first direction; and
a second driving gate arranged adjacent to the second selection gate in the first direction, and configured to receive the first voltage via the internal wiring.

3. The pixel array as claimed in claim 2, wherein the first driving gate is connected to a first terminal of the internal wiring, and the second driving gate is connected to a second terminal of the internal wiring.

4. The pixel array as claimed in claim 1, wherein each of the pixels further includes a dummy gate arranged adjacent to the reset gate in the first direction.

5. The pixel array as claimed in claim 1, wherein each of the pixels further includes a first gain control gate arranged adjacent to the reset gate in the first direction.

6. The pixel array as claimed in claim 5, wherein each of the pixels further includes a second gain control gate arranged adjacent to the first gain control gate in the first direction, the second gain control gate being arranged symmetrically with the reset gate about the first gain control gate in the first direction.

7. The pixel array as claimed in claim 1, wherein the four subpixels include a first subpixel, a second subpixel, a third subpixel, and a fourth subpixel arranged in a 2×2 matrix.

8. The pixel array as claimed in claim 1, wherein the four subpixels include a first subpixel, a second subpixel, a third subpixel, and a fourth subpixel arranged side by side in the first direction.

9. The pixel array as claimed in claim 8, wherein the first driving gate is arranged adjacent to the reset gate in the first direction, and configured to receive the first voltage via the internal wiring.

10. The pixel array as claimed in claim 1, wherein a single microlens is arranged over each photoelectric conversion device included in one pixel.

11. The pixel array as claimed in claim 1, wherein a single microlens is arranged over at least two of the photoelectric conversion devices included in one pixel.

12. The pixel array as claimed in claim 1, wherein color filters of different colors are arranged on a first pixel and a second pixel adjacent to each other, and a color filter of a same color is arranged on the four subpixels included in one pixel.

13. The pixel array as claimed in claim 1, wherein color filters of different colors are arranged on two subpixels adjacent to each other in the first direction or a second direction, from among the four subpixels included in one pixel.

14. A pixel array included in an image sensor, the pixel array comprising:
pixels, each of which includes a first subpixel, a second subpixel, a third sub pixel, a fourth subpixel, and a first circuit; and
column lines, each of which is commonly connected to pixels arranged on a same column,
wherein each of the first subpixel, the second subpixel, the third subpixel, and the fourth subpixel includes:
four photoelectric conversion devices arranged in a matrix; and
a floating diffusion region configured to store electric charges generated by the four photoelectric conversion devices,
wherein a first floating diffusion region of the first subpixel, a second floating diffusion region of the second subpixel, a third floating diffusion region of the third subpixel, and a fourth floating diffusion region of the fourth subpixel are electrically connected to one another via wiring, and the wiring is formed within a pixel region where the pixels are formed,
wherein the first circuit is connected to a corresponding one of the column lines and the wiring, and is configured to share the first subpixel, the second subpixel, the third subpixel, and the fourth subpixel, and
wherein the first circuit includes:
a reset transistor configured to provide a reset voltage to the wiring;
a driving transistor including a gate connected to the wiring; and
a selection transistor connected to the driving transistor and the corresponding one of the column lines.

15. The pixel array as claimed in claim 14, wherein, in each pixel, the reset transistor is arranged at a center of the pixel, and the driving transistor and the selection transistor are arranged on one side of the pixel.

16. The pixel array as claimed in claim 14, wherein, in each pixel, the reset transistor is arranged on one side of the pixel, and the driving transistor and the selection transistor are arranged at a center of the pixel.

17. The pixel array as claimed in claim 14, wherein the first circuit further includes a gain control transistor, which is arranged adjacent to the reset transistor.

18. An image sensor, comprising:
a pixel array including pixels, each of the pixels including a plurality of subpixels, each of the plurality of subpixels including four photoelectric conversion devices and a floating diffusion region configured to store electric charges generated by the four photoelectric conversion devices, the floating diffusion regions regions arranged between a plurality of transfer transistors;
a row driver configured to drive the pixels in units of rows; and
an analog-to-digital conversion circuit configured to receive a plurality of sensing signals from a plurality of column lines connected to the pixel array, and to perform analog-to-digital conversion on the plurality of sensing signals, wherein each of the pixels further includes wiring that directly electrically connects the floating diffusion regions to one another.

19. The image sensor as claimed in claim 18, wherein:
the wiring is arranged within a pixel region where the pixels are formed, on a two-dimensional plane of the pixel array, and the wiring extends in a first direction and a second direction perpendicular to the first direction.

20. The image sensor as claimed in claim 18, further comprising an output circuit connected to the wiring and a corresponding column line from among the plurality of column lines, the output circuit including:
a reset transistor configured to provide a reset voltage to the wiring;
a driving transistor including a gate connected to the wiring; and
a selection transistor connected to the driving transistor and the corresponding column line.

* * * * *